(12) United States Patent
Yoshino

(10) Patent No.: US 7,601,599 B2
(45) Date of Patent: Oct. 13, 2009

(54) SEMICONDUCTOR DEVICE AND METHOD FOR MANUFACTURING THE SAME

(75) Inventor: Kiyohiko Yoshino, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 400 days.

(21) Appl. No.: 11/276,765

(22) Filed: Mar. 14, 2006

(65) Prior Publication Data

US 2006/0211209 A1    Sep. 21, 2006

(30) Foreign Application Priority Data

Mar. 15, 2005    (JP)    ............... 2005-073494

(51) Int. Cl.
*H01L 21/336*    (2006.01)
*H01L 29/94*    (2006.01)

(52) U.S. Cl. ............... 438/299; 438/305; 257/E21.453

(58) Field of Classification Search ......... 438/149–151, 438/154–158, 163, 167–186, 188, 196–201, 438/199–308, 174–176, 209–211, 217–225, 438/257, 261, 262, 277, 587–588, 289, 299, 438/301–305; 257/E21.444, E21.453
See application file for complete search history.

(56) References Cited

U.S. PATENT DOCUMENTS 3,959,025 A * 5/1976 Polinsky ............... 438/301
4,731,339 A * 3/1988 Ryan et al. ............... 438/172
5,571,737 A * 11/1996 Sheu et al. ............... 438/291
7,056,798 B2 * 6/2006 Shimotsusa et al. ......... 438/301
7,521,759 B2 * 4/2009 Sasaki ............... 257/340
2002/0190306 A1* 12/2002 Sasago et al. ............... 257/315
2003/0057460 A1   3/2003 Maekawa
2006/0205166 A1* 9/2006 Ishikiriyama ............... 438/299
2006/0214223 A1* 9/2006 Sasaki ............... 257/336

FOREIGN PATENT DOCUMENTS

JP    9/205205 A    8/1997

* cited by examiner

*Primary Examiner*—W. David Coleman
*Assistant Examiner*—Maliheh Malek
(74) *Attorney, Agent, or Firm*—Rabin & Berdo, P.C.

(57) ABSTRACT

A method for manufacturing a semiconductor device includes the steps of (a) forming a first insulating film pattern, which has a first portion and a second portion separated from the first portion through a first space, above a semiconductor substrate, (b) selectively forming a first impurity diffusion layer in a portion of the semiconductor substrate located at least below the first space by conducting ion implantation of impurities into the semiconductor substrate by using at least the first insulating film pattern as a mask, (c) eliminating the second portion, and (d) forming a gate electrode having a functional portion above the semiconductor substrate.

4 Claims, 46 Drawing Sheets

SEMICONDUCTOR DEVICE AND METHOD FOR MANUFACTURING THE SAME

BACKGROUND OF THE INVENTION

Field of the Invention

The present invention relates to a method for manufacturing a semiconductor device, especially a method for manufacturing a high voltage metal oxide semiconductor (MOS) transistor having an electric field reduction layer comprised of a lightly doped diffusion layer that overlaps with a gate electrode.

In general, high voltage is applied to a drain electrode in a high voltage MOS transistor. Because of this, electric field concentration is caused in a lightly doped diffusion layer on a drain electrode side, which is formed directly below a gate electrode. Then, the electric field concentration leads to impact ionization, and thus high energy electrons and electron holes are injected into and trapped in a gate insulating film formed on the lightly doped diffusion layer. This causes device properties to be changed over time.

The offset structure has been heretofore provided, in which a heavily doped diffusion region comprising a source/drain is separated from a gate electrode in order to reduce electric field in a lower edge of the gate electrode. Japanese Patent Application Publication JP-A-09-205205 (especially paragraph numbers 0013-0020 and FIGS. 3 and 4) discloses an offset structure. In this offset structure, a spacer is formed adjacent to a sidewall of a gate electrode, and a lightly doped diffusion region is formed immediately below the spacer. Therefore, a heavily doped diffusion region is separated (i.e., "offset") from the gate electrode by substantially the distance of the spacer. Here, the amount of the offset is increased in order to have a profound electric field reduction effect.

As the other structure to reduce the electric field in a lower edge of a gate electrode, a structure has been heretofore known, in which a lightly doped diffusion layer functioning as an electric field reduction layer overlaps with a gate electrode. Japanese Patent Application Publication JP-A-2003-100771 (especially paragraph numbers 0025 and FIGS. 2 and 6) discloses a heretofore known gate overlap structure of a high voltage MOS transistor. In this overlap structure, a portion of a lightly doped diffusion layer formed in a drain region overlaps with a gate electrode. An ion implantation process is conducted by using a mask formed on a gate insulating film, and a lightly doped diffusion layer is selectively formed on a semiconductor substrate. Then, a polysilicon layer is formed on the gate insulating film, and a gate electrode, which overlaps with the lightly doped diffusion layer by a predetermined distance, is formed by patterning the polysilicon layer. Therefore, the lightly doped diffusion layer can be formed without depending on the length of the gate electrode. According to this Japanese Patent Application Publication, increasing the amount of the overlap is effective in order to have a profound electric field reduction effect.

The above described heretofore known methods for forming the gate overlap structure have been suggested to increase the electric field reduction effect. However, the following problems are actually caused in those methods.

First, in the above mentioned methods, a gate electrode must be formed after a lightly doped diffusion layer is formed. Because of this, when a heretofore known lithography technique is used for the above mentioned method, the amount of the gate overlap will vary if the alignment between the patterning to form a lightly doped diffusion layer and the patterning to form a gate electrode is incorrectly completed. This causes device properties to vary.

Second, the following problem can be caused because of the order in which a gate electrode is formed after a lightly doped diffusion layer is formed. When a heretofore known lithography technique is used for the above mentioned methods, a lightly doped diffusion layer is asymmetrically formed with respect to a gate electrode if the alignment between the patterning to form the lightly doped diffusion layer and the patterning to form the gate electrode is incorrectly completed. This causes device properties to vary.

Third, when a heretofore known lithography technique is used for the above mentioned methods, the overlap dimension between a lightly doped diffusion layer and a gate electrode must be defined, in consideration of the alignment margin between the patterning to form the lightly doped diffusion layer and the patterning to form the gate electrode. In other words, a design value must be set to be the value derived by adding the alignment margin between the patterning to form the lightly doped diffusion layer and the patterning to form the gate electrode to the originally necessary overlap dimension between the lightly doped diffusion layer and the gate electrode. Because of this, current drive capability has been reduced and device miniaturization has been prevented.

SUMMARY OF THE INVENTION

It is therefore an object of the present invention to provide a high voltage MOS transistor without the above described problems.

In accordance with a first aspect of the present invention, a semiconductor device is comprised of a gate insulating film formed above a semiconductor substrate, a first insulating film pattern that is formed above the semiconductor substrate and which includes at least a first portion with a first width, a gate electrode that is formed above the gate insulating film and which includes a functional portion having a first edge defined by an edge of the first portion; and a first impurity diffusion layer that is self-aligned with the first portion and the first edge, overlapped with the gate electrode, and which has a second width.

Also, in accordance with a second aspect of the present invention, a semiconductor device is comprised of a gate insulating film formed above a semiconductor substrate, a gate electrode comprised of (a) a functional portion that is continuously formed on said gate insulating film and has a first edge and a second edge and (b) a nonfunctional portion that is continuously formed out from the first edge and the second edge of the functional portion and located above and separated form the gate insulating film, and a first impurity diffusion layer with a first width that is self-aligned with the first edge of the gate electrode, and overlapped with the gate electrode.

Also, in accordance with a third aspect of the present invention, a semiconductor device is comprised of a gate insulating film formed above a semiconductor substrate, a first insulating film pattern including at least (a) a first portion with a first width that is formed above the semiconductor substrate and (b) a second portion with a second width that is separated form the first portion, a gate electrode including a functional portion having (a) a first edge that is formed on the gate insulating film and defined by an edge of the first portion and (b) a second edge that is defined by an edge of the second portion, a first impurity diffusion layer with a third width that is self-aligned with the first portion and the first edge and overlapped with the gate electrode, and a second impurity diffusion layer with a fourth width that is self-aligned with the second portion and the second edge and overlapped with the gate electrode.

Also, in accordance with a fourth aspect of the present invention, a semiconductor device is comprised of a gate insulating film formed above a semiconductor substrate, a gate electrode comprised of (a) a functional portion that is continuously formed on the gate insulating film and has a first edge and a second edge and (b) a nonfunctional portion that is continuously formed out from the first edge and the second edge of the functional portion and is located above and separated from said gate insulating film, a first impurity diffusion layer with a first width that is self-aligned with the first edge of the gate electrode, and overlapped with the gate electrode, and a second impurity diffusion layer with a second width that is self-aligned with the second edge of the gate electrode, and overlapped with the gate electrode.

Furthermore, it is also an object of the present invention to provide a method for manufacturing a high voltage MOS transistor without the above described problems.

In accordance with the present invention, a method for forming a semiconductor device is comprised of the steps of (i) forming a first insulating film pattern, which includes at least (a) a first portion with a first width and (b) a second portion with a third width that is separated from the first portion through a first space with a second width, above a semiconductor substrate, (ii) selectively forming a first impurity diffusion layer, which is self-aligned with the first insulating film pattern and has a width defined by the second width, in a portion of the semiconductor substrate located at least below the first space, by conducting ion implantation of impurities into the semiconductor substrate by using at least the first insulating film pattern as a mask, (iii) eliminating the second portion, and (iv) forming a gate electrode, which includes a functional portion that has a first edge defined by an edge of the first portion and which is overlapped with the first impurity diffusion layer in a self-alignment fashion, above the semiconductor substrate.

According to the present invention, at least either of the first and the second impurity diffusion layers that function as electric field reduction layers and the gate electrode are formed in a self-alignment fashion by using the first insulating film pattern as a common mask. Here, the common mask is formed above the semiconductor substrate. This mask is comprised of the first insulating film pattern, including at least the first portion with the first width and the second portion with the third width that is separated through the first space with the second width. Then, impurity ions are implanted into the semiconductor substrate by using at least this first insulating film pattern as a mask, and thus the first impurity diffusion layer, which is self-aligned with the first insulating film pattern and has the width defined by the second width, is selectively formed in the portion of the semiconductor substrate located below the first space. Then, the second portion is eliminated, and the gate electrode including the functional portion that has the first edge defined by an edge of the first portion and overlapped with the first impurity diffusion layer in a self-alignment fashion is formed above the semiconductor substrate.

Here, the first insulating film pattern may further include a third portion with a fifth width that is separated from the second portion through a second space with a fourth width. Also, a second impurity diffusion layer, which is self-aligned with the first insulating film pattern and has a width defined by the fourth width, is selectively formed below the second space, and a channel region with a channel length defined by the third width is defined below the second portion by conducting ion implantation of impurities, at the same time as the first impurity diffusion layer is formed by conducting the ion implantation of impurities.

In other words, the widths of the first and the second impurity diffusion layers that function as electric field reduction layers correspond to the width of the space of the first insulating film pattern, respectively. Also, the widths of the first and the second impurity diffusion layers that function as electric field reduction layers correspond to the amount of gate overlap. Therefore, the first and the second impurity diffusion layers, in which the amount of gate overlap is defined by the width of the space of the first insulating film pattern, and which function as electric field reduction layers, are formed in the gate electrode in a self-alignment fashion. This type of self-alignment gate overlap structure and the method for manufacturing the same prevent misalignment between the patterning to form the first impurity diffusion layer and the patterning to form the gate electrode. Therefore, the overlap dimension between the first impurity diffusion layer functioning as an electric field reduction layer and the gate electrode will not vary from its design value. In other words, the gate overlap amount will not vary, and thus the device properties will not vary.

BRIEF DESCRIPTION OF THE DRAWINGS

Referring now to the attached drawings which form a part of this original disclosure.

DETAILED DESCRIPTION OF THE PREFERRED EMBODIMENTS

Figure 1A:
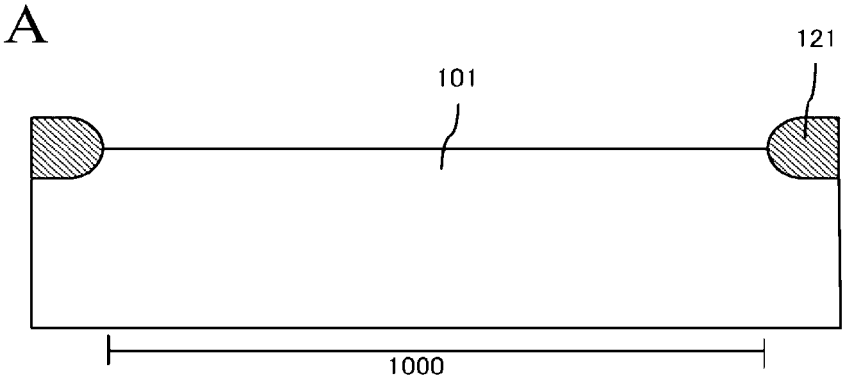
FIGS. 1A and 1B are a partial vertical cross-section diagram and a plan view showing a method for manufacturing a high voltage MOS transistor in accordance with the first embodiment of the present invention, respectively.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

According to the first embodiment of the present invention, a high voltage MOS transistor is provided, which has a lightly doped diffusion layer that overlaps with a gate electrode in a self-alignment fashion and functions as an electric field reduction layer. Also, according to the first embodiment of the present invention, a method for manufacturing the above described high voltage MOS transistor is provided.

High Voltage MOS Transistor Structure

Figure 20A:
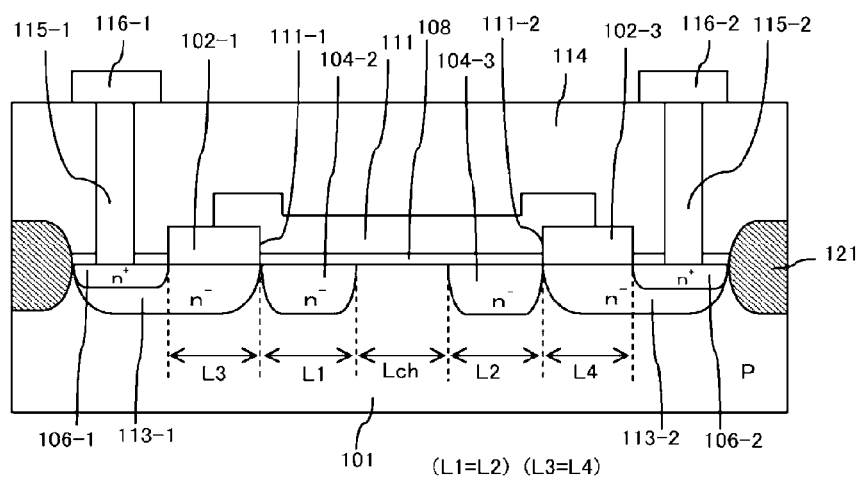
FIGS. 20A and 20B are a partial vertical cross-section diagram and a plan view showing a method for manufacturing a high voltage MOS transistor in accordance with the first embodiment of the present invention, respectively.

FIG. 20A is a partial vertical cross-section diagram that shows the structure of a high voltage MOS transistor in accordance with the first embodiment of the present invention.

The high voltage MOS transistor according to the first embodiment of the present invention has the following structure. The principal surface of a p-type single crystal silicon substrate 101 includes an element isolation region comprised of a field oxide film 121 and an active region defined by the field oxide film 121. Source-side and drain-side first lightly doped $N^-$ diffusion layers 104-2 and 104-3, which are separated through a channel, and source-side and drain-side second lightly doped $N^-$ diffusion layers 113-1 and 113-2, which are located adjacent to the outer side of the source-side and the drain-side first lightly doped $N^-$ diffusion layers 104-2 and 104-3 respectively, are formed in the active region of the p-type single crystal silicon substrate 101. Here, the outer side of the source-side and the drain-side first lightly doped $N^-$ diffusion layers 104-2 and 104-3 means the regions between these layers and field oxide films 121. On the other hand, the inner side of the source-side and the drain-side first lightly doped $N^-$ diffusion layers 104-2 and 104-3 means the region located between them. These definitions are applied to other portions of the semiconductor device in accordance with the present invention. Source-side and drain-side first heavily doped $N^+$ diffusion layers 106-1 and 106-2 are selectively formed in upper regions of the source-side and the drain-side second lightly doped $N^-$ diffusion layers 113-1 and 113-2, respectively. The source-side and the drain-side first heavily doped $N^+$ diffusion layers 106-1 and 106-2 are separated from the source-side and the drain-side first lightly doped $N^-$ diffusion layers 104-2 and 104-3 through the source-side and the drain-side second lightly doped $N^-$ diffusion layers 113-1 and 113-2, respectively.

Figure 5A:
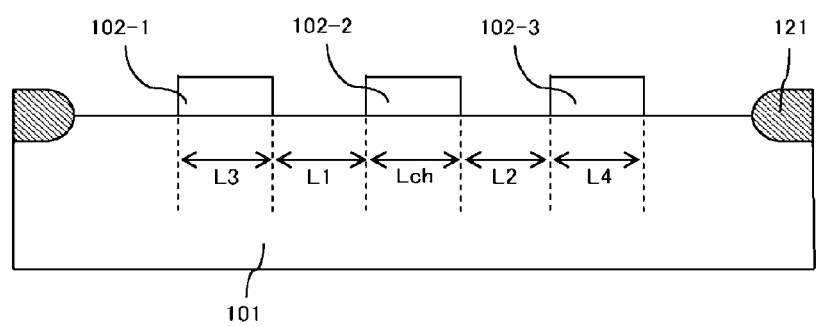
FIGS. 5A and 5B are a partial vertical cross-section diagram and a plan view showing a method for manufacturing a high voltage MOS transistor in accordance with the first embodiment of the present invention, respectively.
Figure 5B:
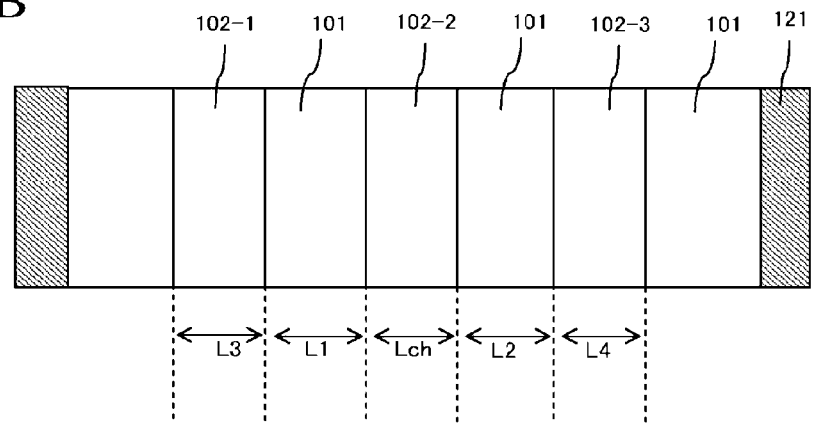
Figure 11A:
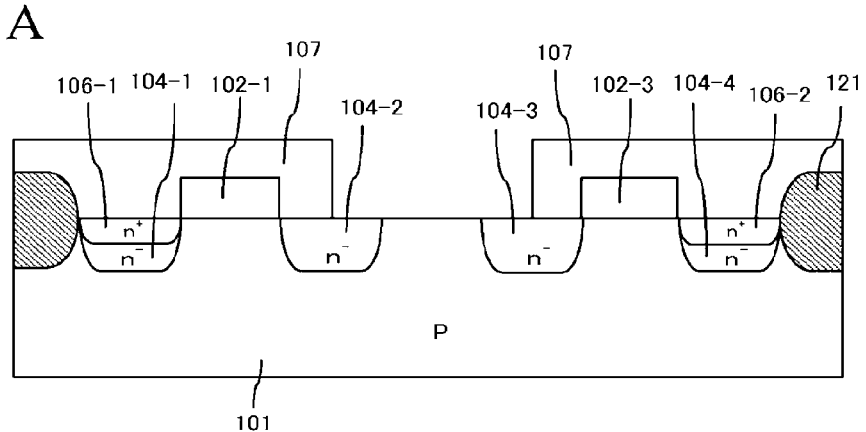
FIGS. 11A and 11B are a partial vertical cross-section diagram and a plan view showing a method for manufacturing a high voltage MOS transistor in accordance with the first embodiment of the present invention, respectively.
Figure 11B:
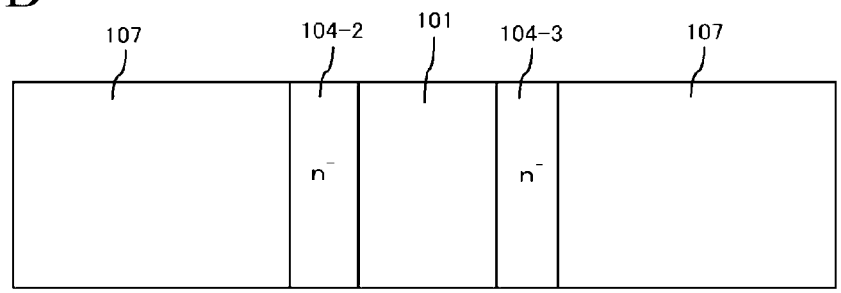

A gate oxide film 108 is formed on the principal surface of the p-type single crystal silicon substrate 101. More specifically, the gate oxide film 108 is formed on a channel region of the p-type single crystal silicon substrate 101, the source-side and the drain-side first lightly doped $N^-$ diffusion layers 104-2 and 104-3, and the source-side and the drain-side first heavily doped $N^+$ diffusion layers 106-1 and 106-2. Also, a first portion 102-1 and a third portion 102-3 of a silicon dioxide film pattern 102' remain on the source-side and the drain-side second lightly doped $N^-$ diffusion layers 113-1 and 113-2, respectively. A second portion 102-2 of a silicon dioxide film pattern 102' shown in FIGS. 5A and 5B is eliminated in a step of a manufacturing process of a semiconductor device in accordance with the first embodiment as shown in FIGS. 11A and 11B. Therefore, it does not exist in a finished high voltage MOS transistor.

A gate electrode 111 comprised of a polysilicon film is selectively formed on the gate oxide film 108, and the inner half portions of the first portion 102-1 and the third portion 102-3 of the silicon dioxide film pattern 102'. Also, the gate electrode 111 is located immediately above the gate oxide film 108, and it is comprised of a functional portion that applies an electric field on an upper region of the p-type single crystal silicon substrate 101 including a channel region, and nonfunctional portions that are formed on the first portion 102-1 and the third portion 102-3 of the silicon dioxide film pattern 102'. Edges of the polysilicon film comprising the gate electrode 111 are located on the first portion 102-1 and the third portion 102-3 of the silicon dioxide film pattern 102'. However, the above described functional portion of the gate electrode 111 actually functions as a gate. Therefore, gate edges of the gate electrode 111 are hereinafter defined as a first edge 111-1 and a second edge 111-2 of the gate electrode 111 that are defined by inner edges of the first portion 102-1 and the third portion 102-3 of the silicon dioxide film pattern 102', respectively.

An interlayer insulating film 114 is formed on the gate electrode 111, a portion of the first portion 102-1 of the silicon dioxide film pattern 102', a portion of the third portion 102-3 of the silicon dioxide film pattern 102', and the gate oxide film 108. A source contact 115-1 and a drain contact 115-2 are formed in contact holes in the interlayer insulating film 114. The source contact 115-1 and the drain contact 115-2 have ohmic contacts with the source-side and the drain-side first heavily doped $N^+$ diffusion layers 106-1 and 106-2, respectively. Also, a source wiring layer 116-1 and a drain wiring layer 116-2 are formed on the interlayer insulating film 114. The source wiring layer 116-1 and the drain wiring layer 116-2 are electrically connected to the source-side and the drain-side first heavily doped $N^+$ diffusion layers 106-1 and 106-2 through the source contact 115-1 and the drain contact 115-2, respectively.

A channel length Lch is defined by the distance between the inner edges of the source-side and the drain-side first lightly doped $N^-$ diffusion layers 104-2 and 104-3. In other words, it is defined by the width of the second portion 102-2 of the silicon dioxide film pattern 102'. Also, the horizontal position of the channel region is self-aligned with the horizontal position of the second portion 102-2 of the silicon dioxide film pattern 102'.

A dimension L1 of the source-side first lightly doped N⁻ diffusion layer 104-2 in a horizontal direction is defined by the width of an opening formed between the first portion 102-1 and the second portion 102-2 of the silicon dioxide film pattern 102' shown in FIG. 5A (i.e., the distance between the first portion 102-1 and the second portion 102-2 of the silicon dioxide film pattern 102'). Also, the horizontal position of the source-side first lightly doped N⁻ diffusion layer 104-2 is self-aligned with the horizontal position of the opening formed between the first portion 102-1 and the second portion 102-2 of the silicon dioxide film pattern 102' shown in FIG. 5A. Here, the dimension L1 corresponds to a source-side gate overlap amount, that is, the dimension of a source-side electric field reduction layer. Therefore, the dimension L1 is hereinafter called the source-side gate overlap amount L1, and it is defined by the width of the opening formed between the first portion 102-1 and the second portion 102-2 of the silicon dioxide film pattern 102' shown in FIG. 5A.

A dimension L2 of the drain-side first lightly doped N⁻ diffusion layer 104-3 in a horizontal direction is defined by the width of an opening formed between the third portion 102-3 and the second portion 102-2 of the silicon dioxide film pattern 102' shown in FIG. 5A (i.e., the distance between the third portion 102-3 and the second portion 102-2 of the silicon dioxide film pattern 102'). Also, the horizontal position of the drain-side first lightly doped N⁻ diffusion layer 104-3 is self-aligned with the horizontal position of the opening formed between the third portion 102-3 and the second portion 102-2 of the silicon dioxide film pattern 102' shown in FIG. 5A. Here, the dimension L2 corresponds to a drain-side gate overlap amount, that is, the dimension of a drain-side electric field reduction layer. Therefore, the dimension L2 is hereinafter called the drain-side gate overlap amount L2, and it is defined by the width of the opening formed between the third portion 102-3 and the second portion 102-2 of the silicon dioxide film pattern 102' shown in FIG. 5A.

A distance L3 between the source-side first heavily doped N⁺ diffusion layer 106-1 and the first edge 111-1 of the gate electrode 111 is defined by the width of the first portion 102-1 of the silicon dioxide film pattern 102' shown in FIG. 5A.

A distance L4 between the drain-side first heavily doped N⁺ diffusion layer 106-2 and the second edge 111-2 of the gate electrode 111 is defined by the width of the third portion 102-3 of the silicon dioxide film pattern 102' as shown in FIG. 5A.

According to the present invention, the following are all defined by the single silicon dioxide film pattern 102' that is defined by a single lithography step: the channel length Lch, the source-side and the drain-side first lightly doped N⁻ diffusion layers 104-2 and 104-3, the source-side and the drain-side second lightly doped N⁻ diffusion layers 113-1 and 113-2, the horizontal position and the dimension of each of the source-side and the drain-side first heavily doped N⁺ diffusion layers 106-1 and 106-2, the horizontal position of each of the first edge 111-1 and the second edge 111-2 of the gate electrode 111, the source-side gate overlap amount L1, the drain-side gate overlap amount L2, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2. Therefore, the source-side and the drain-side first lightly doped N⁻ diffusion layers 104-2 and 104-3, the source-side and the drain-side second lightly doped N⁻ diffusion layers 113-1 and 113-2, the source-side and the drain-side first heavily doped N⁺ diffusion layers 106-1 and 106-2, and the gate electrode 111 are self-aligned with each other in a horizontal direction, and thus misalignment is not caused among them.

Also, the source-side gate overlap amount L1 and the drain-side gate overlap amount L2 are all defined by the single silicon dioxide film pattern 102' shown in FIG. 5A. Therefore, variation from a design value, which is originated from misalignment in a plurality of patterning steps, is not caused for the source-side gate overlap amount L1 and the drain-side gate overlap amount L2. That is to say, the source-side and the drain-side first lightly doped N⁻ diffusion layers 104-2 and 104-3 are overlapped with the gate electrode 111 in a self-alignment fashion.

Furthermore, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2 are all defined by the single silicon dioxide film pattern 102' as shown in FIG. 5A. Therefore, variation from a design value, which is originated from misalignment in a plurality of patterning steps, is not also caused for the distances L3 and L4.

Method for Manufacturing High Voltage MOS Transistor

With reference to attached figures, a method for manufacturing the high voltage MOS transistor in accordance with the first embodiment of the present invention is hereinafter explained.

FIGS. 1A to 20A are partial vertical cross-section diagrams showing a manufacturing process of the high voltage MOS transistor in accordance with the first embodiment of the present invention. Also, FIGS. 1B to 20B are plan views showing a manufacturing process of the high voltage MOS transistor in accordance with the first embodiment of the present invention.

Figure 1B:
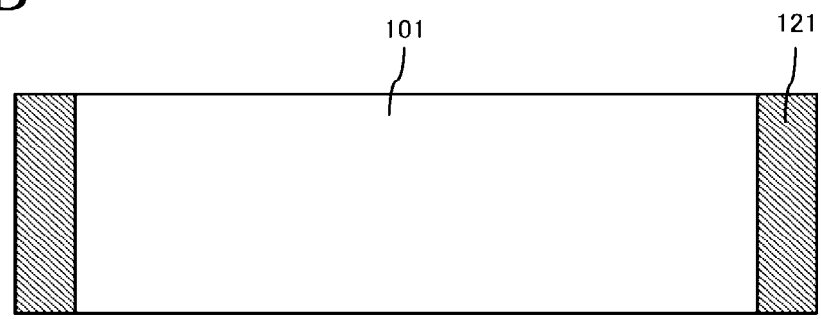

As shown in FIGS. 1A and 1B, a field oxide film 121 is formed in an element isolation region of a p-type single crystal silicon substrate 101 with a local oxidation of silicon (LOCOS) method, and an active region 1000 is defined by the field oxide film 121. The active region 1000 is the region to form a high voltage MOS transistor.

Figure 2A:
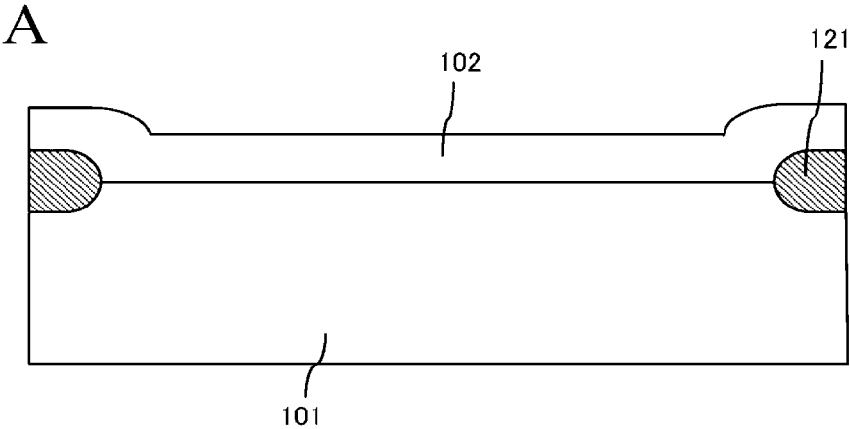
FIGS. 2A and 2B are a partial vertical cross-section diagram and a plan view showing a method for manufacturing a high voltage MOS transistor in accordance with the first embodiment of the present invention, respectively.
Figure 2B:
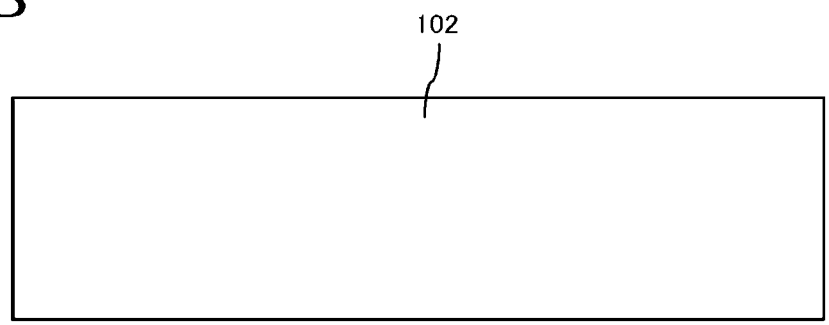

Then, as shown in FIGS. 2A and 2B, a silicon dioxide film 102 of 2500 Å in thickness is formed on the p-type single crystal silicon substrate 101 and the field oxide film 121 with a heretofore known method. As a typical example, a thermal oxidization method or various types of CVD methods can be used here.

Figure 3A:
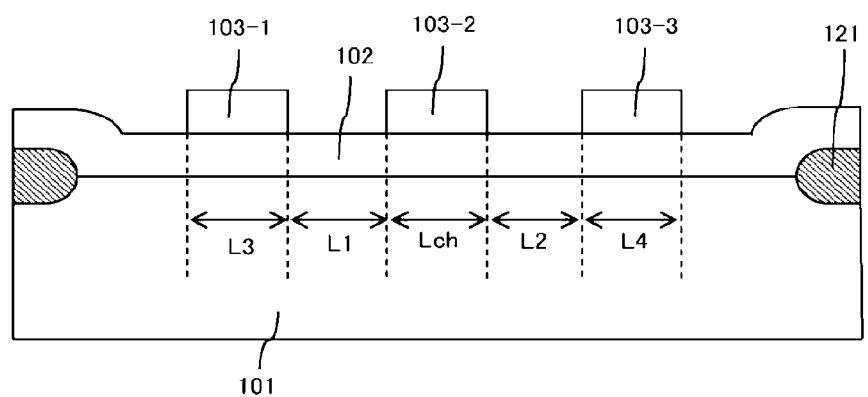
FIGS. 3A and 3B are a partial vertical cross-section diagram and a plan view showing a method for manufacturing a high voltage MOS transistor in accordance with the first embodiment of the present invention, respectively.
Figure 3B:
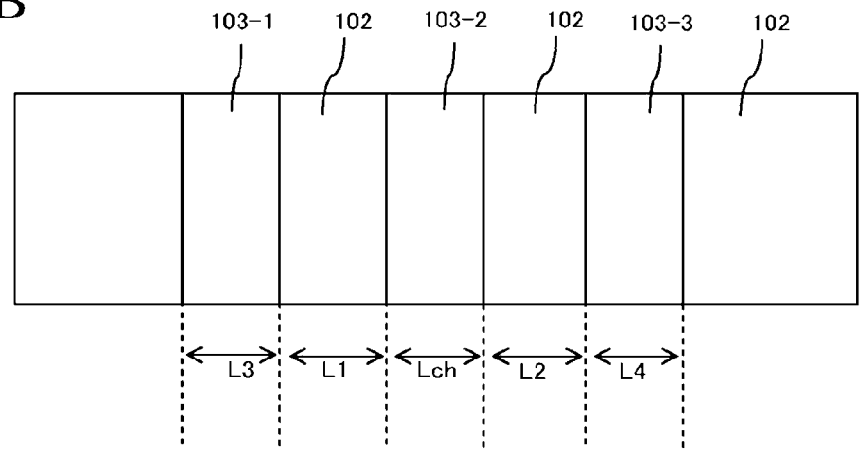

As shown in FIGS. 3A and 3B, a resist pattern 103 is formed on the silicon dioxide film 102 with a heretofore known lithography technique. This resist pattern 103 is comprised of a first portion 103-1, a second portion 103-2, and a third portion 103-3. Here, the widths of the first portion 103-1, the second portion 103-2, and the third portion 103-3 are defined as L3, Lch, and L4, respectively. Also, the distance between the first portion 103-1 and the second portion 103-2 is defined as L1, and the distance between the second portion 103-2 and the third portion 103-3 is defined as L2. It should be understood that the term "width," "distance," "length," and "dimension" are used as units to express the value of Lch, L1, L2, L3, and L4 in the present application. Here, dimensions of Lch, L1, L2, L3, and L4 can be set to be equal (i.e., Lch=L1=L2=L3=L4). Also, dimensions L1 and L2 can be set to be equal (i.e., L1=L2) and dimensions L3 and L4 can be set to be equal (i.e., L3=L4).

Figure 4A:
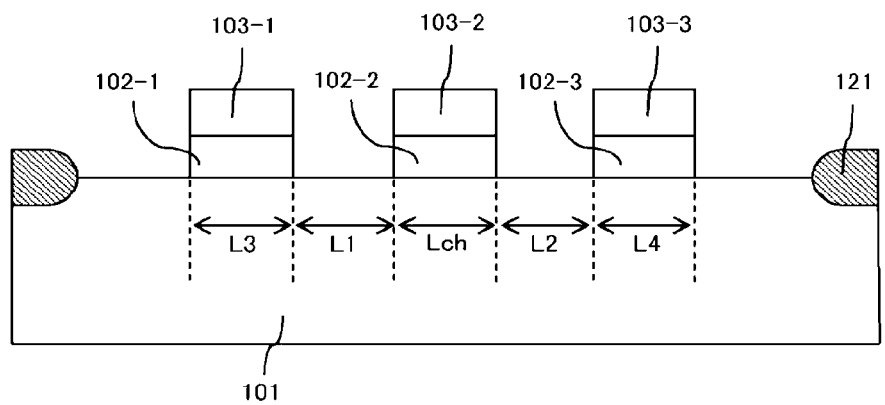
FIGS. 4A and 4B are a partial vertical cross-section diagram and a plan view showing a method for manufacturing a high voltage MOS transistor in accordance with the first embodiment of the present invention, respectively.
Figure 4B:
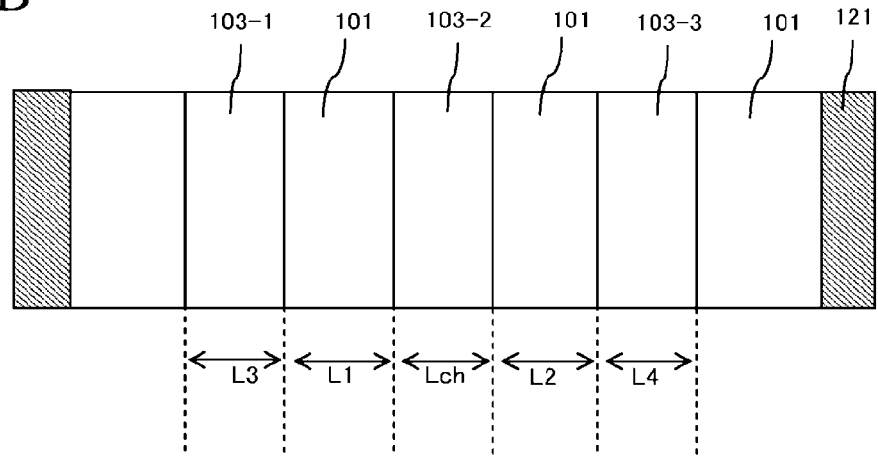

As shown in FIGS. 4A and 4B, the silicon dioxide film 102 is etched by using the resist pattern 103 as a mask, and thus it is selectively eliminated. As a result, a silicon dioxide film pattern 102' is formed. This silicon dioxide film pattern 102' is comprised of a first portion 102-1, a second portion 102-2, and a third portion 102-3. Here, widths of the first portion 102-1, the second portion 102-2, and the third portion 102-3 are L3, Lch, and L4, respectively. Also, the distance between the first portion 102-1 and the second portion 102-2 and the distance between the second portion 102-2 and the third portion 102-3 are L1 and L2, respectively.

As shown in FIGS. 5A and 5B, the resist pattern 103 is eliminated with a heretofore known method, and thus the silicon dioxide film pattern 102' is exposed on the principal surface of the p-type single crystal silicon substrate 101. Here, the dimension Lch that is defined by the width of the second portion 102-2 of the silicon dioxide film pattern 102' corresponds to a design value of the channel length Lch. Also, the dimension L1 that is defined by the distance between the first portion 102-1 and the second portion 102-2 of the silicon dioxide film 102' corresponds to a dimension L1 of a source-side electric filed reduction layer formed in a later step. The dimension L2 that is defined by the distance between the second portion 102-2 and the third portion 102-3 of the silicon dioxide film 102' corresponds to a drain-side gate overlap amount L2, that is, a dimension L2 of a drain-side electric field reduction layer formed in a later step. The dimension L3 that is defined by the width of the first portion 102-1 of the silicon dioxide film pattern 102' corresponds to a distance L3 between a source-side edge of a gate electrode formed in a later step and a source-side first heavily doped diffusion layer formed in a later step. The dimension L4 that is defined by the width of the third portion 102-3 of the silicon dioxide film 102' corresponds to a distance L4 between a drain-side edge of a gate electrode formed in a later step and a drain-side first heavily doped diffusion layer formed in a later step.

Therefore, the dimension Lch may be set to be a desired channel length Lch of a transistor formed in a later step. Also, the dimension L1 may be set to be a desired source-side gate overlap amount L1 of a transistor. The dimension L2 may be set to be a desired drain-side gate overlap amount L2 of a transistor formed in a later step. The dimension L3 may be set to be a distance L3 between a source-side edge of a gate electrode formed in a later step and a source-side first heavily doped layer formed in a later step. The dimension L4 may be set to be a distance L4 between a drain-side edge of a gate electrode formed in a later step and a drain-side first heavily doped layer formed in a later step. These dimensions Lch, L1, L2, L3, and L4 can be arbitrarily set as long as the lithography resolution does not exceed its limits. Photolithography, x-ray lithography, and electron beam lithography can be suggested as examples of the lithography used here. However, these may be chosen according to a desired dimension, that is, a desired resolution limits. As a typical example, an i-ray exposure device can be used. In this case, the dimensions Lch, L1, L2, L3, and L4 may be set to be approximately 0.2 µm and more. As an example, the dimensions L1 and L2 are set to be approximately 0.2-1.0 µm. On the other hand, dimensions L3 and L4 may be approximately 0.4 µm in consideration of the alignment margin with a lithography conducted in a later step.

Figure 6A:
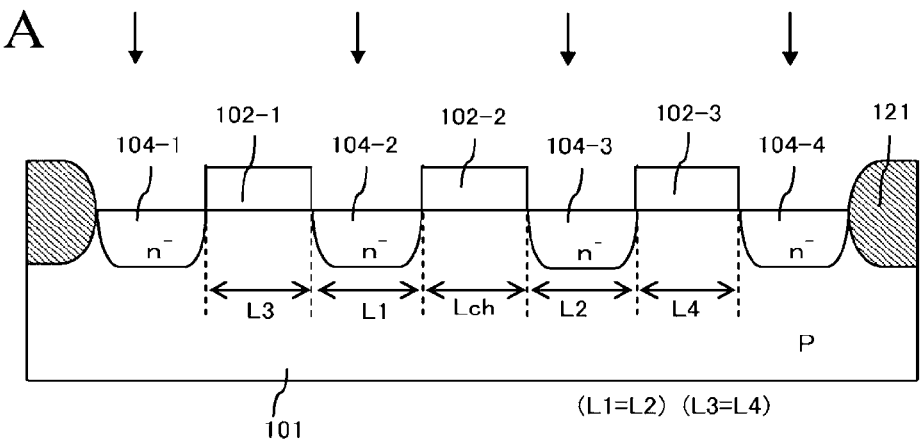
FIGS. 6A and 6B are a partial vertical cross-section diagram and a plan view showing a method for manufacturing a high voltage MOS transistor in accordance with the first embodiment of the present invention, respectively.
Figure 6B:
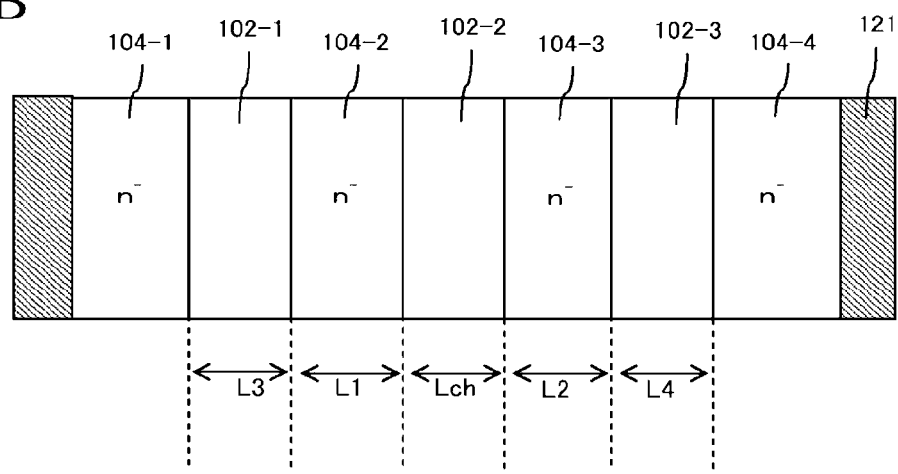

As shown in FIGS. 6A and 6B, the n-type impurity phosphorus (P) is selectively implanted into the principal surface of the p-type single crystal silicon substrate 101 in a vertical direction by using the silicon dioxide film pattern 102' as a mask with an acceleration energy of 80 keV and a dose amount of $3.0 \times 10^{12}$ cm$^{-2}$. Also, phosphorus ions do not penetrate the silicon dioxide film pattern 102' with this acceleration energy. Here, the term "a vertical direction" means a direction vertical to the substrate surface, that is, a direction vertical to a surface including both a direction in which a channel length of a transistor is defined and a direction in which a channel width is defined. As a result, first lightly doped N$^-$ diffusion layers 104-1, 104-2, 104-3, and 104-4 are selectively formed in upper regions of the p-type single crystal silicon substrate 101 located below the silicon dioxide film pattern 102'. The first lightly doped N$^-$ diffusion layers 104-1, 104-2, 104-3, and 104-4 are self-aligned with the silicon dioxide film pattern 102'. Here, the first lightly doped N$^-$ diffusion layers 104-2 and 104-3 function as electric field reduction layers.

The channel length Lch, which is defined between the first lightly doped N$^-$ diffusion layers 104-2 and 104-3 functioning as electric field reduction layers, is defined by the width of the second portion 102-2 of the silicon dioxide film pattern 102'. Also, the dimension L1 of the first lightly doped N$^-$ diffusion layer 104-2 functioning as a source-side electric field reduction layer is defined by the width L1 between the first portion 102-1 and the second portion 102-2 of the silicon dioxide film pattern 102'. The dimension L2 of the first lightly doped N$^-$ diffusion layer 104-3 functioning as a drain-side electric field reduction layer is defined by the width between the second portion 102-2 and the third portion 102-3 of the silicon dioxide film pattern 102'. Here, the width and the impurity concentration of the first lightly doped N$^-$ diffusion layers 104-1 to 104-4 can be arbitrarily set according to a voltage resistant specification of a device.

Figure 7A:
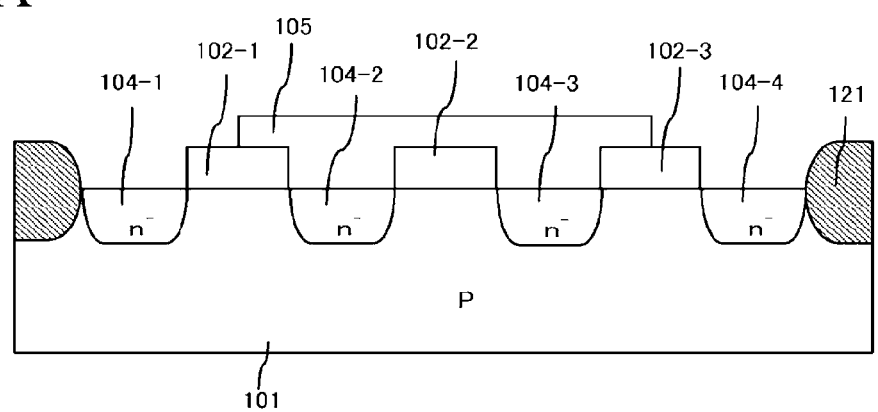
FIGS. 7A and 7B are a partial vertical cross-section diagram and a plan view showing a method for manufacturing a high voltage MOS transistor in accordance with the first embodiment of the present invention, respectively.
Figure 7B:
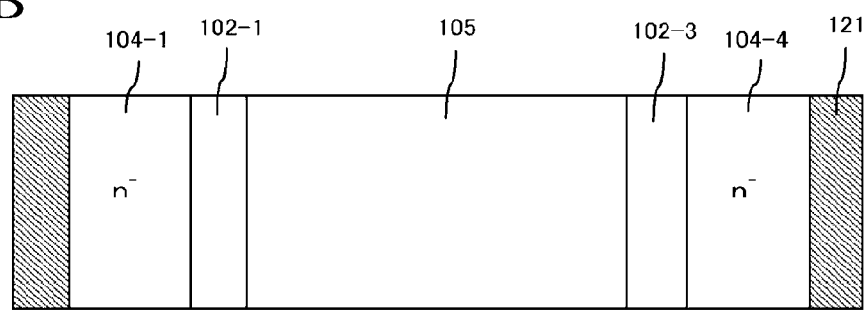

As shown in FIGS. 7A and 7B, a resist pattern 105 is formed on the second portion 102-2 of the silicon dioxide film pattern 102', the inner half portion of the first portion 102-1 of the silicon dioxide film pattern 102', the inner half portion of the third portion 102-3 of the silicon dioxide film pattern 102', the source-side first lightly doped N$^-$ diffusion layer 104-2, and the drain-side first lightly doped N$^-$ diffusion layer 104-3 with a heretofore known lithography technique. Here, it is necessary for a source-side edge of the resist pattern 105 to be located on the first portion 102-1 of the silicon dioxide film pattern 102'. On the other hand, it is necessary for a drain-side edge of the resist pattern 105 to be located on the third portion 102-3 of the silicon dioxide film pattern 102'. Therefore, an acceptable alignment error in the patterning of the resist is half of the dimensions L3 and L4, when the resist is patterned so that the source-side edge and the drain-side edge of the resist pattern 105 are located in the middle of the first portion 102-1 and the third portion 102-3 of the silicon dioxide film pattern 102', respectively.

Figure 8A:
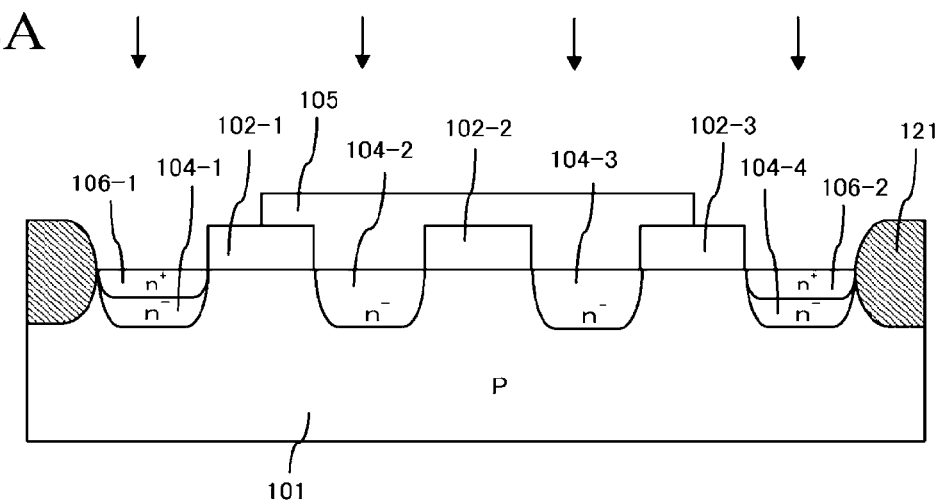
FIGS. 8A and 8B are a partial vertical cross-section diagram and a plan view showing a method for manufacturing a high voltage MOS transistor in accordance with the first embodiment of the present invention, respectively.
Figure 8B:
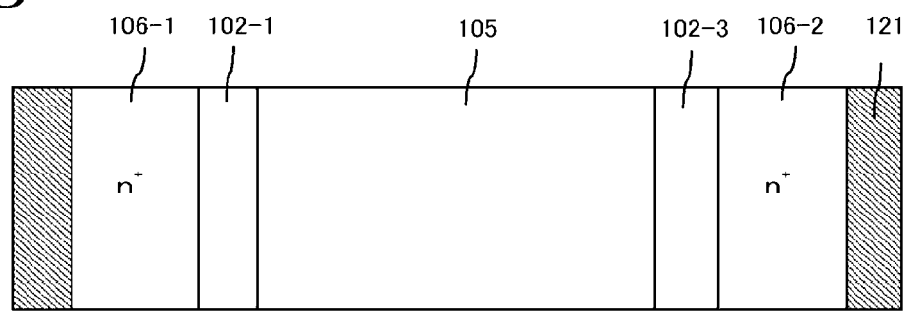

As shown in FIGS. 8A and 8B, the n-type impurity phosphorus (P) is selectively implanted into the principal surface of the p-type single crystal silicon substrate 101 in a vertical direction by using the resist pattern 105 and the first portion 102-1 and the third portion 102-3 of the silicon dioxide film pattern 102' as a mask with an acceleration energy of 40 keV and a dose amount of $4.0 \times 10^{15}$ cm$^{-2}$. As a result, a source-side first heavily doped N$^+$ diffusion layer 106-1 is selectively formed in an upper region of the source-side first lightly doped N$^-$ diffusion layer 104-1. On the other hand, a drain-side first heavily doped N$^+$ diffusion layer 106-2 is selectively formed in an upper region of the drain-side first lightly doped N$^-$ diffusion layer 104-4. The source-side first heavily doped N$^+$ diffusion layer 106-1 is formed to be self-aligned with an edge of the first portion 102-1 of the silicon dioxide film pattern 102'. On the other hand, the drain-side first heavily doped N$^+$ diffusion layer 106-2 is formed to be self-aligned with an edge of the third portion 102-3 of the silicon dioxide film pattern 102'.

Figure 9A:
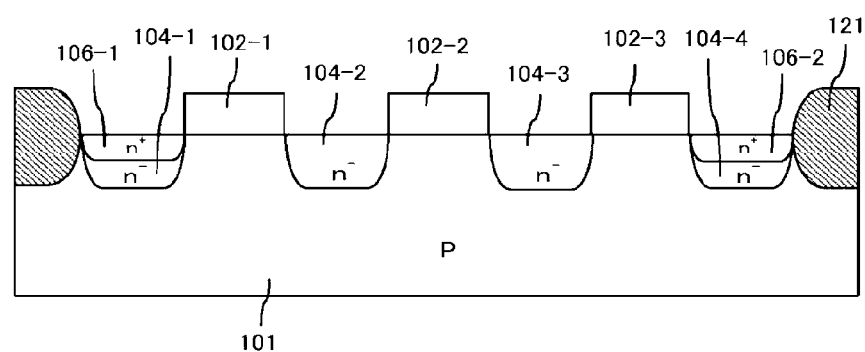
FIGS. 9A and 9B are a partial vertical cross-section diagram and a plan view showing a method for manufacturing a high voltage MOS transistor in accordance with the first embodiment of the present invention, respectively.
Figure 9B:
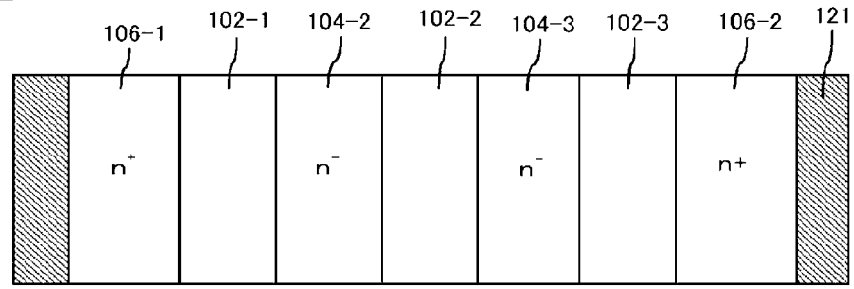

As shown in FIGS. 9A and 9B, the resist pattern 105 is eliminated with a heretofore known method.

Figure 10A:
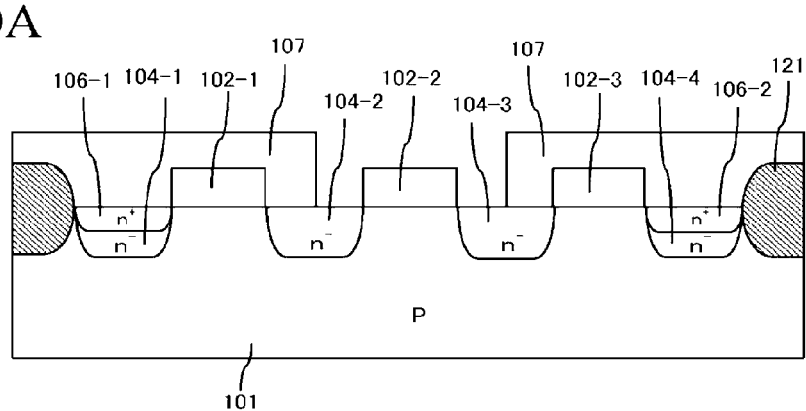
FIGS. 10A and 10B are a partial vertical cross-section diagram and a plan view showing a method for manufacturing a high voltage MOS transistor in accordance with the first embodiment of the present invention, respectively.
Figure 10B:
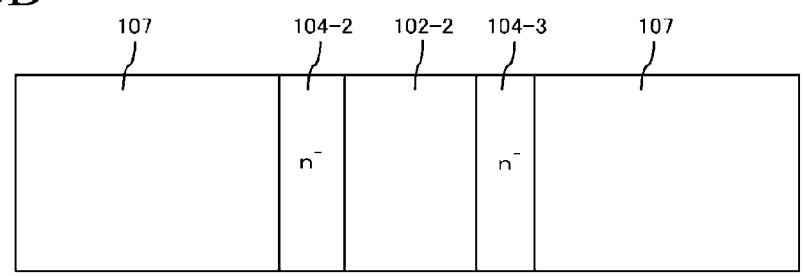

As shown in FIGS. 10A and 10B, a resist pattern 107 is formed on the first portion 102-1 and the third portion 102-3 of the silicon dioxide film pattern 102', the source-side and the drain-side first heavily doped $N^+$ diffusion layers 106-1 and 106-2, and an outer side portion of the source-side and the drain-side first lightly doped $N^-$ diffusion layers 104-2 and 104-3 with a heretofore known lithography technique. Here, it is necessary for a source-side edge of the resist pattern 107 to be located on the source-side first lightly doped $N^-$ diffusion layer 104-2. On the other hand, it is necessary for a drain-side edge of the resist pattern 107 to be located on the drain-side first lightly doped $N^-$ diffusion layer 104-3. Therefore, an acceptable alignment error in the patterning of the resist is half of dimensions L1 and L2, when the resist is patterned so that the source-side edge and the drain-side edge of the resist pattern 107 are located in the middle of the source-side and the drain-side first lightly doped $N^-$ diffusion layers 104-2 and 104-3, respectively.

As shown in FIGS. 11A and 11B, the second portion 102-2 of the silicon dioxide film pattern 102' is eliminated with a heretofore known etching method by using the resist pattern 107 as a mask. More specifically, diluted hydrogen fluoride (HF) may be used as etching solution. It should be understood that as a heretofore known technique, a thin silicon dioxide film can be formed as a passivation film to protect a surface of the p-type single crystal silicon substrate 101 before the above described ion implantation step is conducted, although this is not shown in the figures.

Figure 12A:
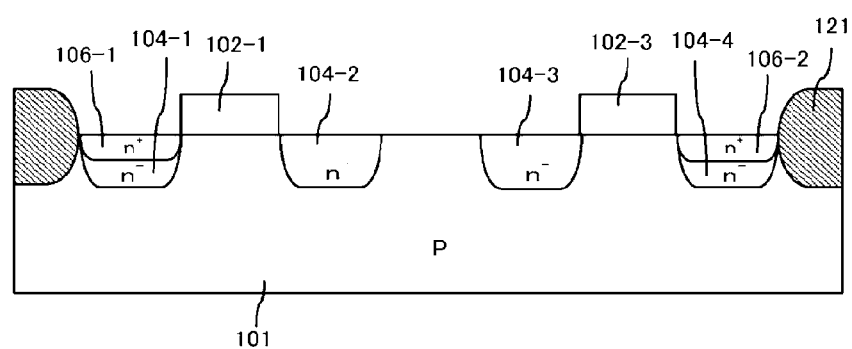
FIGS. 12A and 12B are a partial vertical cross-section diagram and a plan view showing a method for manufacturing a high voltage MOS transistor in accordance with the first embodiment of the present invention, respectively.
Figure 12B:
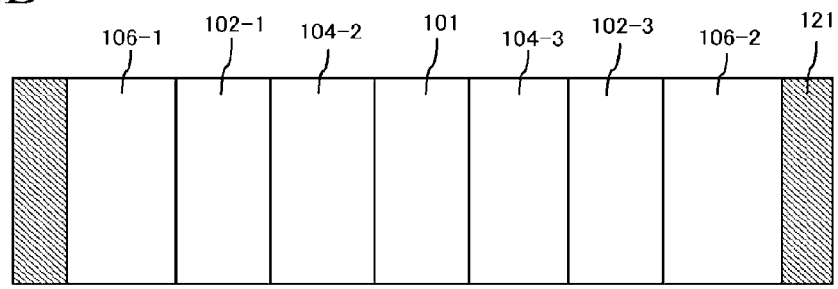

As shown in FIGS. 12A and 12B, the resist pattern 107 is eliminated with a heretofore known method.

Figure 13A:
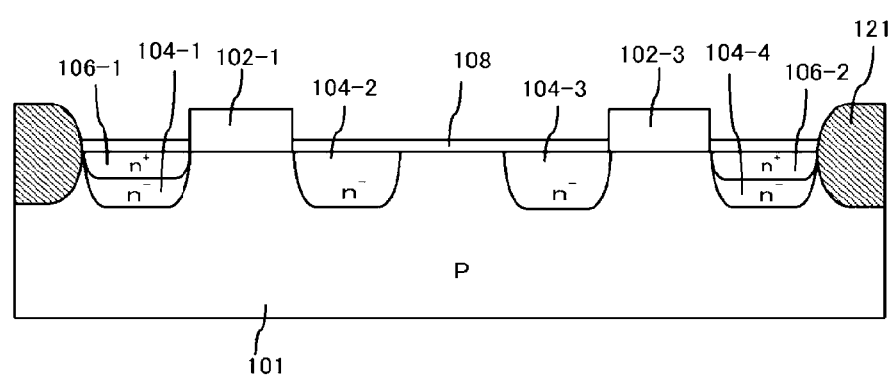
FIGS. 13A and 13B are a partial vertical cross-section diagram and a plan view showing a method for manufacturing a high voltage MOS transistor in accordance with the first embodiment of the present invention, respectively.
Figure 13B:
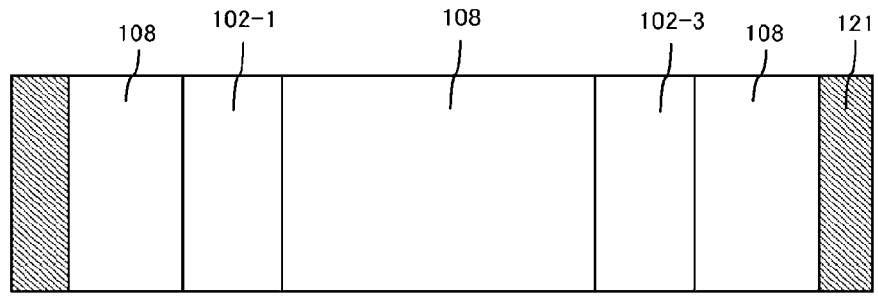

As shown FIGS. 13A and 13B, a gate oxide film 108 of 1000 Å in thickness is formed on the p-type single crystal silicon substrate 101, more specifically, on the source-side first lightly doped $N^-$ diffusion layer 104-2, the drain-side first lightly doped $N^-$ diffusion layer 104-3, the channel region of the p-type single crystal silicon substrate 101 defined between the source-side first lightly doped $N^-$ diffusion layer 104-2 and the drain-side first lightly doped $N^-$ diffusion layer 104-3, the source-side first heavily doped $N^+$ diffusion layer 106-1, and the drain-side first heavily doped $N^+$ diffusion layer 106-2 with a heretofore known method.

Figure 14A:
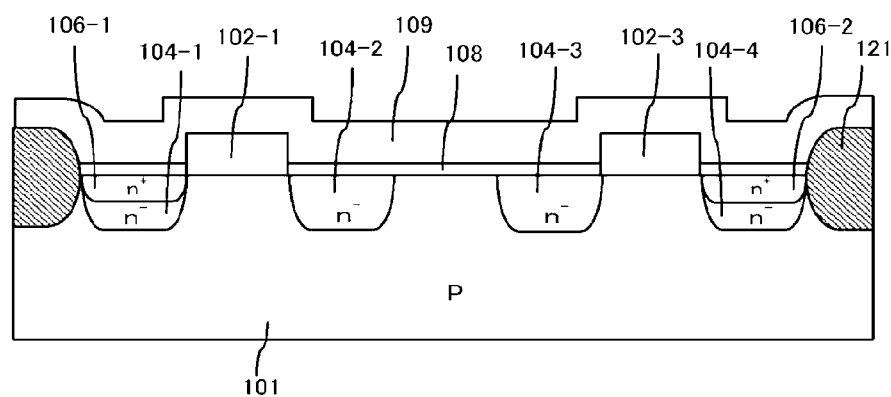
FIGS. 14A and 14B are a partial vertical cross-section diagram and a plan view showing a method for manufacturing a high voltage MOS transistor in accordance with the first embodiment of the present invention, respectively.
Figure 14B:
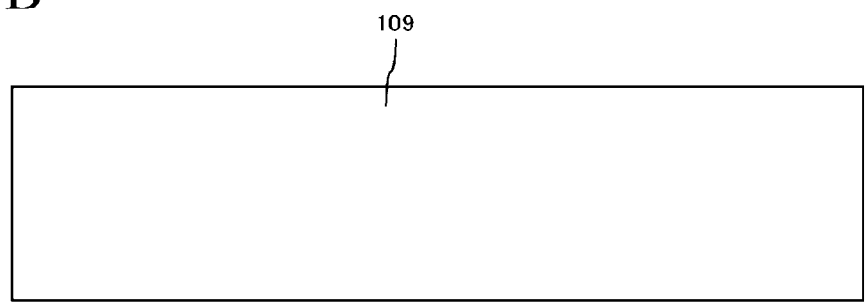

As shown in FIGS. 14A and 14B, a polysilicon film 109 of 2000 Å in thickness is formed on the gate oxide film 108, the field oxide film 121, and the remaining first portion 102-1 and the third portion 102-3 of the silicon oxide film pattern 102'. For example, a CVD method can be used for this forming step of the polysilicon film 109.

Figure 15A:
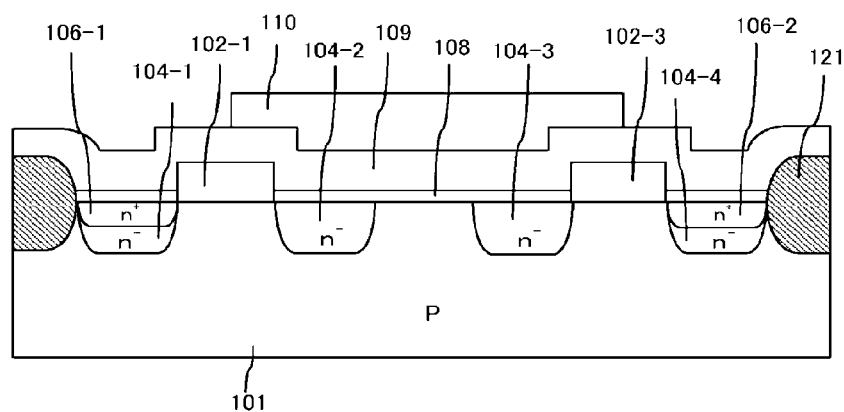
FIGS. 15A and 15B are a partial vertical cross-section diagram and a plan view showing a method for manufacturing a high voltage MOS transistor in accordance with the first embodiment of the present invention, respectively.
Figure 15B:
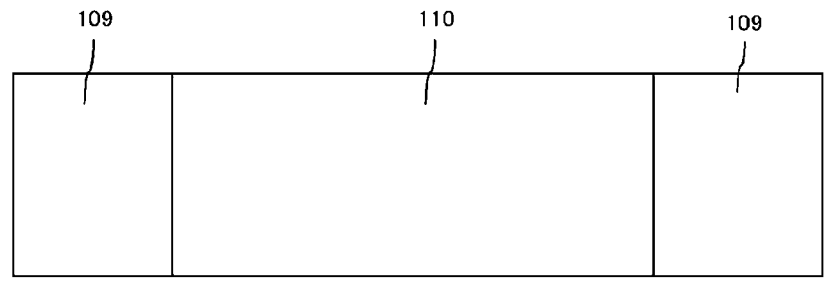

As shown in FIGS. 15A and 15B, a resist pattern 110 is formed on the polysilicon film 109 with a heretofore known lithography technique. Here, it is necessary for a source-side edge of the resist pattern 110 to be located above the first portion 102-1 of the silicon oxide film pattern 102'. On the other hand, it is necessary for a drain-side edge of the resist pattern 110 to be located above the third portion 102-3 of the silicon oxide film pattern 102'. Therefore, an acceptable alignment error in the patterning of the resist is half of the dimensions L3 and L4, when the resist is patterned so that the source-side edge and the drain-side edge of the resist pattern 110 are located above the middle of the first portion 102-1 and the third portion 102-3 of the silicon dioxide film pattern 102', respectively.

Figure 16A:
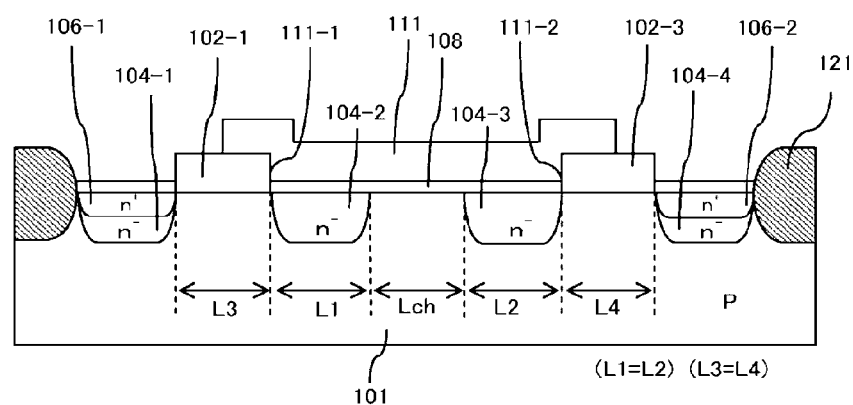
FIGS. 16A and 16B are a partial vertical cross-section diagram and a plan view showing a method for manufacturing a high voltage MOS transistor in accordance with the first embodiment of the present invention, respectively.
Figure 16B:
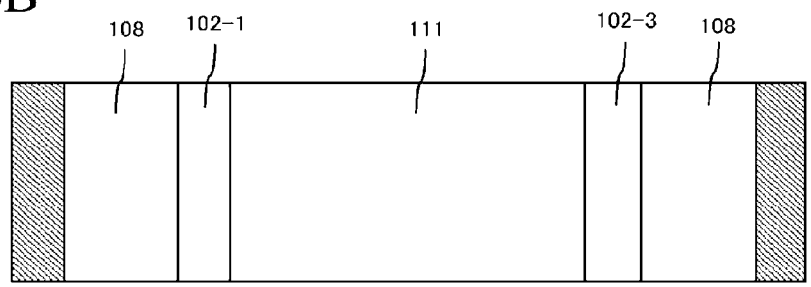

As shown in FIGS. 16A and 16B, the polysilicon film 109 is selectively etched by using the resist pattern 110 as a mask, and the resist pattern 110 is eliminated. As a result, a gate electrode 111 comprised of a polysilicon film is selectively formed on the gate oxide film 108, and an inner half portion of the first portion 102-1 and an inner half portion of the third portion 102-3 of the silicon oxide film pattern 102'. Also, the gate electrode 111 is formed directly above the gate oxide film 108, and it is comprised of a functional portion that applies an electric field on an upper region of the p-type single crystal silicon substrate 101 including the channel region, and nonfunctional portions that are formed on the first portion 102-1 and the third portion 102-3 of the silicon oxide film pattern 102' Edges of the polysilicon film comprising the gate electrode 111 are located on the first portion 102-1 and the third portion 102-3 of the silicon dioxide film pattern 102'. However, the above described functional portion actually functions as a gate. Therefore, a first edge 111-1 and a second edge 111-2, which are defined by the inner edge of the first portion 102-1 and the inner edge of the third portion 102-3 of the silicon dioxide film pattern 102', respectively, are hereinafter defined as the edges of the gate electrode 111.

Because of this, a gate overlap amount L1 between the source-side first lightly doped $N^-$ diffusion layer 104-2 functioning as an electric field reduction layer and the gate electrode 111 is defined by the width L1 between the above described first portion 102-1 and the second portion 102-2 (eliminated in a step shown in FIGS. 12A and 12B) of the silicon dioxide film pattern 102'. Also, the source-side first lightly doped $N^-$ diffusion layer 104-2 functioning as an electric field reduction layer is self-aligned with the first edge 111-1 of the gate electrode 111. In the same way, a gate overlap amount L2 between the drain-side first lightly doped $N^-$ diffusion layer 104-3 functioning as an electric field reduction layer and the gate electrode 111 is defined by the width L2 between the above described third portion 102-3 and the second portion 102-2 (eliminated in a step shown in FIGS. 12A and 12B) of the silicon dioxide film pattern 102'. Also, the drain-side first lightly doped $N^-$ diffusion layer 104-3 functioning as an electric field reduction layer is self-aligned with the second edge 111-2 of the gate electrode 111.

Figure 17A:
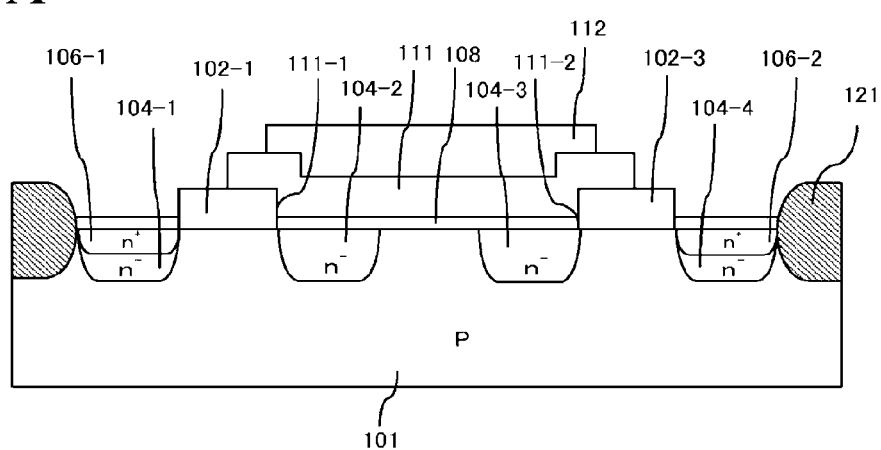
FIGS. 17A and 17B are a partial vertical cross-section diagram and a plan view showing a method for manufacturing a high voltage MOS transistor in accordance with the first embodiment of the present invention, respectively.
Figure 17B:
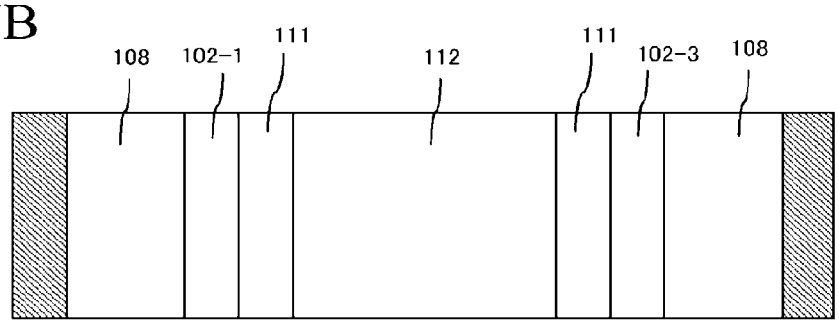

As shown in FIGS. 17A and 17B, a resist pattern 112 is formed on the gate electrode 111 with a heretofore known lithography technique. The resist pattern 112 is required to be formed to cover the functional portion of the gate electrode 111 formed on the gate oxide film 108 at least. Here, a source-side edge of the resist pattern 112 is required to be located on the portion of the gate electrode 111 between the source-side edge of the gate electrode 111 and the first edge 111-1 of the gate electrode 111. On the other hand, a drain-side edge of the resist pattern 112 is required to be located on the portion of the gate electrode 111 between the drain-side edge of the gate electrode 111 and the second edge 111-2 of the gate electrode 111. Because of this structure, the functional portions of the gate electrode 111 formed on the gate oxide film 108 are completely covered with the resist pattern 112.

Figure 18A:
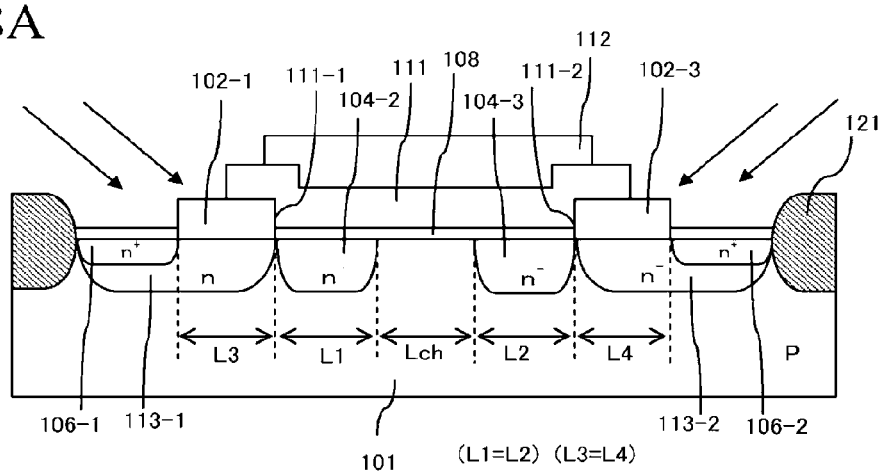
FIGS. 18A and 18B are a partial vertical cross-section diagram and a plan view showing a method for manufacturing a high voltage MOS transistor in accordance with the first embodiment of the present invention, respectively.
Figure 18B:
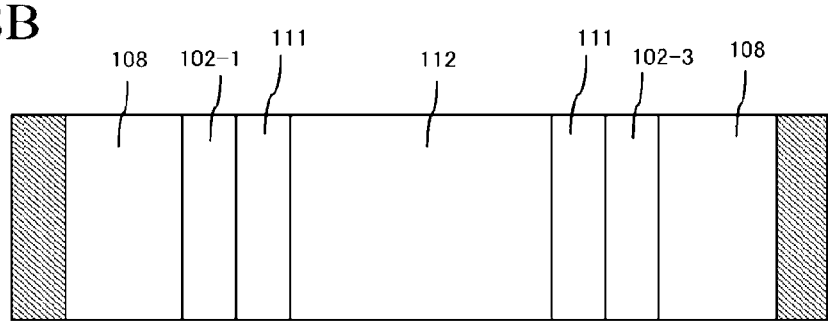

As shown in FIGS. 18A and 18B, the n-type impurity phosphorus (P) is selectively implanted into the principal surface of the p-type single crystal silicon substrate 101 through the first portion 102-1 and the third portion 102-3 of the silicon dioxide film pattern 102' in an oblique direction by using the resist pattern 112 and source-side and drain-side edge neighborhood regions of the gate electrode 111 as a mask while the p-type single crystal silicon substrate 101 is being rotated around a vertical axis. As a result, a source-side second lightly doped $N^-$ diffusion layer 113-1 and a drain-side second lightly doped $N^-$ diffusion layer 113-2 are formed in an upper region of the p-type single crystal silicon substrate 101. More specifically, the source-side second lightly doped $N^-$ diffusion layer 113-1 is formed in a region including the region immediately below the first portion 102-1 of the silicon oxide film pattern 102' and the source-side first lightly doped $N^-$ diffusion layer 104-1. On the other hand, the drain-side second lightly doped $N^-$ diffusion layer 113-2 is formed in a region including the region immediately below the third portion 102-3 of the silicon oxide film pattern 102' and the drain-side first lightly doped $N^-$ diffusion layer 104-4. Here, the term "an oblique direction" means a direction sloping with respect to the above defined "vertical direction" at a prescribed angle. Also, the term "an implantation angle" means a contained angle defined by the substrate surface and "the oblique direction."

The above described ion implantation in the oblique direction is required to be conducted so that ions can penetrate the first portion 102-1 and the third portion 102-3 of the silicon dioxide film 102'. The ion implantation is required to be conducted at angles (i.e., directions) along (i) a line formed by connecting a outer lower edge portion of the nonfunctional portion of the gate electrode 111 formed on the first portion 102-1 of the silicon dioxide film pattern 102' and an inner lower edge portion of the first portion 102-1 of the silicon dioxide film pattern 102', and (ii) a line formed by connecting a outer lower edge portion of the nonfunctional portion of the gate electrode 111 formed on the third portion 102-3 of the silicon dioxide film pattern 102' and an inner lower edge portion of the third portion 102-3 of the silicon dioxide film pattern 102'. Also, the ion implantation is required to be conducted so that ions can penetrate the first portion 102-1 and the third portion 102-3 of the silicon dioxide film pattern 102', and the penetrated ions can reach an outer edge portion of the source-side first lightly doped $N^-$ diffusion layer 104-2 and an outer edge portion of the drain-side first lightly doped $N^-$ diffusion layer 104-3. If these conditions are met, the source-side second lightly doped $N^-$ diffusion layer 113-1 adjacent to the outer side of the source-side first lightly doped $N^-$ diffusion layer 104-2 and the drain-side second lightly doped $N^-$ diffusion layer 113-2 adjacent to the outer side of the drain-side first lightly doped $N^-$ diffusion layer 104-3 can be formed.

For example, an ion implantation step in an oblique direction can be conducted at an angle of 45 degrees (i.e., arctangent $(0.5/2/0.25)=45$ degrees) with an acceleration energy of 350 keV and a dose amount of $5.0\times10^{13}$ cm$^{-2}$ in which ions can penetrate the first portion 102-1 and the third portion 102-3 of the silicon dioxide film pattern 102', when the first portion 102-1 and the third portion 102-3 of the silicon dioxide film pattern 102' are formed to have a thicknesses of 0.25 μm and a width of 0.5 μm, respectively, and the edges of the nonfunctional portions of the gate electrode 111 formed on the first portion 102-1 and the third portion 102-3 of the silicon dioxide film pattern 102' are located on the middle of the first portion 102-1 and the third portion 102-3 of the silicon dioxide film pattern 102', respectively.

Figure 19A:
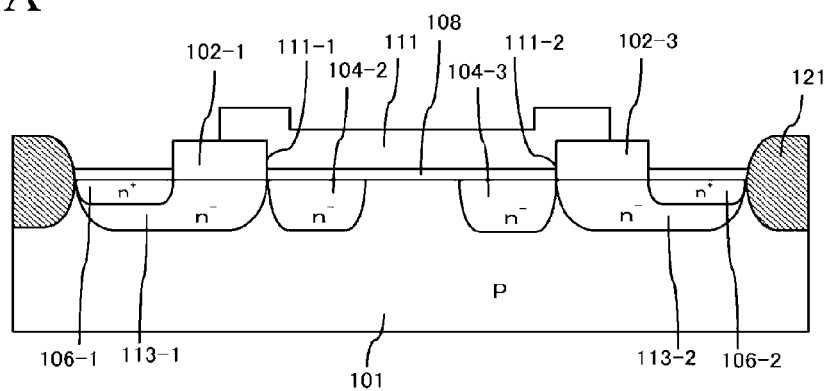
FIGS. 19A and 19B are a partial vertical cross-section diagram and a plan view showing a method for manufacturing a high voltage MOS transistor in accordance with the first embodiment of the present invention, respectively.
Figure 19B:
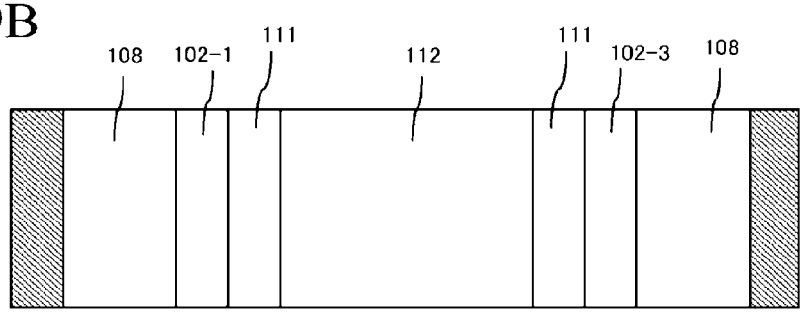

As shown in FIGS. 19A and 19B, the resist pattern 112 is eliminated with a heretofore known method.

Figure 20B:
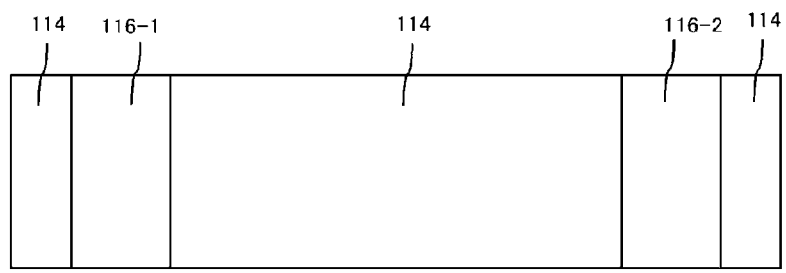

As shown in FIGS. 20A and 20B, an interlayer insulating film 114 is formed on the gate electrode 111, the first portion 102-1 and the third portion 102-3 of the silicon oxide pattern 102', the gate oxide film 108, and the field oxide film 121 with a heretofore known method. Next, a contact hole is formed in the interlayer insulating film 114 and the gate oxide film 108. Then, a source contact 115-1 and a drain contact 115-2 are formed in the contact holes, respectively, and thus they have ohmic contacts with the source-side and the drain-side first heavily doped $N^+$ diffusion layers 106-1 and 106-2, respectively. Next, a source wiring layer 116-1 and a drain wiring layer 116-2 are formed on the interlayer insulating film 114 with a heretofore known method, and thus they are electrically connected to the source-side and the drain-side first heavily doped $N^+$ diffusion layers 106-1 and 106-2 through the source contact 115-1 and the drain contact 115-2, respectively.

According to the present invention, the following are all defined by the single silicon dioxide film pattern 102' defined by a single lithography step: the channel length Lch, the horizontal positions and dimensions of the source-side and the drain-side first lightly doped $N^-$ diffusion layers 104-2 and 104-3, the source-side and the drain-side second lightly doped $N^-$ diffusion layers 113-1 and 113-2, the source-side and the drain-side first heavily doped $N^+$ diffusion layers 106-1 and 106-2, the horizontal positions of the first edge 111-1 and the second edge 111-2 of the gate electrode 111, the source-side gate overlap amount L1, the drain-side gate overlap amount L2, the distance L3 between the first edge 111-1 of the gate electrode 111 and the source-side first heavily doped $N^+$ diffusion layer 106-1, and the distance L4 between the second edge 111-2 of the gate electrode 111 and the drain-side first heavily doped $N^+$ diffusion layer 106-2. Therefore, the source-side and the drain-side first lightly doped $N^-$ diffusion layers 104-2 and 104-3, the source-side and the drain-side second lightly doped $N^-$ diffusion layers 113-1 and 113-2, the source-side and the drain-side first heavily doped $N^+$ diffusion layers 106-1 and 106-2, and the gate electrode 111 are self-aligned with each other in a horizontal direction, and misalignment is not caused among them.

Also, the source-side gate overlap amount L1 and the drain-side gate overlap amount L2 are all defined by the single silicon dioxide film pattern 102'. Therefore, variation from a design value, which is originated from misalignments in a plurality of patterning steps, is not caused with respect to the source-side gate overlap amount L1 and the drain-side gate overlap amount L2. That is to say, the source-side first lightly doped $N^-$ diffusion layer 104-2 and the drain-side first lightly doped $N^-$ diffusion layer 104-3 are overlapped with the gate electrode 111 in a self-alignment fashion.

The distance L3 between the first edge 111-1 of the gate electrode 111 and the source-side first heavily doped $N^-$ diffusion layer 106-1, and the distance L4 between the second edge 111-2 of the gate electrode 111 and the drain-side first heavily doped $N^+$ diffusion layer 106-2 are all defined by the single silicon dioxide film pattern 102'. Therefore, variation from a design value, which is originated from misalignments in a plurality of patterning steps, is not caused with respect to the distances L3 and L4.

As a typical example, the silicon dioxide film pattern 102' may be defined so that Lch, L1, L2, L3, and L4 shown in FIGS. 5A and 5B can be set to be equal (i.e., Lch = L1=L2=L3=L4). In other words, the width Lch of the second portion 102-2 of the silicon dioxide film pattern 102', the width L1 between the first portion 102-1 and the second portion 102-2 of the silicon dioxide film pattern 102', the width L2 between the second portion 102-2 and the third portion 102-3 of the silicon dioxide film pattern 102', the width L3 of the first portion 102-1 of the silicon dioxide film pattern 102', and the width L4 of the third portion 102-3 of the silicon dioxide film pattern 102' may be set to be the same value. In this case, the source-side first lightly doped $N^-$ diffusion layer 104-2 and the drain-side first lightly doped $N^-$ diffusion layer 104-3, which function as electric field reduction layers, are overlapped with the gate electrode 111 in a self-alignment fashion. Also, the source-side first heavily doped $N^+$ diffusion layer 106-1 and the drain-side first heavily doped $N^+$ diffusion layer 106-2 are offset from the gate electrode 111 in a self-alignment fashion. In other words, variation from an design value, which is originated from misalignment in a plurality of patterning steps, is not caused with respect to the channel length Lch, the source-side gate overlap amount L1, the drain-side gate overlap amount L2, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2. In addition, the source-side and the drain-side first lightly doped N⁻ diffusion layers 104-2 and 104-3, which function as electric field reduction layers, and the source-side and the drain-side first heavily doped N⁺ diffusion layers 106-1 and 106-2 are symmetrical to the gate electrode 111 in a horizontal direction.

Also, the silicon dioxide film pattern 102' may be set so that L1 and L2 shown in FIGS. 5A and 5B are set to be equal (i.e., L1=L2) and L3 and L4 are set to be equal (i.e., L3=L4). In other words, the width L1 between the first portion 102-1 and the second portion 102-2 of the silicon dioxide film pattern 102', and the width L2 between the second portion 102-2 and the third portion 102-3 of the silicon dioxide film pattern 102' may be set to be the same value, and the width L3 of the first portion 102-1 of the silicon dioxide film pattern 102' and the width L4 of the third portion 102-3 of the silicon dioxide film pattern 102' may be set to be the same value. In this case, the source-side and the drain-side first lightly doped N⁻ diffusion layers 104-2 and 104-3 are overlapped with the gate electrode 111 in a self-alignment fashion. Also, the source-side and the drain-side first heavily doped N⁺ diffusion layers 106-1 and 106-2 are offset from the gate electrode 111 in a self-alignment fashion. In other words, variation from a design value, which is originated form misalignments in a plurality of patterning steps, is not caused with respect to the channel length Lch, the source-side gate overlap amount L1, the drain-side gate overlap amount L2, the distance L3 between the first edge 111-1 of the gate electrode 111 and the source-side heavily doped N⁺ diffusion layer 106-1, and the distance L4 between the second edge 111-2 of the gate electrode 111 and the drain-side first heavily doped N⁺ diffusion layer 106-2. In addition, the source-side and the drain-side first lightly doped N⁻ diffusion layers 104-2 and 104-3, which function as electric field reduction layers, and the source-side and the drain-side first heavily doped N⁺ diffusion layers 106-1 and 106-2 are symmetrical to the gate electrode 111 in a horizontal direction.

Also, the silicon dioxide film pattern 102' may be set so that the dimensions L1 and L2 shown in FIGS. 5A and 5B are set so that they are not equal to each other (L1≠L2) and the dimensions L3 and L4 are set so that they are not equal to each other (L3≠L4). In other words, the width L1 between the first portion 102-1 and the second portion 102-2 of the silicon dioxide film pattern 102' and the width L2 between the second portion 102-2 and the third portion 102-3 of the silicon dioxide film pattern 102' may be set so that they are not equal to each other, and the width L3 of the first portion 102-1 of the silicon dioxide film pattern 102' and the third portion 102-3 of the silicon dioxide film pattern 102' may be set so that they are not equal to each other. In this case, the source-side and the drain-side first lightly doped N⁻ diffusion layers 104-2 and 104-3, which function as electric field reduction layers, are overlapped with the gate electrode 111 in a self-alignment fashion. Also, the source-side and the drain-side first highly doped N⁺ diffusion layers 106-1 and 106-2 are offset from the gate electrode 111 in a self-alignment fashion. In other words, variation form a design value, which is originated from misalignments in a plurality of patterning steps, is not caused with respect to the channel length Lch, the source-side gate overlap amount L1, the drain-side gate overlap amount L2, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2. In addition, the source-side and the drain-side first lightly-doped N⁻ diffusion layers 104-2 and 104-3, which function as electric-field reduction layers, and the source-side and the drain-side heavily doped N⁺ diffusion layers 106-1 and 106-2 are asymmetrical to the gate electrode 111 in a horizontal direction.

Therefore, variation from a design value, which is originated from misalignments in a plurality of patterning steps, is not caused with respect to the channel length Lch, the source-side gate overlap amount L1, the drain-side gate overlap amount L2, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2. This is because they are defined by a single lithography step in which the silicon dioxide film pattern 102 is defined.

Consequently, the first embodiment of the present invention has the following effects. First, a misalignment is not caused between the patterning to form the source-side and the drain-side first lightly doped N⁻ diffusion layers 104-2 and 104-3, and the patterning to form the gate electrode 111. Because of this, variation from a design is not caused with respect to the source-side overlap dimension L1 between the source-side first lightly doped N⁻ diffusion layer 104-2 functioning as an electric field reduction layer and the gate electrode 111. Furthermore, variation from a design value is not caused with respect to the drain-side gate overlap dimension L2 between the drain-side first lightly doped N⁻ diffusion layer 104-3 functioning as an electric field reduction layer and the gate electrode 111. In other words, the source-side and the drain-side overlap dimensions L1 and L2 are not varied, and thus device properties are not varied.

Second, the source-side and the drain-side gate overlap amounts L1 and L2 are equal in the gate overlap structure formed in a self-alignment fashion in accordance with the present invention. Because of this, the symmetrical gate overlap structure in a horizontal position can be formed based on the gate electrode 111 and the channel region. On the other hand, misalignment of a gate overlap amount can be caused in a gate overlap structure formed in a non-alignment fashion. This allows the gate overlap structure to be asymmetrically formed in a horizontal position based on a channel region. As a result, device properties can be varied. Therefore, according to the first embodiment of the present invention, misalignment of the gate overlap amount is not caused because the gate overlap structure is formed in a self-alignment fashion. Because of this, the gate overlap structure formed in a self-alignment fashion is symmetrically formed in a horizontal position based on the gate electrode 111 and the channel region. As a result, variation of device properties can be reduced, and furthermore, the defect rate can be improved.

Third, the source-side gate overlap amount L1 between the source-side first lightly doped N⁻ diffusion layer 104-2 and the gate electrode 111, and the drain-side gate overlap amount L2 between the drain-side first lightly doped N⁻ diffusion layer 104-3 and the gate electrode 111 can be defined without any regard for the alignment margin between the patterning to form the source-side and the drain-side first lightly doped N⁻ diffusion layers 104-2 and 104-3 functioning as electric field reduction layers and the patterning to form the gate electrode 111. When a gate overlap structure is formed in a non-self-alignment fashion, a design value must be set to be the dimension derived by adding the above described alignment margin between those patternings to the originally necessary gate overlap dimensions L1 and L2. On the other hand, when a gate overlap structure is formed in a self-alignment fashion, the above described alignment margin between those patternings is not needed and thus a design value may be set to be the originally necessary gate overlap dimensions L1 and L2 as they are. Consequently, current drive capability of a high voltage MOS transistor can be improved and thus devices can be miniaturized.

Fourth, the distance L3 between the first edge 111-1 of the gate electrode 111 and the source-side first heavily doped $N^+$ diffusion layer 106-1, and the distance L4 between the second edge 111-2 of the gate electrode 111 and the drain-side first heavily doped $N^+$ diffusion layer 106-2 can be defined without any regard for the patterning to form the source-side first heavily doped $N^+$ diffusion layer 106-1 and the drain-side first heavily doped $N^+$ diffusion layer 106-2 and the patterning to form the gate electrode 111, because the source-side and the drain-side first heavily doped $N^+$ diffusion layers 106-1 and 106-2 are self-aligned with the gate electrode 111. As a result, device properties can be miniaturized.

Fifth, the source-side and the drain-side first heavily doped $N^+$ diffusion layers 106-1 and 106-2 can be symmetrically formed with respect to the gate electrode 111 in a horizontal position when they are formed to be self-aligned with the gate electrode 111. On the other hand, the source-side and the drain-side first heavily doped $N^+$ diffusion layers 106-1 and 106-2 can be asymmetrically formed with respect to the gate electrode 111 in a horizontal position when they are formed to be not self-aligned with the gate electrode 111. As a result, device properties can be varied. However, according to the first embodiment of the present invention, the source-side and the drain-side first heavily doped $N^+$ diffusion layers 106-1 and 106-2 can be symmetrically formed with respect to the gate electrode 111 in a horizontal position, because they are formed to be self-aligned with the gate electrode 111. As a result, variation of device properties can be reduced. Furthermore, the defect rate can be greatly improved.

Second Embodiment

According to the second embodiment of the present invention, a high voltage MOS transistor is provided, which has a lightly doped diffusion layer that overlaps with a gate electrode in a self-alignment fashion and functions as an electric field reduction layer. Also, according to the second embodiment of the present invention, a method for manufacturing the above described high voltage MOS transistor is provided.

High Voltage MOS Transistor Structure

Figure 34A:
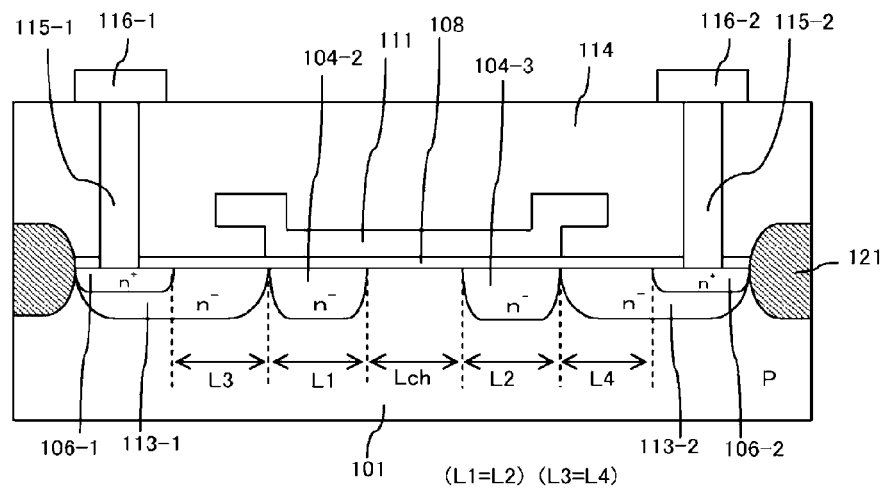
FIGS. 34A and 34B are a partial vertical cross-section diagram and a plan view showing a method for manufacturing a high voltage MOS transistor in accordance with the second embodiment of the present invention, respectively.

FIG. 34A is a partial vertical cross-section diagram that shows the structure of a high voltage MOS transistor in accordance with the second embodiment of the present invention.

The high voltage MOS transistor according to the second embodiment of the present invention has the following structure. The principal surface of a p-type single crystal silicon substrate 101 includes an element isolation region comprised of a field oxide film 121 and an active region defined by the field oxide film 121. Source-side and drain-side first lightly doped $N^-$ diffusion layers 104-2 and 104-3, which are separated through a channel, and source-side and drain-side second lightly doped $N^-$ diffusion layers 113-1 and 113-2, which are located adjacent to the outer side of the source-side and the drain-side first lightly doped $N^-$ diffusion layers 104-2 and 104-3 respectively, are formed in the active region of the p-type single crystal silicon substrate 101. Here, the outer side of the source-side and the drain-side first lightly doped $N^-$ diffusion layers 104-2 and 104-3 means the regions between these layers and field oxide films 121. On the other hand, the inner side of the source-side and the drain-side first lightly doped $N^-$ diffusion layers 104-2 and 104-3 means the region located between them. These definitions are applied to other portions of the semiconductor device in accordance with the present invention. Source-side and drain-side first heavily doped $N^+$ diffusion layers 106-1 and 106-2 are selectively formed in upper regions of the source-side and the drain-side second lightly doped $N^-$ diffusion layers 113-1 and 113-2, respectively. The source-side and the drain-side first heavily doped $N^+$ diffusion layers 106-1 and 106-2 are separated from the source-side and the drain-side first lightly doped $N^-$ diffusion layers 104-2 and 104-3 through the source-side and the drain-side second lightly doped $N^-$ diffusion layers 113-1 and 113-2, respectively.

Figure 22A:
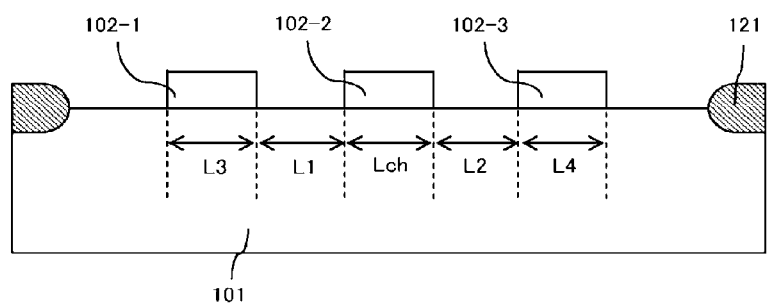
FIGS. 22A and 22B are a partial vertical cross-section diagram and a plan view showing a method for manufacturing a high voltage MOS transistor in accordance with the second embodiment of the present invention, respectively.
Figure 22B:
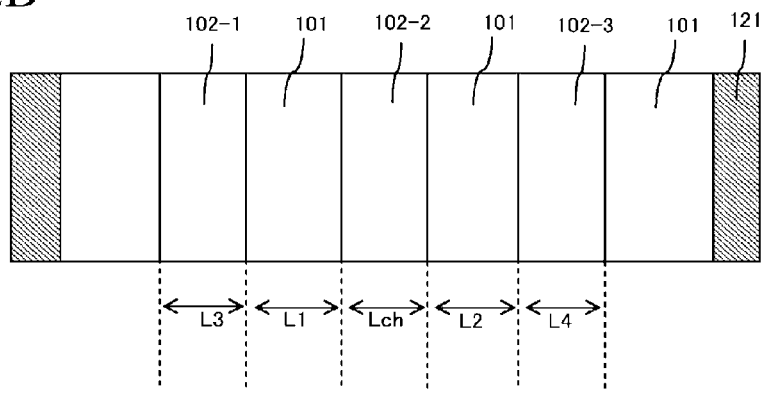
Figure 26A:
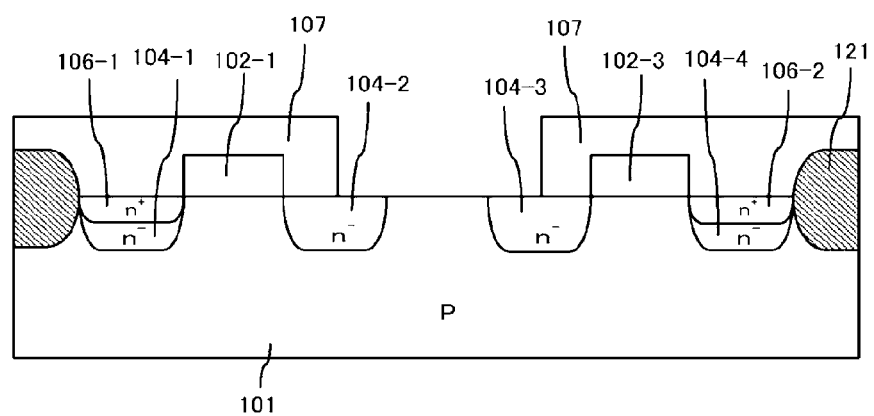
FIGS. 26A and 26B are a partial vertical cross-section diagram and a plan view showing a method for manufacturing a high voltage MOS transistor in accordance with the second embodiment of the present invention, respectively.
Figure 26B:
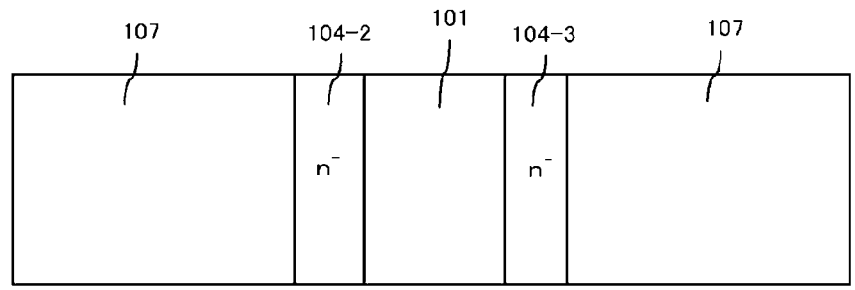

A gate oxide film 108 is formed on the principal surface of the p-type single crystal silicon substrate 101. More specifically, the gate oxide film 108 is formed on a channel region of the p-type single crystal silicon substrate 101, the source-side and the drain-side first lightly doped $N^-$ diffusion layers 104-2 and 104-3, and the source-side and the drain-side first heavily doped $N^+$ diffusion layers 106-1 and 106-2. A second portion 102-2 of a silicon dioxide film pattern 102' shown in FIGS. 22A and 22B is eliminated in a step of a manufacturing process of a semiconductor device in accordance with the second embodiment as shown in FIGS. 26A and 26B. Furthermore, a first portion 102-1 and a third portion 102-3 of the silicon dioxide film pattern 102' shown in FIG. 22A is eliminated in a step of the manufacturing process of the semiconductor device after a gate electrode is formed as shown in FIG. 31. Therefore, the silicon dioxide film pattern 102' does not exist in a finished high voltage MOS transistor in the second embodiment of the present invention. Thus, the second embodiment is different from the first embodiment in this regard.

A gate electrode 111 comprised of a polysilicon film is selectively formed on the gate oxide film 108. Also, the gate electrode 111 is located immediately above the gate oxide film 108, and it is comprised of a functional portion that applies an electric field on an upper region of the p-type single crystal silicon substrate 101 including a channel region, and non-functional portions that are formed above and separated from the gate oxide film 108. Edges of the polysilicon film comprising the gate electrode 111 are formed above and separated from the gate oxide film 108. However, the above described functional portion of the gate electrode 111 actually functions as a gate. Therefore, the gate edges of the gate electrode 111 are hereinafter defined as a first edge 111-1 and a second edge 111-2 of the gate electrode 111 that are defined by inner edges of the first portion 102-1 and the third portion 102-3 of the silicon dioxide film pattern 102', respectively.

An interlayer insulating film 114 is formed to cover the gate electrode 111, the gate oxide film 108, and the field oxide film 121. A source contact 115-1 and a drain contact 115-2 are formed in contact holes in the interlayer insulating film 114. The source contact 115-1 and the drain contact 115-2 have ohmic contacts with the source-side and the drain-side first heavily doped $N^+$ diffusion layers 106-1 and 106-2, respectively. Also, a source wiring layer 116-1 and a drain wiring layer 116-2 are formed on the interlayer insulating film 114. The source wiring layer 116-1 and the drain wiring layer 116-2 are electrically connected to the source-side and the drain-side first heavily doped $N^+$ diffusion layers 106-1 and 106-2 through the source contact 115-1 and the drain contact 115-2, respectively.

A channel length Lch is defined by the distance between the inner edges of the source-side and the drain-side first lightly doped N⁻ diffusion layers 104-2 and 104-3. In other words, it is defined by the width of the second portion 102-2 of the silicon dioxide film pattern 102' shown in FIG. 22A. Also, the horizontal position of the channel region is self-aligned with the horizontal position of the second portion 102-2 of the silicon dioxide film pattern 102' shown in FIG. 22A.

A dimension L1 of the source-side first lightly doped N⁻ diffusion layer 104-2 in a horizontal direction is defined by the width of an opening formed between the first portion 102-1 and the second portion 102-2 of the silicon dioxide film pattern 102' shown in FIG. 22A (i.e., the distance between the first portion 102-1 and the second portion 102-2 of the silicon dioxide film pattern 102'). Also, the horizontal position of the source-side first lightly doped N⁻ diffusion layer 104-2 is self-aligned with the horizontal position of the opening formed between the first portion 102-1 and the second portion 102-2 of the silicon dioxide film pattern 102' shown in FIG. 22A. Here, the dimension L1 corresponds to a source-side gate overlap amount, that is, the dimension of a source-side electric field reduction layer. Therefore, the dimension L1 is hereinafter called the source-side gate overlap amount L1, and it is defined by the width of the opening formed between the first portion 102-1 and the second portion 102-2 of the silicon dioxide film pattern 102' shown in FIG. 22A.

A dimension L2 of the drain-side first lightly doped N⁻ diffusion layer 104-3 in a horizontal direction is defined by the width of an opening formed between the third portion 102-3 and the second portion 102-2 of the silicon dioxide film pattern 102' shown in FIG. 22A (i.e., the distance between the third portion 102-3 and the second portion 102-2 of the silicon dioxide film pattern 102'). Also, the horizontal position of the drain-side first lightly doped N⁻ diffusion layer 104-3 is self-aligned with the horizontal position of the opening formed between the third portion 102-3 and the second portion 102-2 of the silicon dioxide film pattern 102' shown in FIG. 22A. Here, the dimension L2 corresponds to a drain-side gate overlap amount, that is, the dimension of a drain-side electric field reduction layer. Therefore, the dimension L2 is hereinafter called the drain-side gate overlap amount L2, and it is defined by the width of the opening formed between the third portion 102-3 and the second portion 102-2 of the silicon dioxide film pattern 102' shown in FIG. 22A.

A distance L3 between the source-side first heavily doped N⁺ diffusion layer 106-1 and the first edge 111-1 of the gate electrode 111 is defined by the width of the first portion 102-1 of the silicon dioxide film pattern 102' shown in FIG. 22A.

A distance L4 between the drain-side first heavily doped N⁺ diffusion layer 106-2 and the second edge 111-2 of the gate electrode 111 is defined by the width of the third portion 102-3 of the silicon dioxide film pattern 102' shown in FIG. 22A.

According to the present invention, the following are all defined by the single silicon dioxide film pattern 102' that is defined by a single lithography step: the channel length Lch, the source-side and the drain-side first lightly doped N⁻ diffusion layers 104-2 and 104-3, the source-side and the drain-side second lightly doped N⁻ diffusion layers 113-1 and 113-2, the horizontal position and the dimension of each of the source-side and the drain-side first heavily doped N⁺ diffusion layers 106-1 and 106-2, the horizontal position of each of the first edge 111-1 and the second edge 111-2 of the gate electrode 111, the source-side gate overlap amount L1, the drain-side gate overlap amount L2, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2. Therefore, the source-side and the drain-side first lightly doped N⁻ diffusion layers 104-2 and 104-3, the source-side and the drain-side second lightly doped N⁻ diffusion layers 113-1 and 113-2, the source-side and the drain-side first heavily doped N⁺ diffusion layers 106-1 and 106-2, and the gate electrode 111 are self-aligned with each other in a horizontal direction, and thus misalignment is not caused among them.

Also, the source-side gate overlap amount L1 and the drain-side gate overlap amount L2 are all defined by the single silicon dioxide film pattern 102' shown in FIG. 22A. Therefore, variation from a design value, which is originated from misalignment in a plurality of patterning steps, is not caused for the source-side gate overlap amount L1 and the drain-side gate overlap amount L2. That is to say, the source-side and the drain-side first lightly doped N⁻ diffusion layers 104-2 and 104-3 are overlapped with the gate electrode 111 in a self-alignment fashion.

Furthermore, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2 are all defined by the single silicon dioxide film pattern 102' as shown in FIG. 22A. Therefore, variation from a design value, which is originated from misalignment in a plurality of patterning steps, is not also caused for the distances L3 and L4.

Method for Manufacturing High Voltage MOS Transistor

With reference to attached figures, a method for manufacturing the high voltage MOS transistor in accordance with the second embodiment of the present invention is hereinafter explained.

FIGS. 21A to 34A are partial vertical cross-section diagrams showing a manufacturing process of the high voltage MOS transistor in accordance with the second embodiment of the present invention. Also, FIGS. 21B to 34B are plan views showing a manufacturing process of the high voltage MOS transistor in accordance with the second embodiment of the present invention.

Figure 21A:
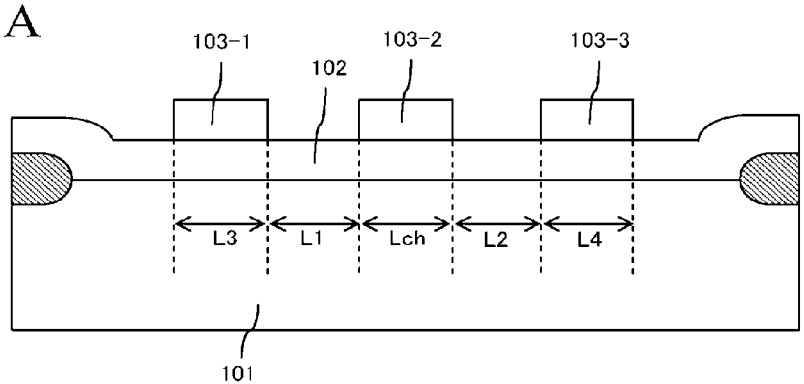
FIGS. 21A and 21B are a partial vertical cross-section diagram and a plan view showing a method for manufacturing a high voltage MOS transistor in accordance with the second embodiment of the present invention, respectively.
Figure 21B:
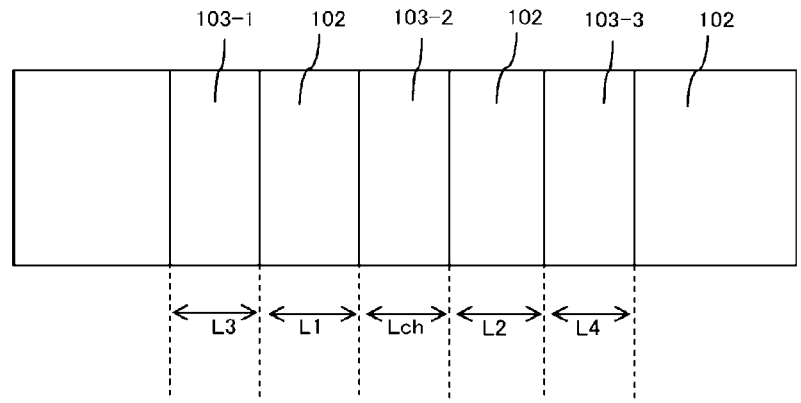

As shown in FIGS. 21A and 21B, a field oxide film 121 is formed in an element isolation region of a p-type single crystal silicon substrate 101 with a local oxidation of silicon (LOCOS) method, and an active region 1000 is defined by the field oxide film 121. The active region 1000 is the region to form a high voltage MOS transistor.

Then, as shown in FIGS. 21A and 21B, a silicon dioxide film 102 of 2500 Å in thickness is formed on the p-type single crystal silicon substrate 101 and the field oxide film 121 with a heretofore known method. As a typical example, a thermal oxidization method or various types of CVD methods can be used here.

As shown in FIGS. 21A and 21B, a resist pattern 103 is formed on the silicon dioxide film 102 with a heretofore known lithography technique. This resist pattern 103 is comprised of a first portion 103-1, a second portion 103-2, and a third portion 103-3. Here, the widths of the first portion 103-1, the second portion 103-2, and the third portion 103-3 are defined as L3, Lch, and L4, respectively. Also, the distance between the first portion 103-1 and the second portion 103-2 is defined as L1, and the distance between the second portion 103-2 and the third portion 103-3 is defined as L2. It should be understood that the term "width," "distance," "length," and "dimension" are used as units to express the value of Lch, L1, L2, L3, and L4 in the present application. Here, dimensions of Lch, L1, L2, L3, and L4 can be set to be equal (i.e., Lch=L1=L2=L3=L4). Also, dimensions L1 and L2 can be set to be equal (i.e., L1=L2) and dimensions L3 and L4 can be set to be equal (i.e., L3=L4).

As shown in FIGS. 22A and 22B, the silicon dioxide film 102 is etched by using the resist pattern 103 as a mask, and thus it is selectively eliminated. As a result, a silicon dioxide film pattern 102' is formed. This silicon dioxide film pattern 102' is comprised of a first portion 102-1, a second portion 102-2, and a third portion 102-3. Here, widths of the first portion 102-1, the second portion 102-2, and the third portion 102-3 are L3, Lch, and L4, respectively. Also, the distance between the first portion 102-1 and the second portion 102-2 and the distance between the second portion 102-2 and the third portion 102-3 are L1 and L2, respectively.

As shown in FIGS. 22A and 22B, the resist pattern 103 is eliminated with a heretofore known method, and thus the silicon dioxide film pattern 102' is exposed on the principal surface of the p-type single crystal silicon substrate 101. Here, the dimension Lch that is defined by the width of the second portion 102-2 of the silicon dioxide film pattern 102' corresponds to a design value of the channel length Lch. Also, the dimension L1 that is defined by the distance between the first portion 102-1 and the second portion 102-2 of the silicon dioxide film 102' corresponds to a dimension L1 of a source-side electric filed reduction layer formed in a later step. The dimension L2 that is defined by the distance between the second portion 102-2 and the third portion 102-3 of the silicon dioxide film 102' corresponds to a drain-side gate overlap amount L2, that is, a dimension L2 of a drain-side electric field reduction layer formed in a later step. The dimension L3 that is defined by the width of the first portion 102-1 of the silicon dioxide film pattern 102' corresponds to a distance L3 between a source-side edge of a gate electrode formed in a later step and a source-side first heavily doped diffusion layer formed in a later step. The dimension L4 that is defined by the width of the third portion 102-3 of the silicon dioxide film 102' corresponds to a distance L4 between a drain-side edge of a gate electrode formed in a later step and a drain-side first heavily doped diffusion layer formed in a later step.

Therefore, the dimension Lch may be set to be a desired channel length Lch of a transistor formed in a later step. Also, the dimension L1 may be set to be a desired source-side gate overlap amount L1 of a transistor formed in a later step. The dimension L2 may be set to be a desired drain-side gate overlap amount L2 of a transistor formed in a later step. The dimension L3 may be set to be a distance L3 between a source-side edge of a gate electrode formed in a later step and a source-side first heavily doped layer formed in a later step. The dimension L4 may be set to be a distance L4 between a drain-side edge of a gate electrode formed in a later step and a drain-side first heavily doped layer formed in a later step. These dimensions Lch, L1, L2, L3, and L4 can be arbitrarily set as long as the lithography resolution does not exceed its limits. Photolithography, x-ray lithography, and electron beam lithography can be suggested as examples of the lithography used here. However, these may be chosen according to a desired dimension, that is, a desired resolution limits. As a typical example, an i-ray exposure device can be used. In this case, the dimensions Lch, L1, L2, L3, and L4 may be set to be approximately 0.2 μm and more. As an example, the dimensions L1 and L2 are set to be approximately 0.2-1.0 μm. On the other hand, dimensions L3 and L4 may be approximately 0.4 μm in consideration of the alignment margin with a lithography conducted in a later step.

Figure 23A:
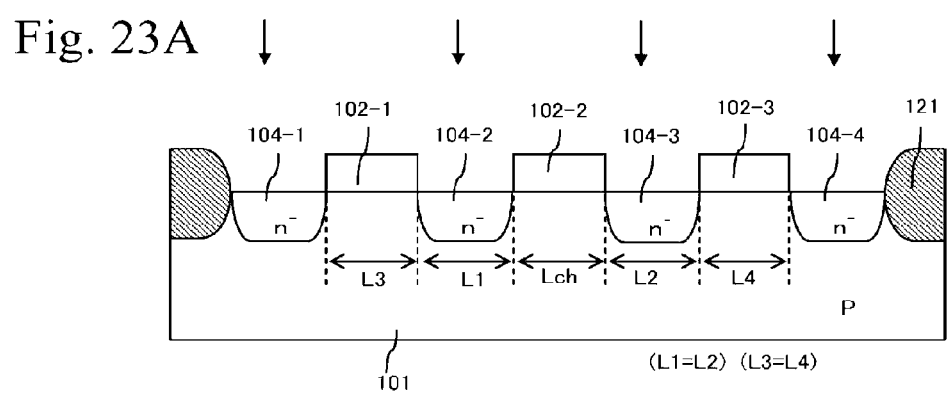
FIGS. 23A and 23B are a partial vertical cross-section diagram and a plan view showing a method for manufacturing a high voltage MOS transistor in accordance with the second embodiment of the present invention, respectively.
Figure 23B:
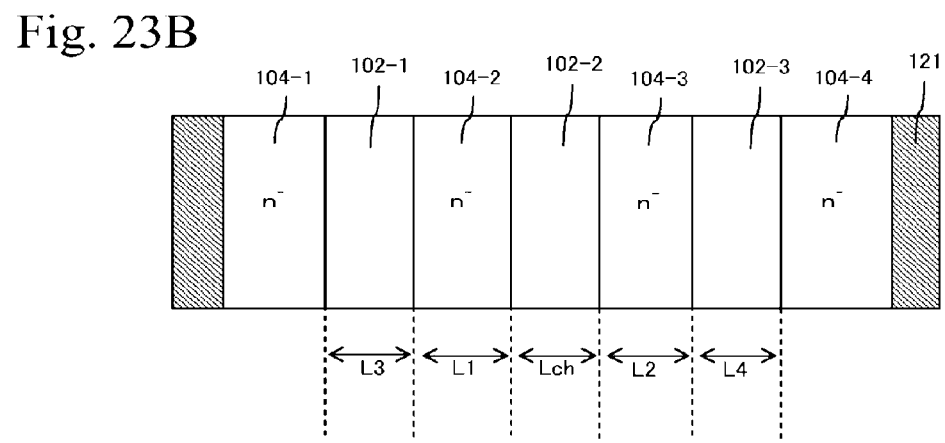

As shown in FIGS. 23A and 23B, the n-type impurity phosphorus (P) is selectively implanted into the principal surface of the p-type single crystal silicon substrate 101 in a vertical direction by using the silicon dioxide film pattern 102' as a mask with an acceleration energy of 80 keV and a dose amount of $3.0 \times 10^{12}$ cm$^{-2}$. Also, phosphorus ions do not penetrate the silicon dioxide film pattern 102' with this acceleration energy. Here, the term "a vertical direction" means a direction vertical to the substrate surface, that is, a direction vertical to a surface including both a direction in which a channel length of a transistor is defined and a direction in which a channel width is defined. As a result, first lightly doped N$^-$ diffusion layers 104-1, 104-2, 104-3, and 104-4 are selectively formed in upper regions of the p-type single crystal silicon substrate 101 located below the silicon dioxide film pattern 102'. The first lightly doped N$^-$ diffusion layers 104-1, 104-2, 104-3, and 104-4 are self-aligned with the silicon dioxide film pattern 102'. Here, the first lightly doped N$^-$ diffusion layers 104-2 and 104-3 function as electric field reduction layers.

The channel length Lch, which is defined between the first lightly doped N$^-$ diffusion layers 104-2 and 104-3 functioning as electric field reduction layers, is defined by the width of the second portion 102-2 of the silicon dioxide film pattern 102'. Also, the dimension L1 of the first lightly doped N$^-$ diffusion layer 104-2 functioning as a source-side electric field reduction layer is defined by the width L1 between the first portion 102-1 and the second portion 102-2 of the silicon dioxide film pattern 102'. The dimension L2 of the first lightly doped N$^-$ diffusion layer 104-3 functioning as a drain-side electric field reduction layer is defined by the width between the second portion 102-2 and the third portion 102-3 of the silicon dioxide film pattern 102'. Here, the width and the impurity concentration of the first lightly doped N$^-$ diffusion layers 104-1 to 104-4 can be arbitrarily set according to a voltage resistant specification of a device.

Figure 24A:
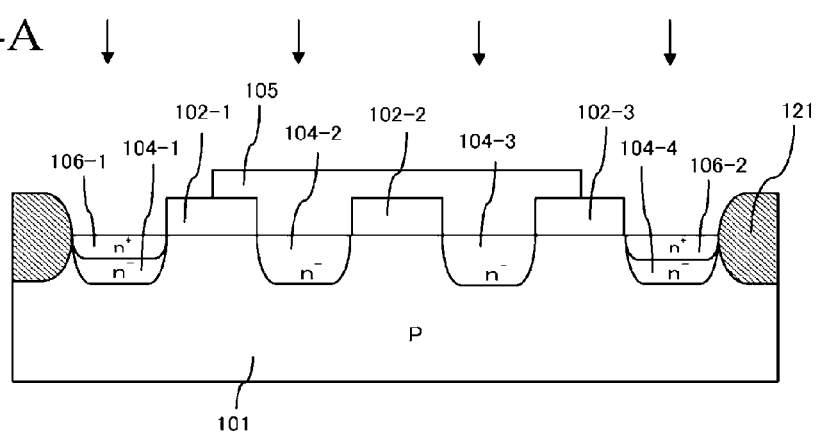
FIGS. 24A and 24B are a partial vertical cross-section diagram and a plan view showing a method for manufacturing a high voltage MOS transistor in accordance with the second embodiment of the present invention, respectively.
Figure 24B:
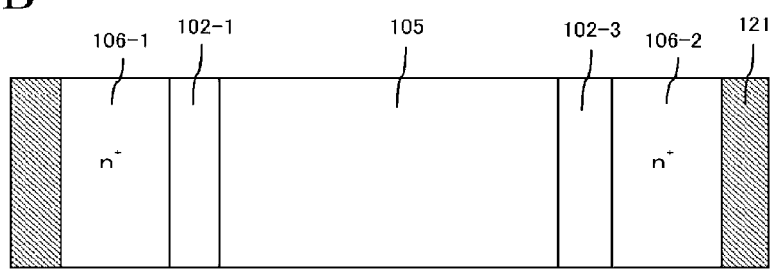

As shown in FIGS. 24A and 24B, a resist pattern 105 is formed on the second portion 102-2 of the silicon dioxide film pattern 102', the inner half portion of the first portion 102-1 of the silicon dioxide film pattern 102', the inner half portion of the third portion 102-3 of the silicon dioxide film pattern 102', the source-side first lightly doped N$^-$ diffusion layer 104-2, and the drain-side first lightly doped N$^-$ diffusion layer 104-3 with a heretofore known lithography technique. Here, it is necessary for a source-side edge of the resist pattern 105 to be located on the first portion 102-1 of the silicon dioxide film pattern 102'. On the other hand, it is necessary for a drain-side edge of the resist pattern 105 to be located on the third portion 102-3 of the silicon dioxide film pattern 102'. Therefore, an acceptable alignment error in the patterning of the resist is half of the dimensions L3 and L4, when the resist is patterned so that the source-side edge and the drain-side edge of the resist pattern 105 are located in the middle of the first portion 102-1 and the third portion 102-3 of the silicon dioxide film pattern 102', respectively.

Then, as shown in FIGS. 24A and 24B, the n-type impurity phosphorus (P) is selectively implanted into the principal surface of the p-type single crystal silicon substrate 101 in a vertical direction by using the resist pattern 105 and the first portion 102-1 and the third portion 102-3 of the silicon dioxide film pattern 102' as a mask with an acceleration energy of 40 keV and a dose amount of $4.0 \times 10^{15}$ cm$^{-2}$. As a result, a source-side first heavily doped N$^+$ diffusion layer 106-1 is selectively formed in an upper region of the source-side first lightly doped N$^-$ diffusion layer 104-1. On the other hand, a drain-side first heavily doped N$^+$ diffusion layer 106-2 is selectively formed in an upper region of the drain-side first lightly doped N$^-$ diffusion layer 104-4. The source-side first heavily doped N$^+$ diffusion layer 106-1 is formed to be self-aligned with an edge of the first portion 102-1 of the silicon dioxide film pattern 102'. On the other hand, the drain-side first heavily doped N+ diffusion layer 106-2 is formed to be self-aligned with an edge of the third portion 102-3 of the silicon dioxide film pattern 102'.

Figure 25A:
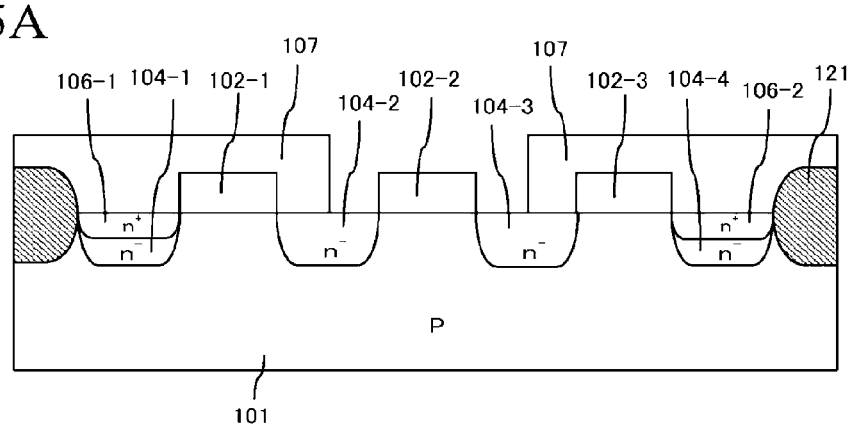
FIGS. 25A and 25B are a partial vertical cross-section diagram and a plan view showing a method for manufacturing a high voltage MOS transistor in accordance with the second embodiment of the present invention, respectively.
Figure 25B:
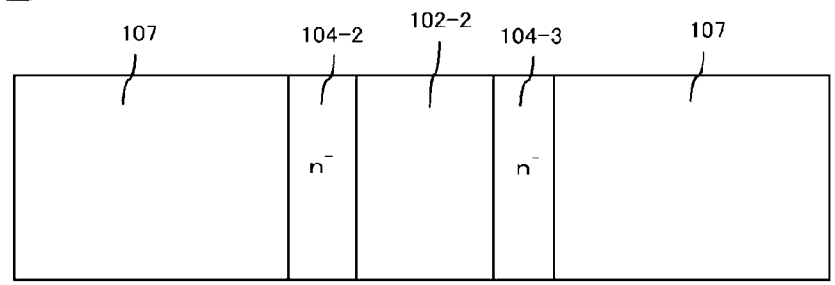

As shown in FIGS. 25A and 25B, the resist pattern 105 is eliminated with a heretofore known method.

Also, as shown in FIGS. 25A and 25B, a resist pattern 107 is formed on the first portion 102-1 and the third portion 102-3 of the silicon dioxide film pattern 102', the source-side and the drain-side first heavily doped N+ diffusion layers 106-1 and 106-2, and an outer side portion of the source-side and the drain-side first lightly doped N− diffusion layers 104-2 and 104-3 with a heretofore known lithography technique. Here, it is necessary for a source-side edge of the resist pattern 107 to be located on the source-side first lightly doped N− diffusion layer 104-2. On the other hand, it is necessary for a drain-side edge of the resist pattern 107 to be located on the drain-side first lightly doped N− diffusion layer 104-3. Therefore, an acceptable alignment error in the patterning of the resist is half of dimensions L1 and L2, when the resist is patterned so that the source-side edge and the drain-side edge of the resist pattern 107 are located in the middle of the source-side and the drain-side first lightly doped N− diffusion layers 104-2 and 104-3, respectively.

As shown in FIGS. 26A and 26B, the second portion 102-2 of the silicon dioxide film pattern 102' is eliminated with a heretofore known etching method by using the resist pattern 107 as a mask. More specifically, diluted hydrogen fluoride (HF) may be used as etching solution. It should be understood that as a heretofore known technique, a thin silicon dioxide film can be formed as a passivation film to protect a surface of the p-type single crystal silicon substrate 101 before the above described ion implantation step is conducted, although this is not shown in the figures.

Figure 27A:
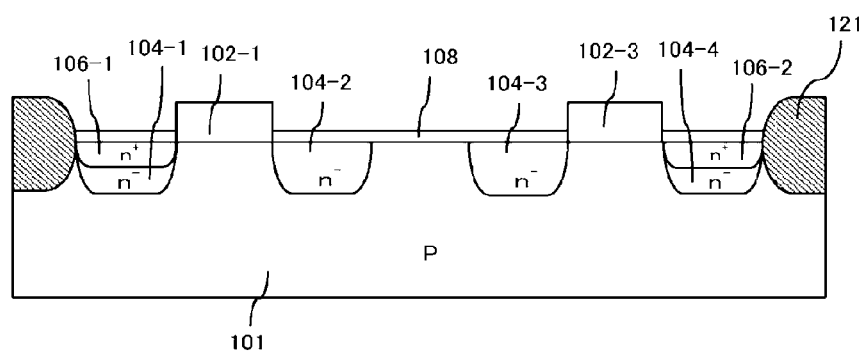
FIGS. 27A and 27B are a partial vertical cross-section diagram and a plan view showing a method for manufacturing a high voltage MOS transistor in accordance with the second embodiment of the present invention, respectively.
Figure 27B:
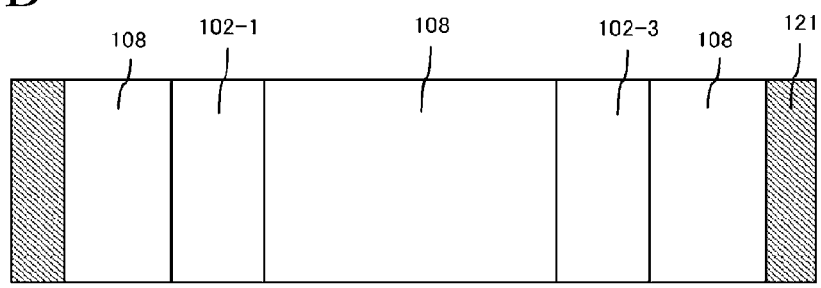
Figure 28A:
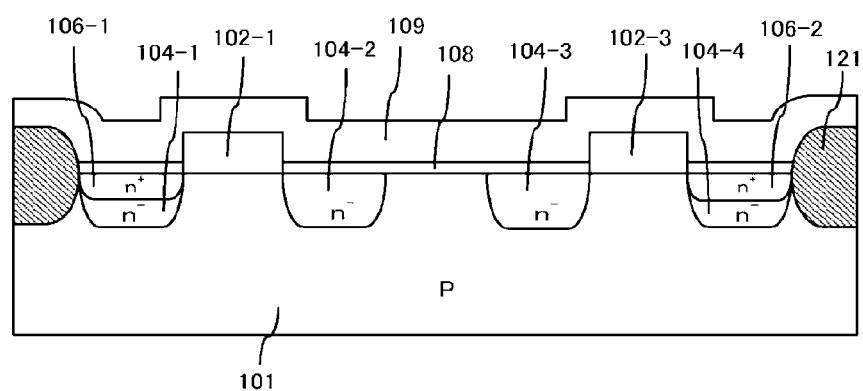
FIGS. 28A and 28B are a partial vertical cross-section diagram and a plan view showing a method for manufacturing a high voltage MOS transistor in accordance with the second embodiment of the present invention, respectively.
Figure 28B:
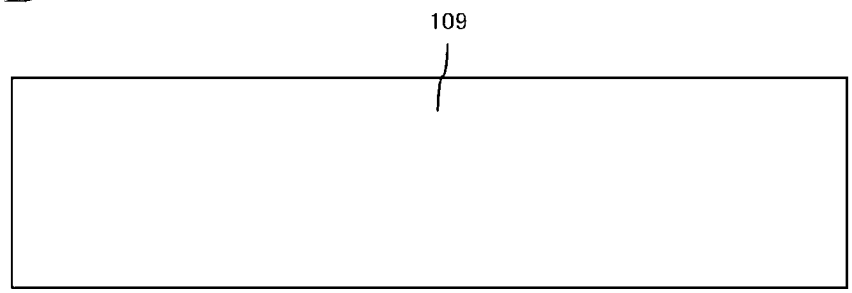

As shown in FIGS. 27A and 27B, the resist pattern 107 is eliminated with a heretofore known method.

Also, as shown FIGS. 27A and 27B, a gate oxide film 108 of 1000 Å in thickness is formed on the p-type single crystal silicon substrate 101, more specifically, on the source-side first lightly doped N− diffusion layer 104-2, the drain-side first lightly doped N− diffusion layer 104-3, the channel region of the p-type single crystal silicon substrate 101 defined between the source-side first lightly doped N− diffusion layer 104-2 and the drain-side first lightly doped N− diffusion layer 104-3, the source-side first heavily doped N+diffusion layer 106-1, and the drain-side first heavily doped N+ diffusion layer 106-2 with a heretofore known method.

As shown in FIGS. 14A and 14B, a polysilicon film 109 of 2000 Å in thickness is formed on the gate oxide film 108, the field oxide film 121, and the remaining first portion 102-1 and the third portion 102-3 of the silicon dioxide film pattern 102'. For example, a CVD method can be used for this forming step of the polysilicon film 109.

Figure 29A:
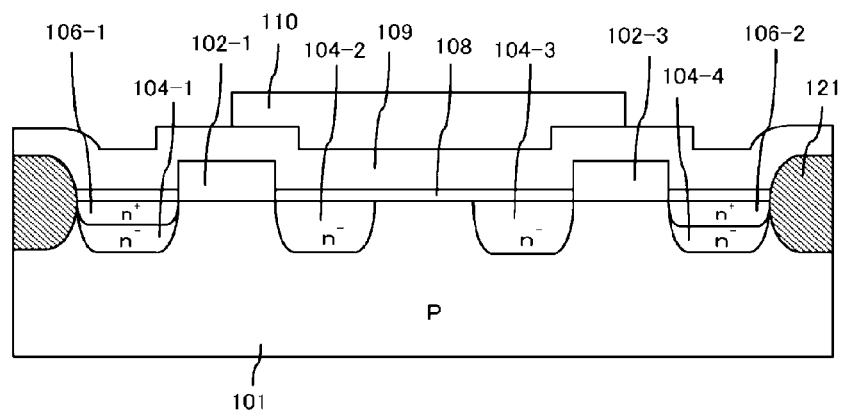
FIGS. 29A and 29B are a partial vertical cross-section diagram and a plan view showing a method for manufacturing a high voltage MOS transistor in accordance with the second embodiment of the present invention, respectively.
Figure 29B:
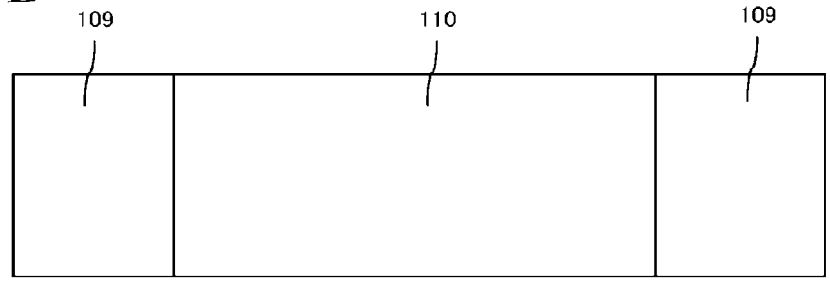

As shown in FIGS. 29A and 29B, a resist pattern 110 is formed on the polysilicon film 109 with a heretofore known lithography technique. Here, it is necessary for a source-side edge of the resist pattern 110 to be located above the first portion 102-1 of the silicon oxide film pattern 102'. On the other hand, it is necessary for a drain-side edge of the resist pattern 110 to be located above the third portion 102-3 of the silicon oxide film pattern 102'. Therefore, an acceptable alignment error in the patterning of the resist is half of the dimensions L3 and L4, when the resist is patterned so that the source-side edge and the drain-side edge of the resist pattern 110 are located above the middle of the first portion 102-1 and the third portion 102-3 of the silicon dioxide film pattern 102', respectively.

Figure 30A:
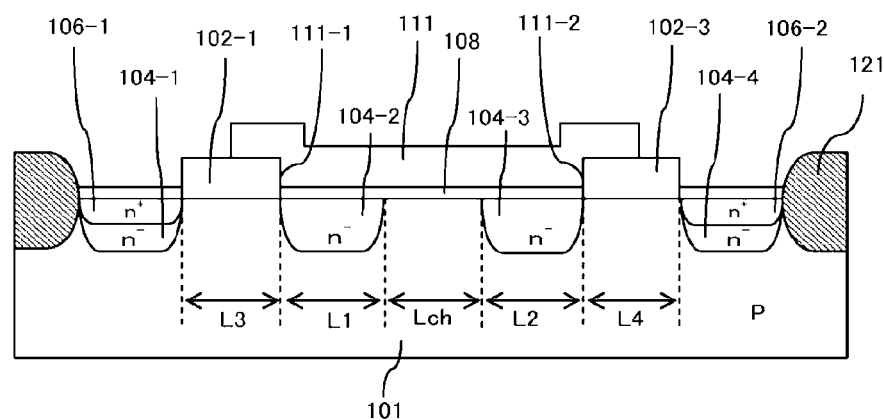
FIGS. 30A and 30B are a partial vertical cross-section diagram and a plan view showing a method for manufacturing a high voltage MOS transistor in accordance with the second embodiment of the present invention, respectively.
Figure 30B:
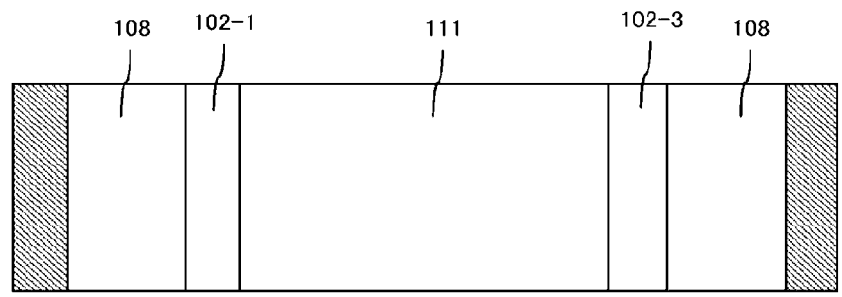

As shown in FIGS. 30A and 30B, the polysilicon film 109 is selectively etched by using the resist pattern 110 as a mask, and the resist pattern 110 is eliminated. As a result, a gate electrode 111 comprised of a polysilicon film is selectively formed on the gate oxide film 108, and an inner half portion of the first portion 102-1 and an inner half portion of the third portion 102-3 of the silicon oxide film pattern 102'. Also, the gate electrode 111 is formed directly above the gate oxide film 108, and it is comprised of a functional portion that applies an electric field on an upper region of the p-type single crystal silicon substrate 101 including the channel region, and nonfunctional portions that are formed on the first portion 102-1 and the third portion 102-3 of the silicon oxide film pattern 102'. Edges of the polysilicon film comprising the gate electrode 111 are located on the first portion 102-1 and the third portion 102-3 of the silicon dioxide film pattern 102'. However, the above described functional portion actually functions as a gate. Therefore, a first edge 111-1 and a second edge 111-2, which are defined by the inner edge of the first portion 102-1 and the inner edge of the third portion 102-3 of the silicon dioxide film pattern 102', respectively, are hereinafter defined as the edges of the gate electrode 111.

Because of this, a gate overlap amount L1 between the source-side first lightly doped N− diffusion layer 104-2 functioning as an electric field reduction layer and the gate electrode 111 is defined by the width L1 between the above described first portion 102-1 and the second portion 102-2 (eliminated in a step shown in FIGS. 26A and 26B) of the silicon dioxide film pattern 102'. Also, the source-side first lightly doped N− diffusion layer 104-2 functioning as an electric field reduction layer is self-aligned with the first edge 111-1 of the gate electrode 111. In the same way, a gate overlap amount L2 between the drain-side first lightly doped N− diffusion layer 104-3 functioning as an electric field reduction layer and the gate electrode 111 is defined by the width L2 between the above described third portion 102-3 and the second portion 102-2 (eliminated in a step shown in FIGS. 26A and 26B) of the silicon dioxide film pattern 102'. Also, the drain-side first lightly doped N− diffusion layer 104-3 functioning as an electric field reduction layer is self-aligned with the second edge 111-2 of the gate electrode 111.

Figure 31A:
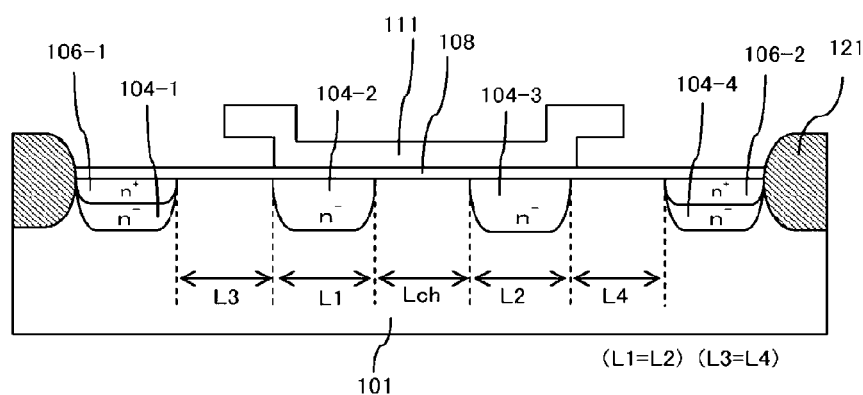
FIGS. 31A and 31B are a partial vertical cross-section diagram and a plan view showing a method for manufacturing a high voltage MOS transistor in accordance with the second embodiment of the present invention, respectively.
Figure 31B:
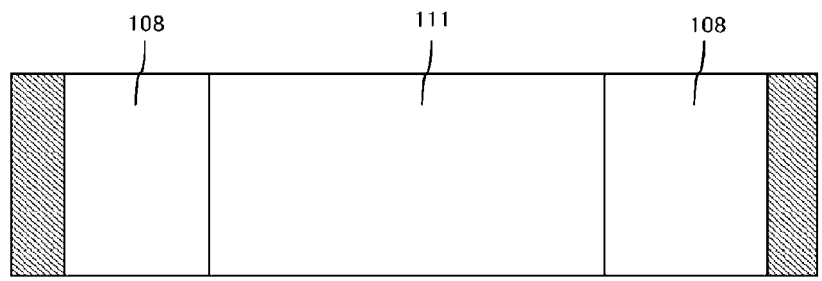

As shown in FIGS. 31A and 31B, the remained first portion 102-1 and the third portion 102-3 of the silicon dioxide film pattern 102' are eliminated with a heretofore known method. For example, diluted hydrogen fluoride (HF) can be used for this step. Because of this step, the nonfunctional portions of the gate electrode 111 are separated from and located above the gate oxide film 108 through a prescribed distance.

Figure 32A:
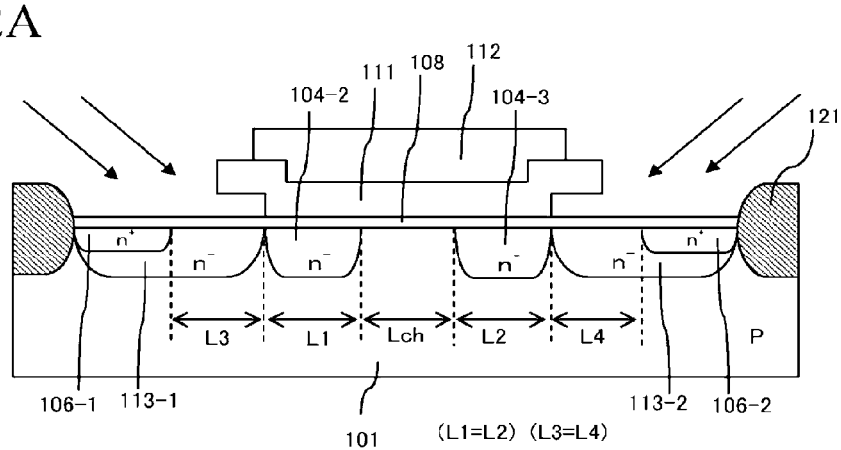
FIGS. 32A and 32B are a partial vertical cross-section diagram and a plan view showing a method for manufacturing a high voltage MOS transistor in accordance with the second embodiment of the present invention, respectively.
Figure 32B:
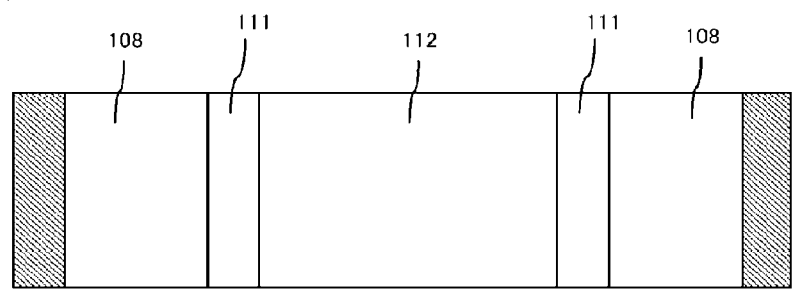

As shown in FIGS. 32A and 32B, a resist pattern 112 is formed on the gate electrode 111 with a heretofore known lithography technique. The resist pattern 112 is required to be formed to cover the functional portion of the gate electrode 111 formed on the gate oxide film 108 at least. Here, a source-side edge of the resist pattern 112 is required to be located on the portion of the gate electrode 111 between the source-side edge of the gate electrode 111 and the first edge 111-1 of the gate electrode 111. On the other hand, a drain-side edge of the resist pattern 112 is required to be located on the portion of the gate electrode 111 between the drain-side edge of the gate electrode 111 and the second edge 111-2 of the gate electrode 111. Because of this structure, the functional portions of the gate electrode 111 formed on the gate oxide film 108 are completely covered with the resist pattern 112.

Then, as shown in FIGS. 32A and 32B, the n-type impurity phosphorus (P) is selectively implanted into the principal surface of the p-type single crystal silicon substrate 101 through the gate oxide film 108 in an oblique direction by using the resist pattern 112 and source-side and drain-side edge neighborhood regions of the gate electrode 111 as a mask while the p-type single crystal silicon substrate 101 is being rotated around a vertical axis. As a result, a source-side second lightly doped $N^-$ diffusion layer 113-1 and a drain-side second lightly doped $N^-$ diffusion layer 113-2 are formed in an upper region of the p-type single crystal silicon substrate 101. More specifically, the source-side second lightly doped $N^-$ diffusion layer 113-1 is formed in a region including the region immediately below the first portion 102-1 of the silicon oxide film pattern 102' eliminated in the step shown in FIGS. 31A and 31B and the source-side first lightly doped $N^-$ diffusion layer 104-1. On the other hand, the drain-side second lightly doped $N^-$ diffusion layer 113-2 is formed in a region including the region immediately below the third portion 102-3 of the silicon oxide film pattern 102' eliminated in the step shown in FIGS. 31A and 31B and the drain-side first lightly doped $N^-$ diffusion layer 104-4.

The ion implantation is required to be conducted at angles (i.e., directions) along (i) a line formed by connecting a lower edge portion of the nonfunctional portion of the gate electrode 111 formed on the first portion 102-1 of the silicon dioxide film pattern 102' eliminated in the step shown in FIGS. 31A and 31B and an inner lower edge portion of the first portion 102-1 of the silicon dioxide film pattern 102' eliminated in the step shown in FIGS. 31A and 31B (i.e., a lower edge of the first edge 111-1 of the gate electrode 111), and (ii) a line formed by connecting a lower edge portion of the nonfunctional portion of the gate electrode 111 formed on the third portion 102-3 of the silicon dioxide film pattern 102' eliminated in the step shown in FIGS. 31A and 31B and an inner lower edge portion of the third portion 102-3 of the silicon dioxide film pattern 102' eliminated in the step shown in FIGS. 31A and 31B (i.e., a lower edge of the second edge 111-2 of the gate electrode 111). Also, the ion implantation is required to be conducted so that ions can penetrate the gate oxide film 108, and the penetrated ions can reach an outer edge portion of the source-side first lightly doped $N^-$ diffusion layer 104-2 and an outer edge portion of the drain-side first lightly doped $N^-$ diffusion layer 104-3. If these conditions are met, the source-side second lightly doped $N^-$ diffusion layer 113-1 adjacent to the outer side of the source-side first lightly doped $N^-$ diffusion layer 104-2 and the drain-side second lightly doped $N^-$ diffusion layer 113-2 adjacent to the outer side of the drain-side first lightly doped $N^-$ diffusion layer 104-3 can be formed.

For example, an ion implantation step in an oblique direction can be conducted at an angle of 45 degrees (i.e., arctangent (0.5/2/0.25)=45 degrees) with an acceleration energy of 40 keV and a dose amount of $3.0 \times 10^{13}$ cm$^{-2}$ in which ions can penetrate the gate oxide film 108, when the first portion 102-1 and the third portion 102-3 of the silicon dioxide film pattern 102' are formed to have a thicknesses of 0.25 µm and a width of 0.5 µm, respectively, and the edges of the nonfunctional portions of the gate electrode 111 formed on the first portion 102-1 and the third portion 102-3 of the silicon dioxide film pattern 102' eliminated in the step shown in FIGS. 31A and 31B are located on the middle of the first portion 102-1 and the third portion 102-3 of the silicon dioxide film pattern 102' eliminated in the step shown in FIGS. 31A and 31B, respectively. Here, the ion implantation can is highly controllable, because the first portion 102-1 and the third portion 102-3 of the silicon dioxide film pattern 102' has already been eliminated and the portions of the gate oxide film 108 formed under the eliminated first portion 102-1 and the eliminated third portion 102-3 of the silicon dioxide film pattern 102' has been almost eliminated. Also, as a heretofore known technique, it should be understood that a thin silicon dioxide film can be formed as a passivation film to protect the surface of the p-type single crystal silicon substrate before the above described ion implantation, although this step is not shown in the figures.

Figure 33A:
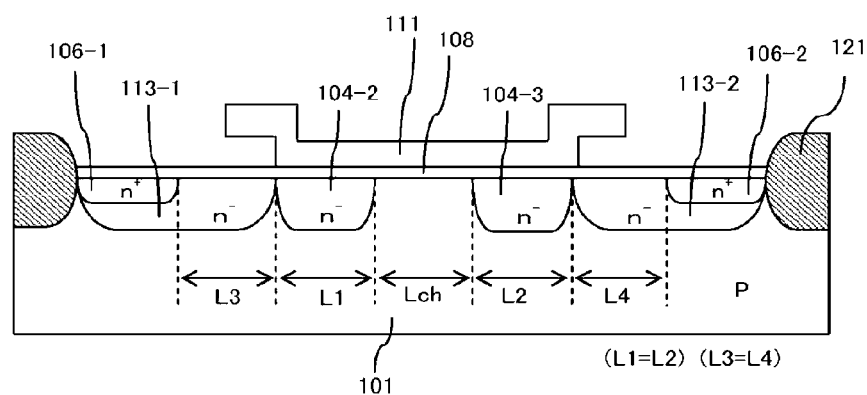
FIGS. 33A and 33B are a partial vertical cross-section diagram and a plan view showing a method for manufacturing a high voltage MOS transistor in accordance with the second embodiment of the present invention, respectively.
Figure 33B:
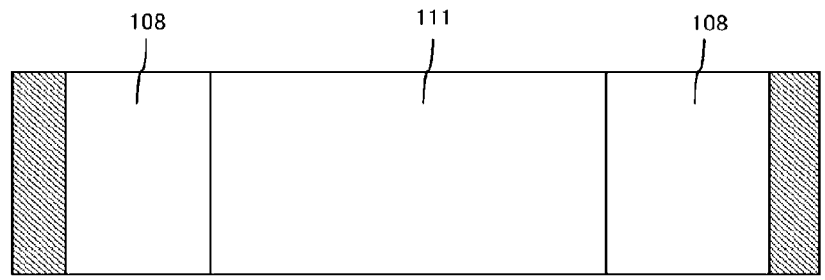

As shown in FIGS. 33A and 33B, the resist pattern 112 is eliminated with a heretofore known method.

Figure 34B:
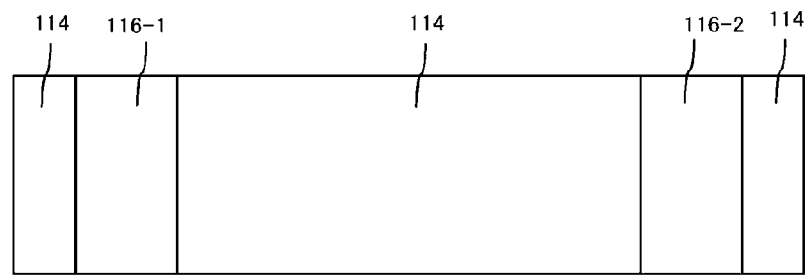

As shown in FIGS. 34A and 34B, an interlayer insulating film 114 is formed to cover the gate electrode 111, the gate oxide film 108, and the field oxide film 121 with a heretofore known method. It has been well known to those skilled in the art that a low pressure CVD method is effective to fill the space between the nonfunctional portion of the gate electrode 111 and the gate oxide film 108 without creating a void. Next, a contact hole is formed in the interlayer insulating film 114 and the gate oxide film 108. Then, a source contact 115-1 and a drain contact 115-2 are formed in the contact holes, respectively, and thus they have ohmic contacts with the source-side and the drain-side first heavily doped $N^+$ diffusion layers 106-1 and 106-2, respectively. Next, a source wiring layer 116-1 and a drain wiring layer 116-2 are formed on the interlayer insulating film 114 with a heretofore known method, and thus they are electrically connected to the source-side and the drain-side first heavily doped $N^+$ diffusion layers 106-1 and 106-2 through the source contact 115-1 and the drain contact 115-2, respectively.

According to the present invention, the following are all defined by the single silicon dioxide film pattern 102' defined by a single lithography step: the channel length Lch, the horizontal positions and dimensions of the source-side and the drain-side first lightly doped $N^-$ diffusion layers 104-2 and 104-3, the source-side and the drain-side second lightly doped $N^-$ diffusion layers 113-1 and 113-2, and the source-side and the drain-side first heavily doped $N^+$ diffusion layers 106-1 and 106-2, the horizontal position of the first edge 111-1 and the second edge 111-2 of the gate electrode 111, the source-side gate overlap amount L1, the drain-side gate overlap amount L2, the distance L3 between the first edge 111-1 of the gate electrode 111 and the source-side first heavily doped $N^+$ diffusion layer 106-1, and the distance L4 between the second edge 111-2 of the gate electrode 111 and the drain-side first heavily doped $N^+$ diffusion layer 106-2. Therefore, the source-side and the drain-side first lightly doped $N^-$ diffusion layers 104-2 and 104-3, the source-side and the drain-side second lightly doped $N^-$ diffusion layers 113-1 and 113-2, the source-side and the drain-side first heavily doped $N^+$ diffusion layers 106-1 and 106-2, and the gate electrode 111 are self-aligned with each other in a horizontal direction, and misalignment is not caused among them.

Also, the source-side gate overlap amount L1 and the drain-side gate overlap amount L2 are all defined by the single silicon dioxide film pattern 102'. Therefore, variation from a design value, which is originated from misalignments in a plurality of patterning steps, is not caused with respect to the source-side gate overlap amount L1 and the drain-side gate overlap amount L2. That is to say, the source-side first lightly doped $N^-$ diffusion layer 104-2 and the drain-side first lightly doped $N^-$ diffusion layer 104-3 are overlapped with the gate electrode 111 in a self-alignment fashion.

The distance L3 between the first edge 111-1 of the gate electrode 111 and the source-side first heavily doped $N^-$ diffusion layer 106-1, and the distance L4 between the second edge 111-2 of the gate electrode 111 and the drain-side first heavily doped N⁺ diffusion layer 106-2 are all defined by the single silicon dioxide film pattern 102'. Therefore, variation from a design value, which is originated from misalignments in a plurality of patterning steps, is not caused with respect to the distances L3 and L4.

As a typical example, the silicon dioxide film pattern 102' may be defined so that Lch, L1, L2, L3, and L4 shown in FIGS. 22A and 22B can be set to be equal (i.e., Lch=L1=L2=L3=L4). In other words, the width Lch of the second portion 102-2 of the silicon dioxide film pattern 102', the width L1 between the first portion 102-1 and the second portion 102-2 of the silicon dioxide film pattern 102', the width L2 between the second portion 102-2 and the third portion 102-3 of the silicon dioxide film pattern 102', the width L3 of the first portion 102-1 of the silicon dioxide film pattern 102', and the width L4 of the third portion 102-3 of the silicon dioxide film pattern 102' may be set to be the same value. In this case, the source-side first lightly doped N⁻ diffusion layer 104-2 and the drain-side first lightly doped N⁻ diffusion layer 104-3, which function as electric field reduction layers, are overlapped with the gate electrode 111 in a self-alignment fashion. Also, the source-side first heavily doped N⁺ diffusion layer 106-1 and the drain-side first heavily doped N⁺ diffusion layer 106-2 are offset from the gate electrode 111 in a self-alignment fashion. In other words, variation from an design value, which is originated from misalignment in a plurality of patterning steps, is not caused with respect to the channel length Lch, the source-side gate overlap amount L1, the drain-side gate overlap amount L2, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2. In addition, the source-side and the drain-side first lightly doped N⁻ diffusion layers 104-2 and 104-3, which function as electric field reduction layers, and the source-side and the drain-side first heavily doped N⁺ diffusion layers 106-1 and 106-2 are symmetrical to the gate electrode 111 in a horizontal direction.

Also, the silicon dioxide film pattern 102' may be set so that L1 and L2 shown in FIGS. 22A and 22B are set to be equal (i.e., L1=L2) and L3 and L4 are set to be equal (i.e., L3=L4). In other words, the width L1 between the first portion 102-1 and the second portion 102-2 of the silicon dioxide film pattern 102', and the width L2 between the second portion 102-2 and the third portion 102-3 of the silicon dioxide film pattern 102' may be set to be the same value, and the width L3 of the first portion 102-1 of the silicon dioxide film pattern 102' and the width L4 of the third portion 102-3 of the silicon dioxide film pattern 102' may be set to be the same value. In this case, the source-side and the drain-side first lightly doped N⁻ diffusion layers 104-2 and 104-3 are overlapped with the gate electrode 111 in a self-alignment fashion. Also, the source-side and the drain-side first heavily doped N⁺ diffusion layers 106-1 and 106-2 are offset from the gate electrode 111 in a self-alignment fashion. In other words, variation from a design value, which is originated form misalignments in a plurality of patterning steps, is not caused with respect to the channel length Lch, the source-side gate overlap amount L1, the drain-side gate overlap amount L2, the distance L3 between the first edge 111-1 of the gate electrode 111 and the source-side heavily doped N⁺ diffusion layer 106-1, and the distance L4 between the second edge 111-2 of the gate electrode 111 and the drain-side first heavily doped N⁺ diffusion layer 106-2. In addition, the source-side and the drain-side first lightly doped N⁻ diffusion layers 104-2 and 104-3, which function as electric field reduction layers, and the source-side and the drain-side first heavily doped N⁺ diffusion layers 106-1 and 106-2 are symmetrical to the gate electrode 111 in a horizontal direction.

Also, the silicon dioxide film pattern 102' may be set so that the dimensions L1 and L2 shown in FIGS. 22A and 22B are set so that they are not equal to each other (L1≠L2) and the dimensions L3 and L4 are set so that they are not equal to each other (L3≠L4). In other words, the width L1 between the first portion 102-1 and the second portion 102-2 of the silicon dioxide film pattern 102' and the width L2 between the second portion 102-2 and the third portion 102-3 of the silicon dioxide film pattern 102' may be set so that they are not equal to each other, and the width L3 of the first portion 102-1 of the silicon dioxide film pattern 102' and the third portion 102-3 of the silicon dioxide film pattern 102' may be set so that they are not equal to each other. In this case, the source-side and the drain-side first lightly doped N⁻ diffusion layers 104-2 and 104-3, which function as electric field reduction layers, are overlapped with the gate electrode 111 in a self-alignment fashion. Also, the source-side and the drain-side first highly doped N⁺ diffusion layers 106-1 and 106-2 are offset from the gate electrode 111 in a self-alignment fashion. In other words, variation form a design value, which is originated from misalignments in a plurality of patterning steps, is not caused with respect to the channel length Lch, the source-side gate overlap amount L1, the drain-side gate overlap amount L2, the distance L3 between the first edge 111-1 of the gate electrode 111 and the source-side first heavily doped N⁺ diffusion layer 106-1, and the distance L4 between the second edge 111-2 of the gate electrode 111 and the drain-side first heavily doped N⁺ diffusion layer 106-2. In addition, the source-side and the drain-side first lightly-doped N⁻ diffusion layers 104-2 and 104-3, which function as electric-field reduction layers, and the source-side and the drain-side heavily doped N⁺ diffusion layers 106-1 and 106-2 are asymmetrical to the gate electrode 111 in a horizontal direction.

Therefore, variation from a design value, which is originated from misalignments in a plurality of patterning steps, is not caused with respect to the channel length Lch, the source-side gate overlap amount L1, the drain-side gate overlap amount L2, the distance L3 between the first edge 111-1 of the gate electrode 111 and the source-side first heavily doped N⁻ diffusion layer 106-1, and the distance L4 between the second edge 111-2 of the gate electrode 111 and the drain-side first heavily doped N⁺ diffusion layer 106-2. This is because they are defined by a single lithography step in which the silicon dioxide film pattern 102 is defined.

Consequently, the second embodiment of the present invention has the following effects. First, a misalignment is not caused between the patterning to form the source-side and the drain-side first lightly doped N⁻ diffusion layers 104-2 and 104-3, and the patterning to form the gate electrode 111. Because of this, variation from a design is not caused with respect to the source-side overlap dimension L1 between the source-side first lightly doped N⁻ diffusion layer 104-2 functioning as an electric field reduction layer and the gate electrode 111. Furthermore, variation from a design value is not caused with respect to the drain-side gate overlap dimension L2 between the drain-side first lightly doped N⁻ diffusion layer 104-3 functioning as an electric field reduction layer and the gate electrode 111. In other words, the source-side and the drain-side overlap dimensions L1 and L2 are not varied, and thus device properties are not varied.

Second, the source-side and the drain-side gate overlap amounts L1 and L2 are equal in the gate overlap structure formed in a self-alignment fashion in accordance with the present invention. Because of this, the symmetrical gate overlap structure in a horizontal position can be formed based on the gate electrode 111 and the channel region. On the other hand, misalignment of a gate overlap amount can be caused in a gate overlap structure formed in a non-alignment fashion. This allows the gate overlap structure to be asymmetrically formed in a horizontal position based on a channel region. As a result, device properties can be varied. Therefore, according to the second embodiment of the present invention, misalignment of the gate overlap amount is not caused because the gate overlap structure is formed in a self-alignment fashion. Because of this, the gate overlap structure formed in a self-alignment fashion is symmetrically formed in a horizontal position based on the gate electrode 111 and the channel region. As a result, variation of device properties can be reduced, and furthermore, the defect rate can be improved.

Third, the source-side gate overlap amount L1 between the source-side first lightly doped $N^-$ diffusion layer 104-2 and the gate electrode 111, and the drain-side gate overlap amount L2 between the drain-side first lightly doped $N^-$ diffusion layer 104-3 and the gate electrode 111 can be defined without any regard for the alignment margin between the patterning to form the source-side and the drain-side first lightly doped $N^-$ diffusion layers 104-2 and 104-3 functioning as electric field reduction layers and the patterning to form the gate electrode 111. When a gate overlap structure is formed in a non-self-alignment fashion, a design value must be set to be the dimension derived by adding the above described alignment margin between those patternings to the originally necessary gate overlap dimensions L1 and L2. On the other hand, when a gate overlap structure is formed in a self-alignment fashion, the above described alignment margin between those patternings is not needed and thus a design value may be set to be the originally necessary gate overlap dimensions L1 and L2 as they are. Consequently, current drive capability of a high voltage MOS transistor can be improved and thus devices can be miniaturized.

Fourth, the distance L3 between the first edge 111-1 of the gate electrode 111 and the source-side first heavily doped $N^+$ diffusion layer 106-1, and the distance L4 between the second edge 111-2 of the gate electrode 111 and the drain-side first heavily doped $N^+$ diffusion layer 106-2 can be defined without any regard for the patterning to form the source-side first heavily doped $N^+$ diffusion layer 106-1 and the drain-side first heavily doped $N^+$ diffusion layer 106-2 and the patterning to form the gate electrode 111, because the source-side and the drain-side first heavily doped $N^+$ diffusion layers 106-1 and 106-2 are self-aligned with the gate electrode 111. As a result, device properties can be miniaturized.

Fifth, the source-side and the drain-side first heavily doped $N^+$ diffusion layers 106-1 and 106-2 can be symmetrically formed with respect to the gate electrode 111 in a horizontal position when they are formed to be self-aligned with the gate electrode 111. On the other hand, the source-side and the drain-side first heavily doped $N^+$ diffusion layers 106-1 and 106-2 can be asymmetrically formed with respect to the gate electrode 111 in a horizontal position when they are formed to be not self-aligned with the gate electrode 111. As a result, device properties can be varied. However, according to the second embodiment of the present invention, the source-side and the drain-side first heavily doped $N^+$ diffusion layers 106-1 and 106-2 can be symmetrically formed with respect to the gate electrode 111 in a horizontal position, because they are formed to be self-aligned with the gate electrode 111. As a result, variation of device properties can be reduced. Furthermore, the defect rate can be greatly improved.

Sixth, as described above, the first portion 102-1 and the third portion 102-3 of the silicon dioxide film pattern 102' are eliminated after the gate electrode 111 is formed as explained with reference to FIGS. 30A and 30B, and before the ion implantation in a oblique direction is conducted as explained with reference to FIGS. 32A and 32B. Because of this, the first portion 102-1 and the third portion 102-3 of the silicon dioxide film pattern 102' has been completely eliminated when the step of ion implantation in an oblique direction is conducted, and furthermore the portions of the gate oxide film 108 formed under the first portion 102-1 and the third portion 102-3 of the silicon dioxide film pattern 102' has been almost eliminated. Therefore, the ion implantation is highly controllable. Also, it should be understood that a thin silicon dioxide film can be formed as a passivation film to protect the surface of the p-type single silicon substrate 101 before the above described ion implantation step is conducted as a heretofore known technique, although this is not shown in the figures.

Third Embodiment

According to the third embodiment of the present invention, a high voltage MOS transistor is provided, which has a lightly doped diffusion layer that overlaps with a gate electrode in a self-alignment fashion and functions as an electric field reduction layer. Also, according to the third embodiment of the present invention, a method for manufacturing the above described high voltage MOS transistor is provided.

High Voltage MOS Transistor Structure

Figure 46A:
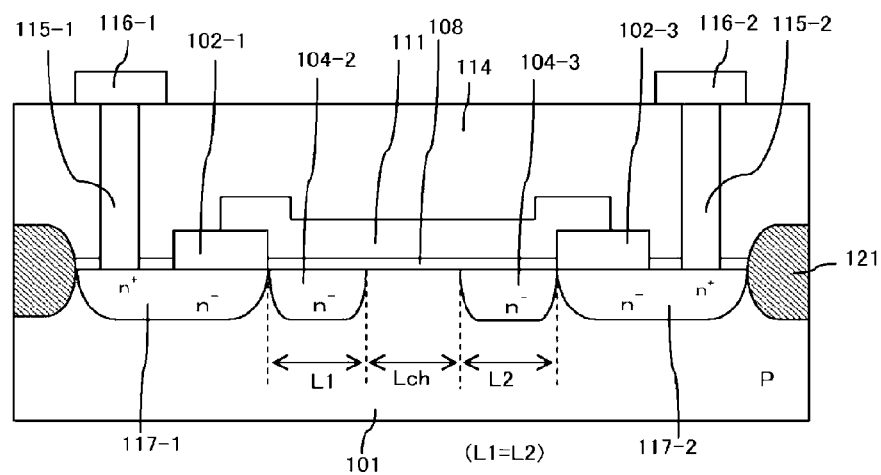
FIGS. 46A and 46B are a partial vertical cross-section diagram and a plan view showing a method for manufacturing a high voltage MOS transistor in accordance with the third embodiment of the present invention, respectively.

FIG. 46A is a partial vertical cross-section diagram that shows the structure of a high voltage MOS transistor in accordance with the third embodiment of the present invention.

The high voltage MOS transistor according to the third embodiment of the present invention has the following structure. The principal surface of a p-type single crystal silicon substrate 101 includes an element isolation region comprised of a field oxide film 121 and an active region defined by the field oxide film 121. Source-side and drain-side first lightly doped $N^-$ diffusion layers 104-2 and 104-3, which are separated through a channel, and source-side and drain-side third n-type impurity concentration diffusion layers 117-1 and 117-2, which are located adjacent to the outer side of the source-side and the drain-side first lightly doped $N^-$ diffusion layers 104-2 and 104-3 respectively, are formed in the active region of the p-type single crystal silicon substrate 101. Here, the outer side of the source-side and the drain-side first lightly doped $N^-$ diffusion layers 104-2 and 104-3 means the regions between these layers and field oxide films 121. On the other hand, the inner side of the source-side and the drain-side first lightly doped $N^-$ diffusion layers 104-2 and 104-3 means the region located between them. These definitions are applied to other portions of the semiconductor device in accordance with the present invention. Each of the third n-type impurity doped diffusion layers 117-1 and 117-2 has the impurity concentration profile that impurities are heavily doped in their outer regions compared to their inner regions.

Figure 36A:
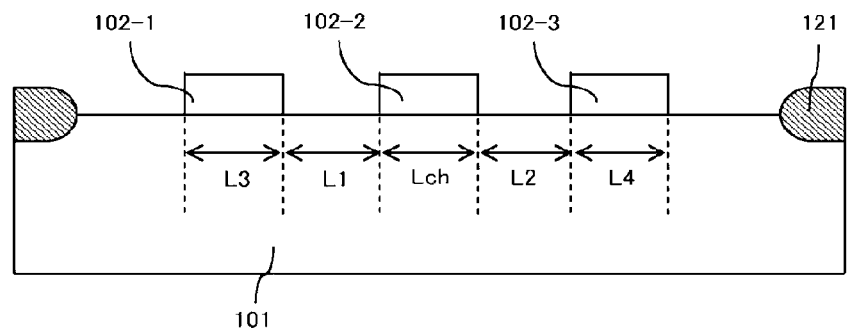
FIGS. 36A and 36B are a partial vertical cross-section diagram and a plan view showing a method for manufacturing a high voltage MOS transistor in accordance with the third embodiment of the present invention, respectively.
Figure 36B:
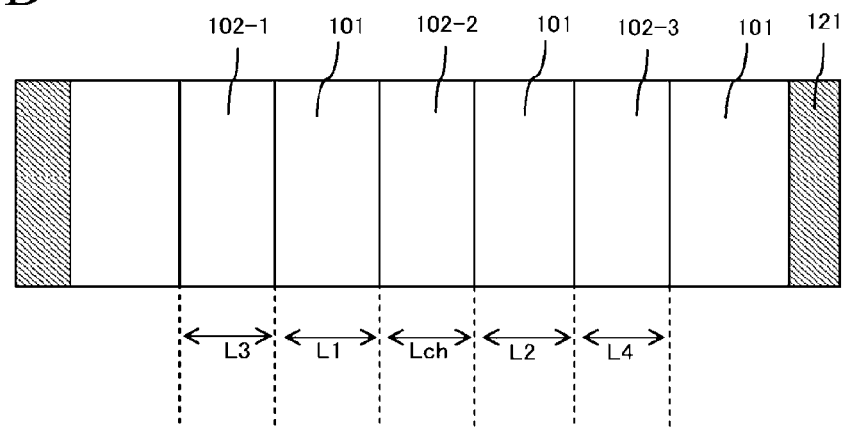
Figure 39A:
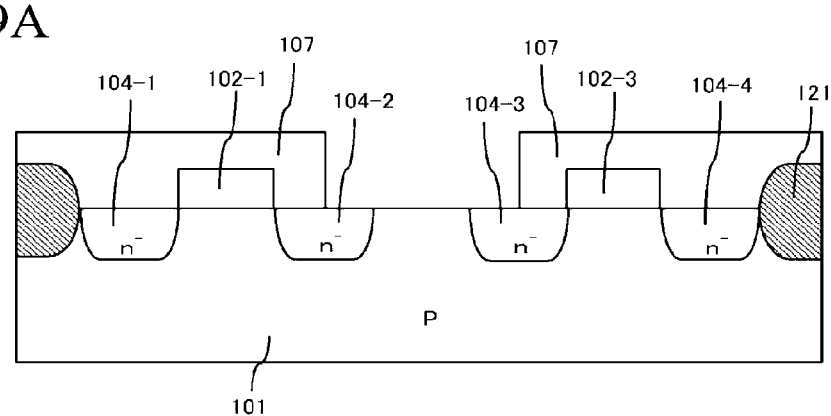
FIGS. 39A and 39B are a partial vertical cross-section diagram and a plan view showing a method for manufacturing a high voltage MOS transistor in accordance with the third embodiment of the present invention, respectively.
Figure 39B:
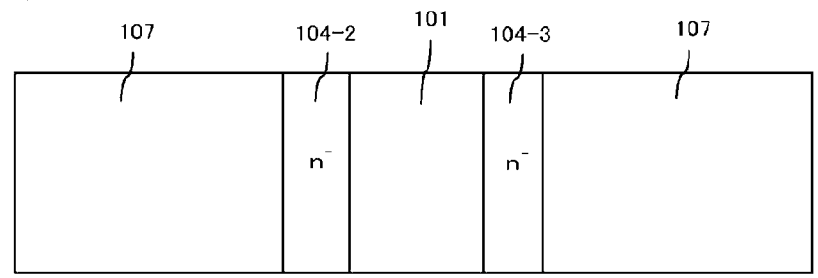

A gate oxide film 108 is formed on the principal surface of the p-type single crystal silicon substrate 101. More specifically, the gate oxide film 108 is formed on a channel region of the p-type single crystal silicon substrate 101, the source-side and the drain-side first lightly doped $N^-$ diffusion layers 104-2 and 104-3, and the source-side and the drain-side third n-type impurity doped diffusion layers. Also, a first portion 102-1 and a third portion 102-3 of a silicon dioxide film pattern 102' remain on the source-side and the drain-side third n-type impurity doped diffusion layers 117-1 and 117-2, respectively. A second portion 102-2 of a silicon dioxide film pattern 102' shown in FIGS. 36A and 36B is eliminated in a step of a manufacturing process of a semiconductor device in accordance with the third embodiment as shown in FIGS. 39A and 39B. Therefore, it does not exist in a finished high voltage MOS transistor.

A gate electrode 111 comprised of a polysilicon film is selectively formed on the gate oxide film 108, and the inner half portions of the first portion 102-1 and the third portion 102-3 of the silicon dioxide film pattern 102'. Also, the gate electrode 111 is located immediately above the gate oxide film 108, and it is comprised of a functional portion that applies an electric field on an upper region of the p-type single crystal silicon substrate 101 including a channel region, and nonfunctional portions that are formed on the first portion 102-1 and the third portion 102-3 of the silicon dioxide film pattern 102'. Edges of the polysilicon film comprising the gate electrode 111 are located on the first portion 102-1 and the third portion 102-3 of the silicon dioxide film pattern 102'. However, the above described functional portion of the gate electrode 111 actually functions as a gate. Therefore, the gate edges of the gate electrode 111 are hereinafter defined as a first edge 111-1 and a second edge 111-2 of the gate electrode 111 that are defined by inner edges of the first portion 102-1 and the third portion 102-3 of the silicon dioxide film pattern 102', respectively.

An interlayer insulating film 114 is formed on the gate electrode 111, a portion of the first portion 102-1 of the silicon dioxide film pattern 102', a portion of the third portion 102-3 of the silicon dioxide film pattern 102', and the gate oxide film 108. A source contact 115-1 and a drain contact 115-2 are formed in contact holes in the interlayer insulating film 114. The source contact 115-1 and the drain contact 115-2 have ohmic contacts with the source-side and the drain-side third n-type impurity doped diffusion layers 117-1 and 117-2, respectively. Also, a source wiring layer 116-1 and a drain wiring layer 116-2 are formed on the interlayer insulating film 114. The source wiring layer 116-1 and the drain wiring layer 116-2 are electrically connected to the heavily doped regions of the source-side and the drain-side third n-type impurity doped diffusion layers 117-1 and 117-2 through the source contact 115-1 and the drain contact 115-2, respectively.

A channel length Lch is defined by the distance between the inner edges of the source-side and the drain-side first lightly doped N⁻ diffusion layers 104-2 and 104-3. In other words, it is defined by the width of the second portion 102-2 of the silicon dioxide film pattern 102'. Also, the horizontal position of the channel region is self-aligned with the horizontal position of the second portion 102-2 of the silicon dioxide film pattern 102'.

A dimension L1 of the source-side first lightly doped N⁻ diffusion layer 104-2 in a horizontal direction is defined by the width of an opening formed between the first portion 102-1 and the second portion 102-2 of the silicon dioxide film pattern 102' shown in FIG. 36A (i.e., the distance between the first portion 102-1 and the second portion 102-2 of the silicon dioxide film pattern 102'). Also, the horizontal position of the source-side first lightly doped N⁻ diffusion layer 104-2 is self-aligned with the horizontal position of the opening formed between the first portion 102-1 and the second portion 102-2 of the silicon dioxide film pattern 102' shown in FIG. 36A. Here, the dimension L1 corresponds to a source-side gate overlap amount, that is, the dimension of a source-side electric field reduction layer. Therefore, the dimension L1 is hereinafter called the source-side gate overlap amount L1, and it is defined by the width of the opening formed between the first portion 102-1 and the second portion 102-2 of the silicon dioxide film pattern 102' shown in FIG. 36A.

A dimension L2 of the drain-side first lightly doped N⁻ diffusion layer 104-3 in a horizontal direction is defined by the width of an opening formed between the third portion 102-3 and the second portion 102-2 of the silicon dioxide film pattern 102' shown in FIG. 36A (i.e., the distance between the third portion 102-3 and the second portion 102-2 of the silicon dioxide film pattern 102'). Also, the horizontal position of the drain-side first lightly doped N⁻ diffusion layer 104-3 is self-aligned with the horizontal position of the opening formed between the third portion 102-3 and the second portion 102-2 of the silicon dioxide film pattern 102' shown in FIG. 36A. Here, the dimension L2 corresponds to a drain-side gate overlap amount, that is, the dimension of a drain-side electric field reduction layer. Therefore, the dimension L2 is hereinafter called the drain-side gate overlap amount L2, and it is defined by the width of the opening formed between the third portion 102-3 and the second portion 102-2 of the silicon dioxide film pattern 102' shown in FIG. 36A.

According to the present invention, the following are all defined by the single silicon dioxide film pattern 102' that is defined by a single lithography step: the channel length Lch, the horizontal position and dimension of the source-side and the drain-side first lightly doped N⁻ diffusion layers 104-2 and 104-3, the horizontal position of each of the first edge 111-1 and the second edge 111-2 of the gate electrode 111, the source-side gate overlap amount L1, and the drain-side gate overlap amount L2. Therefore, the source-side and the drain-side first lightly doped N⁻ diffusion layers 104-2 and 104-3, the source-side and the drain-side third n-type impurity doped diffusion layers 117-1 and 117-2, and the gate electrode 111 are self-aligned with each other in a horizontal direction, and thus misalignment is not caused among them.

Also, the source-side gate overlap amount L1 and the drain-side gate overlap amount L2 are all defined by the single silicon dioxide film pattern 102' shown in FIG. 36A. Therefore, variation from a design value, which is originated from misalignment in a plurality of patterning steps, is not caused for the source-side gate overlap amount L1 and the drain-side gate overlap amount L2. That is to say, the source-side and the drain-side first lightly doped N⁻ diffusion layers 104-2 and 104-3 are overlapped with the gate electrode 111 in a self-alignment fashion.

Method for Manufacturing High Voltage MOS Transistor

With reference to attached figures, a method for manufacturing the high voltage MOS transistor in accordance with the third embodiment of the present invention is hereinafter explained.

FIGS. 35A to 46A are partial vertical cross-section diagrams showing a manufacturing process of the high voltage MOS transistor in accordance with the third embodiment of the present invention. Also, FIGS. 35B to 46B are plan views showing a manufacturing process of the high voltage MOS transistor in accordance with the third embodiment of the present invention.

Figure 35A:
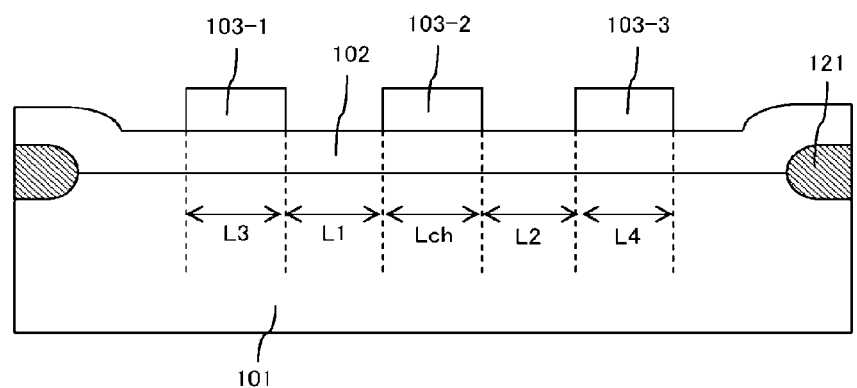
FIGS. 35A and 35B are a partial vertical cross-section diagram and a plan view showing a method for manufacturing a high voltage MOS transistor in accordance with the third embodiment of the present invention, respectively.
Figure 35B:
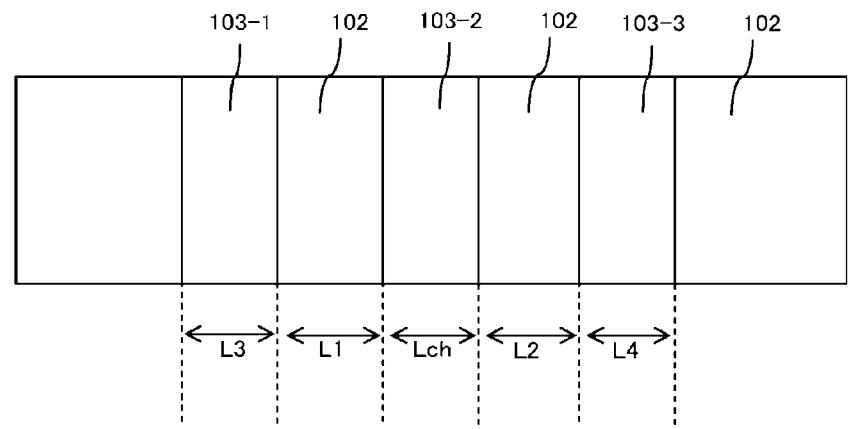

As shown in FIGS. 35A and 35B, a field oxide film 121 is formed in an element isolation region of a p-type single crystal silicon substrate 101 with a local oxidation of silicon (LOCOS) method, and an active region 1000 is defined by the field oxide film 121. The active region 1000 is the region to form a high voltage MOS transistor.

Then, a silicon dioxide film 102 of 2500 Å in thickness is formed on the p-type single crystal silicon substrate 101 and the field oxide film 121 with a heretofore known method. As a typical example, a thermal oxidization method or various types of CVD methods can be used here.

Next, a resist pattern 103 is formed on the silicon dioxide film 102 with a heretofore known lithography technique. This resist pattern 103 is comprised of a first portion 103-1, a second portion 103-2, and a third portion 103-3. Here, the widths of the first portion 103-1, the second portion 103-2, and the third portion 103-3 are defined as L3, Lch, and L4, respectively. Also, the distance between the first portion 103-1 and the second portion 103-2 is defined as L1, and the distance between the second portion 103-2 and the third portion 103-3 is defined as L2. It should be understood that the term "width," "distance," "length," and "dimension" are used as units to express the value of Lch, L1, L2, L3, and L4 in the present application. Here, dimensions of Lch, L1, L2, L3, and L4 can be set to be equal (i.e., Lch=L1=L2=L3=L4). Also, dimensions L1 and L2 can be set to be equal (i.e., L1=L2) and dimensions L3 and L4 can be set to be equal (i.e., L3=L4).

As shown in FIGS. 36A and 36B, the silicon dioxide film 102 is etched by using the resist pattern 103 as a mask, and thus it is selectively eliminated. As a result, a silicon dioxide film pattern 102' is formed. This silicon dioxide film pattern 102' is comprised of a first portion 102-1, a second portion 102-2, and a third portion 102-3. Here, widths of the first portion 102-1, the second portion 102-2, and the third portion 102-3 are L3, Lch, and L4, respectively. Also, the distance between the first portion 102-1 and the second portion 102-2 and the distance between the second portion 102-2 and the third portion 102-3 are L1 and L2, respectively.

Then, the resist pattern 103 is eliminated with a heretofore known method, and thus the silicon dioxide film pattern 102' is exposed on the principal surface of the p-type single crystal silicon substrate 101. Here, the dimension Lch that is defined by the width of the second portion 102-2 of the silicon dioxide film pattern 102' corresponds to a design value of the channel length Lch. Also, the dimension L1 that is defined by the distance between the first portion 102-1 and the second portion 102-2 of the silicon dioxide film 102' corresponds to a dimension L1 of a source-side electric filed reduction layer formed in a later step. The dimension L2 that is defined by the distance between the second portion 102-2 and the third portion 102-3 of the silicon dioxide film 102' corresponds to a drain-side gate overlap amount L2, that is, a dimension L2 of a drain-side electric field reduction layer formed in a later step.

Therefore, the dimension Lch may be set to be a desired channel length Lch of a transistor formed in a later step. Also, the dimension L1 may be set to be a desired source-side gate overlap amount L1 of a transistor. The dimension L2 may be set to be a desired drain-side gate overlap amount L2 of a transistor formed in a later step. These dimensions Lch, L1, L2, L3, and L4 can be arbitrarily set as long as the lithography resolution does not exceed its limits. Photolithography, x-ray lithography, and electron beam lithography can be suggested as examples of the lithography used here. However, these may be chosen according to a desired dimension, that is, a desired resolution limits. As a typical example, an i-ray exposure device can be used. In this case, the dimensions Lch, L1, L2, L3, and L4 may be set to be approximately 0.2 µm and more. As an example, the dimensions L1 and L2 are set to be approximately 0.2-1.0 µm. On the other hand, dimensions L3 and L4 may be approximately 0.4 µm in consideration of the alignment margin with a lithography conducted in a later step.

Figure 37A:
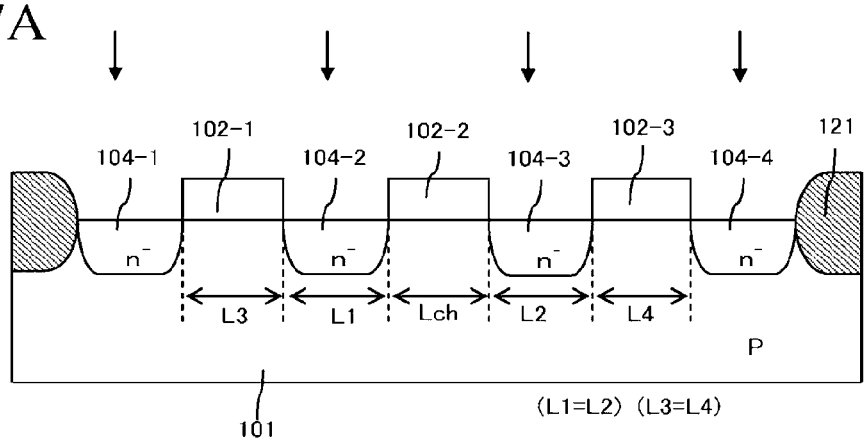
FIGS. 37A and 37B are a partial vertical cross-section diagram and a plan view showing a method for manufacturing a high voltage MOS transistor in accordance with the third embodiment of the present invention, respectively.
Figure 37B:
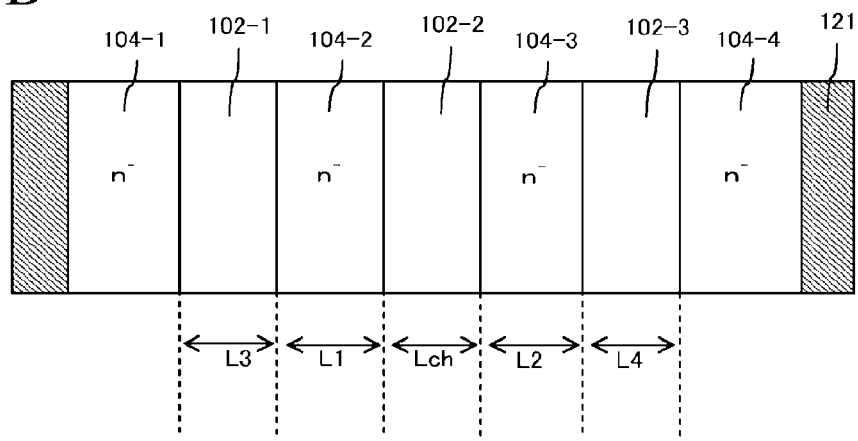

As shown in FIGS. 37A and 37B, the n-type impurity phosphorus (P) is selectively implanted into the principal surface of the p-type single crystal silicon substrate 101 in a vertical direction by using the silicon dioxide film pattern 102' as a mask with an acceleration energy of 80 keV and a dose amount of $3.0 \times 10^{12}$ cm$^{-2}$. Also, phosphorus ions do not penetrate the silicon dioxide film pattern 102' with this acceleration energy. Here, the term "a vertical direction" means a direction vertical to the substrate surface, that is, a direction vertical to a surface including both a direction in which a channel length of a transistor is defined and a direction in which a channel width is defined. As a result, first lightly doped N$^-$ diffusion layers 104-1, 104-2, 104-3, and 104-4 are selectively formed in upper regions of the p-type single crystal silicon substrate 101 located below the silicon dioxide film pattern 102'. The first lightly doped N$^-$ diffusion layers 104-1, 104-2, 104-3, and 104-4 are self-aligned with the silicon dioxide film pattern 102'. Here, the first lightly doped N$^-$ diffusion layers 104-2 and 104-3 function as electric field reduction layers.

The channel length Lch, which is defined between the first lightly doped N$^-$ diffusion layers 104-2 and 104-3 functioning as electric field reduction layers, is defined by the width of the second portion 102-2 of the silicon dioxide film pattern 102'. Also, the dimension L1 of the first lightly doped N$^-$ diffusion layer 104-2 functioning as a source-side electric field reduction layer is defined by the width L1 between the first portion 102-1 and the second portion 102-2 of the silicon dioxide film pattern 102'. The dimension L2 of the first lightly doped N$^-$ diffusion layer 104-3 functioning as a drain-side electric field reduction layer is defined by the width between the second portion 102-2 and the third portion 102-3 of the silicon dioxide film pattern 102'. Here, the width and the impurity concentration of the first lightly doped N$^-$ diffusion layers 104-1 to 104-4 can be arbitrarily set according to a voltage resistant specification of a device.

Figure 38A:
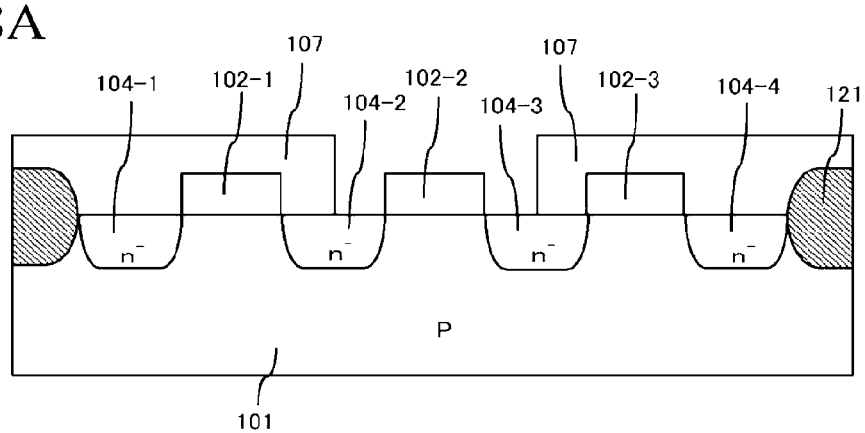
FIGS. 38A and 38B are a partial vertical cross-section diagram and a plan view showing a method for manufacturing a high voltage MOS transistor in accordance with the third embodiment of the present invention, respectively.
Figure 38B:
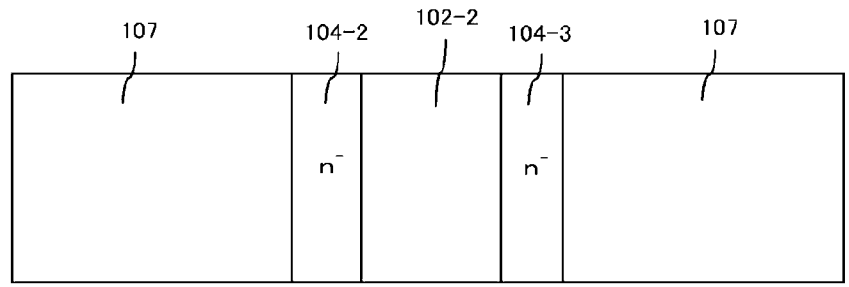

As shown in FIGS. 38A and 38B, a resist pattern 107 is formed on the field oxide film 121, the first portion 102-1 and the third portion 102-3 of the silicon dioxide film pattern 102', the source-side first lightly doped N$^-$ diffusion layer 104-1, the drain-side first lightly doped N$^-$ diffusion layer 104-4, the outer half region of the source-side first lightly doped N$^-$ diffusion layer 104-2, and the outer half region of the drain-side first lightly doped N$^-$ diffusion layer 104-3 with a heretofore known lithography technique. Here, it is necessary for a source-side edge of the resist pattern 107 to be located on the source-side first lightly doped N$^-$ diffusion layer 104-2. On the other hand, it is necessary for a drain-side edge of the resist pattern 107 to be located on the drain-side first lightly doped N$^-$ diffusion layer 104-3. Therefore, an acceptable alignment error in the patterning of the resist is half of the dimensions L1 and L2, when the resist is patterned so that the source-side edge and the drain-side edge of the resist pattern 107 are located in the middle of the source-side and the drain-side first lightly doped N$^-$ diffusion layers 104-2 and 104-3, respectively.

As shown in FIGS. 39A and 39B, the second portion 102-2 of the silicon dioxide film pattern 102' is eliminated by using the resist pattern 107 as a mask with a heretofore known etching method. More specifically, diluted hydrogen fluoride (HF) may be used as etching solution. It should be understood that as a heretofore known technique, a thin silicon dioxide film can be formed as a passivation film to protect a surface of the p-type single crystal silicon substrate 101 before the above described ion implantation step is conducted, although this is not shown in the figures.

Figure 40A:
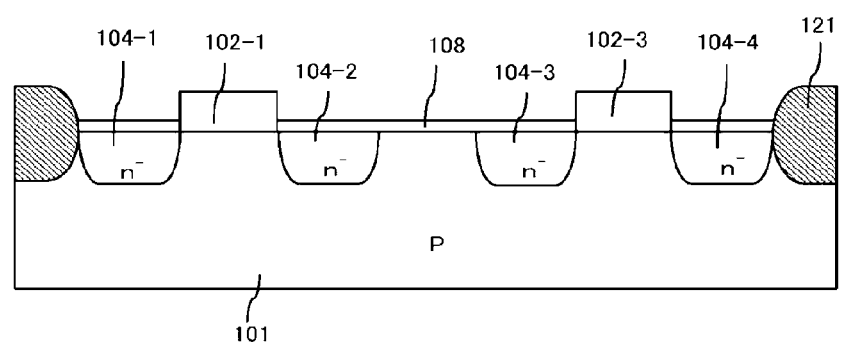
FIGS. 40A and 40B are a partial vertical cross-section diagram and a plan view showing a method for manufacturing a high voltage MOS transistor in accordance with the third embodiment of the present invention, respectively.
Figure 40B:
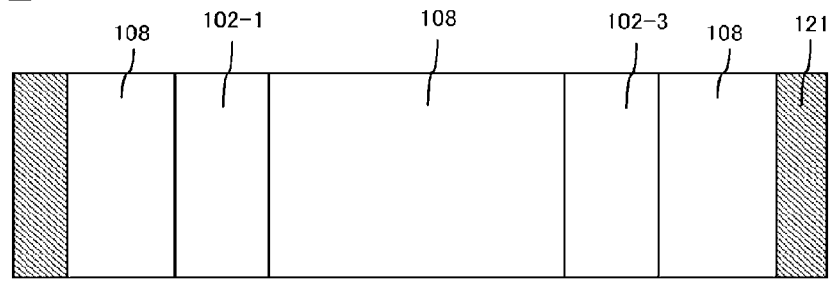

As shown in FIGS. 40A and 40B, the resist pattern 107 is eliminated with a heretofore known method. Then, a gate oxide film 108 of 1000 Å in thickness is formed on the p-type single crystal silicon substrate 101, more specifically, on the source-side first lightly doped N$^-$ diffusion layers 104-1 and 104-2, the drain-side first lightly doped N$^-$ diffusion layers 104-3 and 104-4, and the channel region of the p-type single crystal silicon substrate 101 defined between the source-side first lightly doped N⁻ diffusion layer 104-2 and the drain-side first lightly doped N⁻ diffusion layer 104-3 with a heretofore known method.

Figure 41A:
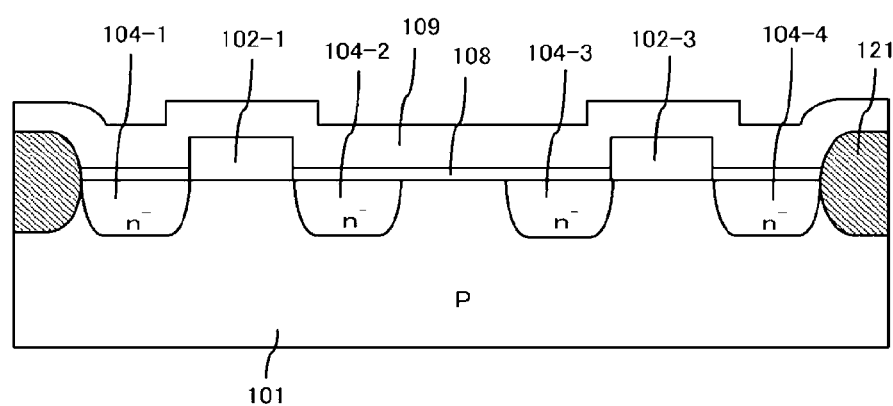
FIGS. 41A and 41B are a partial vertical cross-section diagram and a plan view showing a method for manufacturing a high voltage MOS transistor in accordance with the third embodiment of the present invention, respectively.
Figure 41B:
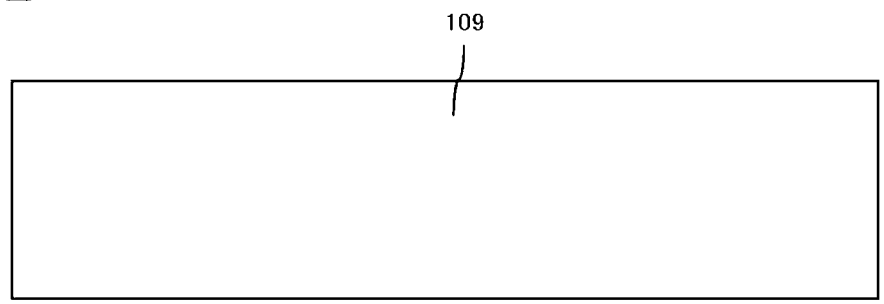

As shown in FIGS. 41A and 41B, a polysilicon film 109 of 2000 Å in thickness is formed on the gate oxide film 108, the field oxide film 121, and the remaining first portion 102-1 and the third portion 102-3 of the silicon oxide film pattern 102'. For example, a CVD method can be used for this forming step of the polysilicon film 109.

Figure 42A:
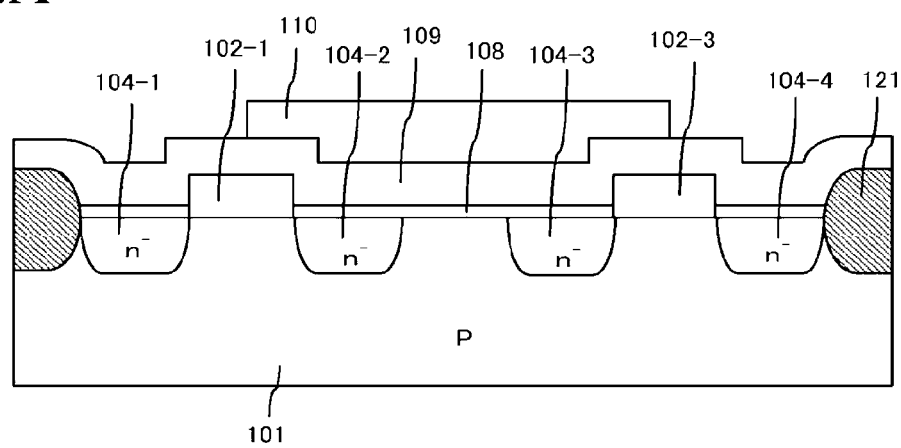
FIGS. 42A and 42B are a partial vertical cross-section diagram and a plan view showing a method for manufacturing a high voltage MOS transistor in accordance with the third embodiment of the present invention, respectively.
Figure 42B:
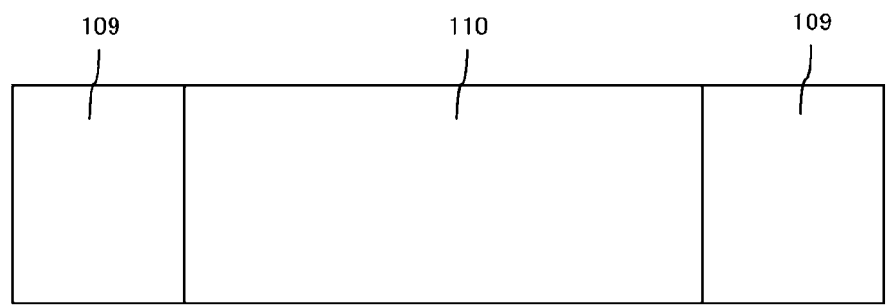

As shown in FIGS. 42A and 42B, a resist pattern 110 is formed on the polysilicon film 109 with a heretofore known lithography technique. Here, it is necessary for a source-side edge of the resist pattern 110 to be located above the first portion 102-1 of the silicon oxide film pattern 102'. On the other hand, it is necessary for a drain-side edge of the resist pattern 110 to be located above the third portion 102-3 of the silicon oxide film pattern 102'. Therefore, an acceptable alignment error in the patterning of the resist is half of the dimensions L3 and L4, when the resist is patterned so that the source-side edge and the drain-side edge of the resist pattern 110 are located above the middle of the first portion 102-1 and the third portion 102-3 of the silicon dioxide film pattern 102', respectively.

Figure 43A:
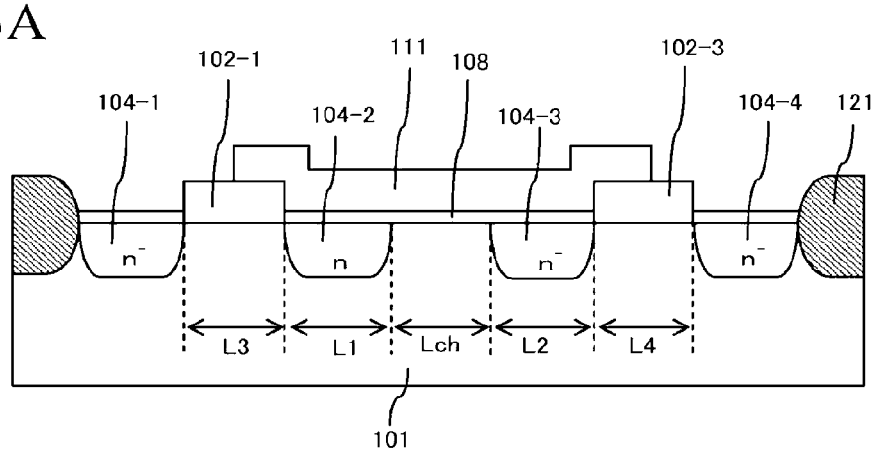
FIGS. 43A and 43B are a partial vertical cross-section diagram and a plan view showing a method for manufacturing a high voltage MOS transistor in accordance with the third embodiment of the present invention, respectively.
Figure 43B:
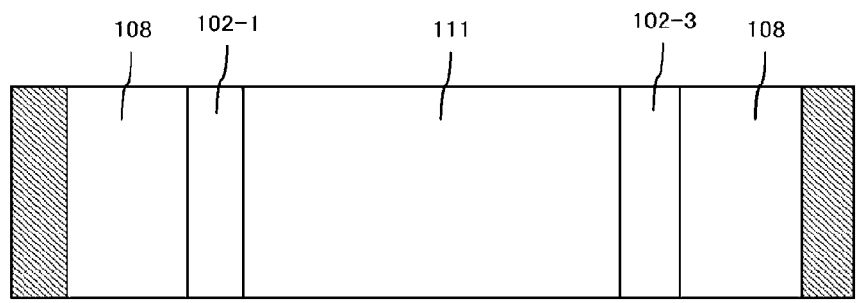

As shown in FIGS. 43A and 43B, the polysilicon film 109 is selectively etched by using the resist pattern 110 as a mask, and the resist pattern 110 is eliminated. As a result, a gate electrode 111 comprised of a polysilicon film is selectively formed on the gate oxide film 108, and an inner half portion of the first portion 102-1 and an inner half portion of the third portion 102-3 of the silicon oxide film pattern 102'. Also, the gate electrode 111 is formed directly above the gate oxide film 108, and it is comprised of a functional portion that applies an electric field on an upper region of the p-type single crystal silicon substrate 101 including the channel region, and nonfunctional portions that are formed on the first portion 102-1 and the third portion 102-3 of the silicon oxide film pattern 102'. Edges of the polysilicon film comprising the gate electrode 111 are located on the first portion 102-1 and the third portion 102-3 of the silicon dioxide film pattern 102'. However, the above described functional portion actually functions as a gate. Therefore, a first edge 111-1 and a second edge 111-2, which are defined by the inner edge of the first portion 102-1 and the inner edge of the third portion 102-3 of the silicon dioxide film pattern 102', respectively, are hereinafter defined as the edges of the gate electrode 111.

Because of this, a gate overlap amount L1 between the source-side first lightly doped N⁻ diffusion layer 104-2 functioning as an electric field reduction layer and the gate electrode 111 is defined by the width L1 between the above described first portion 102-1 and the second portion 102-2 (eliminated in a step shown in FIGS. 39A and 39B) of the silicon dioxide film pattern 102'. Also, the source-side first lightly doped N⁻ diffusion layer 104-2 functioning as an electric field reduction layer is self-aligned with the first edge 111-1 of the gate electrode 111. In the same way, a gate overlap amount L2 between the drain-side first lightly doped N⁻ diffusion layer 104-3 functioning as an electric field reduction layer and the gate electrode 111 is defined by the width L2 between the above described third portion 102-3 and the second portion 102-2 (eliminated in a step shown in FIGS. 39A and 39B) of the silicon dioxide film pattern 102'. Also, the drain-side first lightly doped N⁻ diffusion layer 104-3 functioning as an electric field reduction layer is self-aligned with the second edge 111-2 of the gate electrode 111.

Figure 44A:
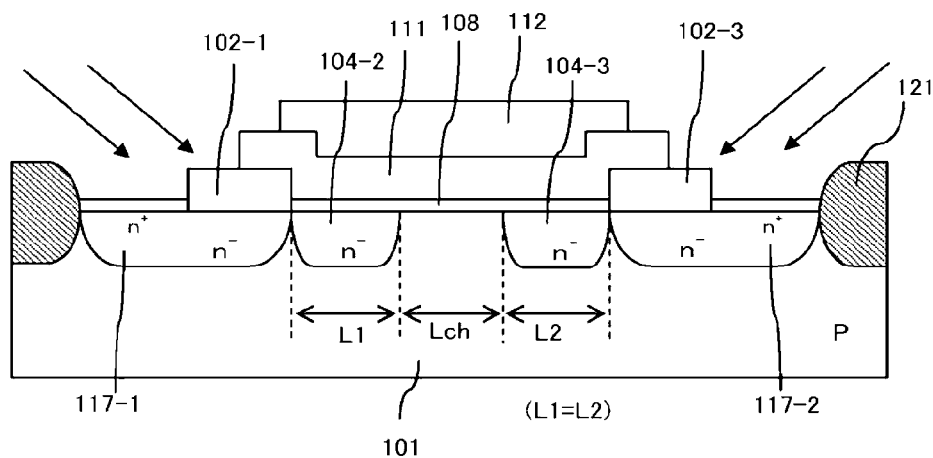
FIGS. 44A and 44B are a partial vertical cross-section diagram and a plan view showing a method for manufacturing a high voltage MOS transistor in accordance with the third embodiment of the present invention, respectively.
Figure 44B:
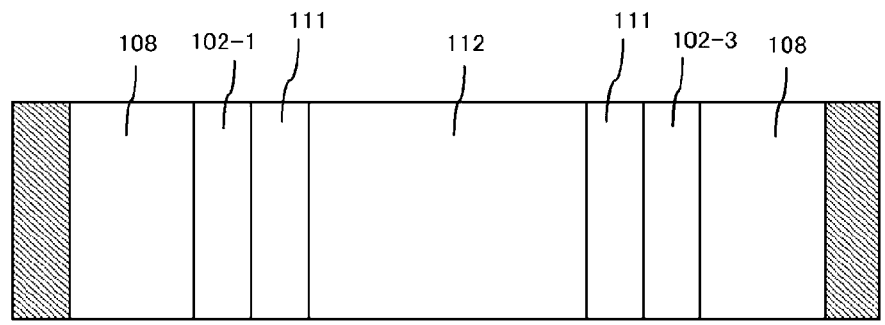

As shown in FIGS. 44A and 44B, a resist pattern 112 is formed on the gate electrode 111 with a heretofore known lithography technique. The resist pattern 112 is required to be formed to cover the functional portion of the gate electrode 111 formed on the gate oxide film 108 at least. Here, a source-side edge of the resist pattern 112 is required to be located on the portion of the gate electrode 111 between the source-side edge of the gate electrode 111 and the first edge 111-1 of the gate electrode 111. On the other hand, a drain-side edge of the resist pattern 112 is required to be located on the portion of the gate electrode 111 between the drain-side edge of the gate electrode 111 and the second edge 111-2 of the gate electrode 111. Because of this structure, the functional portions of the gate electrode 111 formed on the gate oxide film 108 are completely covered with the resist pattern 112.

Then, the n-type impurity phosphorus (P) is selectively implanted into the principal surface of the p-type single crystal silicon substrate 101 through the gate oxide film 108, the first portion 102-1 and the third portion 102-3 of the silicon dioxide film pattern 102' in an oblique direction by using the resist pattern 112 and source-side and drain-side edge neighborhood regions of the gate electrode 111 as a mask while the p-type single crystal silicon substrate 101 is being rotated around a vertical axis. As a result, a source-side third n-type impurity doped diffusion layer 117-1 and a drain-side third n-type impurity doped diffusion layer 117-2 are formed in an upper region of the p-type single crystal silicon substrate 101. More specifically, the source-side third n-type impurity doped diffusion layer 117-1 is formed in a region adjacent to the outer side of the source-side first lightly doped N⁻ diffusion layer 104-2 (i.e., the region including the region immediately below the first portion 102-1 of the silicon oxide film pattern 102' and the source-side first lightly doped N⁻ diffusion layer 104-1). On the other hand, the drain-side third n-type impurity doped diffusion layer 117-2 is formed in a region adjacent to the outer side of the drain-side first lightly doped N⁻ diffusion layer 104-3 (i.e., the region including the region immediately below the third portion 102-3 of the silicon oxide film pattern 102' and the drain-side first lightly doped N⁻ diffusion layer 104-4). Both of the source-side and the drain-side third n-type impurity doped diffusion layers 117-1 and 117-2 have the impurity concentration profile that impurities are heavily doped in their outer regions compared to their inner regions. Here, the term "an oblique direction" means a direction sloping with respect to the above defined "vertical direction" at a prescribed angle. Also, the term "an implantation angle" means a contained angle defined by the substrate surface and "the oblique direction."

The above described ion implantation in the oblique direction is required to be conducted so that ions can penetrate the first portion 102-1 and the third portion 102-3 of the silicon dioxide film 102'. The ion implantation is required to be conducted at angles (i.e., directions) along (i) a line formed by connecting a outer lower edge portion of the nonfunctional portion of the gate electrode 111 formed on the first portion 102-1 of the silicon dioxide film pattern 102' and an inner lower edge portion of the first portion 102-1 of the silicon dioxide film pattern 102', and (ii) a line formed by connecting a outer lower edge portion of the nonfunctional portion of the gate electrode 111 formed on the third portion 102-3 of the silicon dioxide film pattern 102' and an inner lower edge portion of the third portion 102-3 of the silicon dioxide film pattern 102'. Also, the ion implantation is required to be conducted so that ions can penetrate the first portion 102-1 and the third portion 102-3 of the silicon dioxide film pattern 102', and the penetrated ions can reach an outer edge portion of the source-side first lightly doped N⁻ diffusion layer 104-2 and an outer edge portion of the drain-side first lightly doped N⁻ diffusion layer 104-3. If these conditions are met, the source-side third n-type impurity doped diffusion layer 117-1 adjacent to the outer side of the source-side first lightly doped N⁻ diffusion layer 104-2 and the drain-side third n-type impurity doped diffusion layer 117-2 adjacent to the outer side of the drain-side first lightly doped N⁻ diffusion layer 104-3 can be formed.

For example, an ion implantation step in an oblique direction can be conducted at an angle of 45 degrees (i.e., arctangent (0.5/2/0.25)=45 degrees) with an acceleration energy of 300 keV and a dose amount of $3.0 \times 10^{15}$ cm$^{-2}$ in which ions can penetrate the first portion 102-1 and the third portion 102-3 of the silicon dioxide film pattern 102' when the first portion 102-1 and the third portion 102-3 of the silicon dioxide film pattern 102' are formed to have a thicknesses of 0.25 μm and a width of 0.5 μm, respectively, and the edges of the nonfunctional portions of the gate electrode 111 formed on the first portion 102-1 and the third portion 102-3 of the silicon dioxide film pattern 102' are located on the middle of the first portion 102-1 and the third portion 102-3 of the silicon dioxide film pattern 102', respectively. Because of this, in the source-side third n-type impurity doped diffusion layer 117-1, the impurity concentration of the region formed below the source-side gate oxide film 108 is higher than that of the region formed below the first portion 102-1 of the silicon dioxide film pattern 102'. In the same way, in the drain-side third n-type impurity doped diffusion layer 117-2, the impurity concentration of the region formed below the drain-side gate oxide film 108 is higher than that of the region formed below the third portion 102-3 of the silicon dioxide film pattern 102'.

Figure 45A:
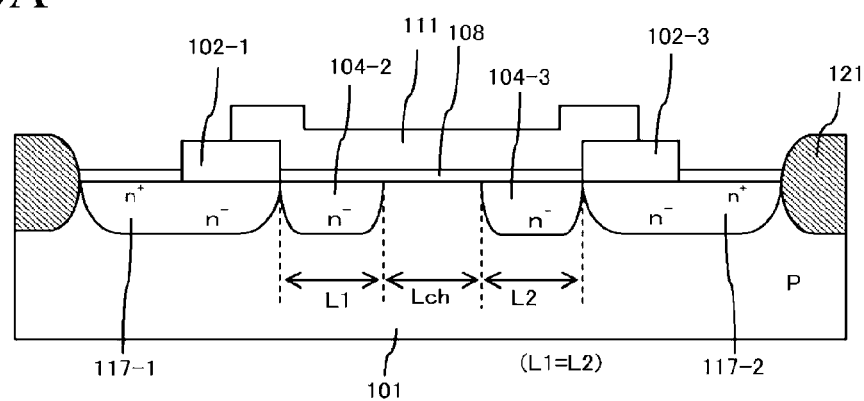
FIGS. 45A and 45B are a partial vertical cross-section diagram and a plan view showing a method for manufacturing a high voltage MOS transistor in accordance with the third embodiment of the present invention, respectively.
Figure 45B:
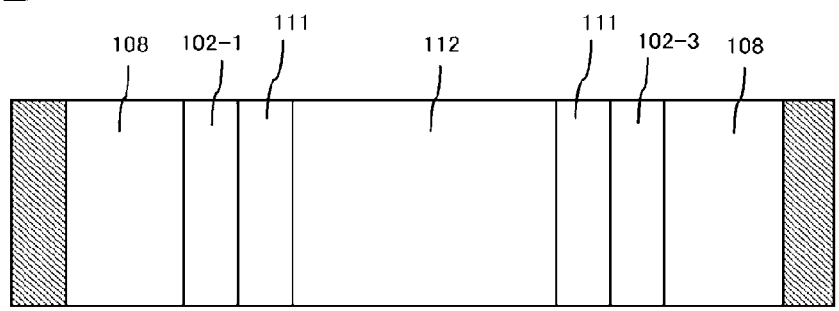

As shown in FIGS. 45A and 45B, the resist pattern 112 is eliminated with a heretofore known method.

Figure 46B:
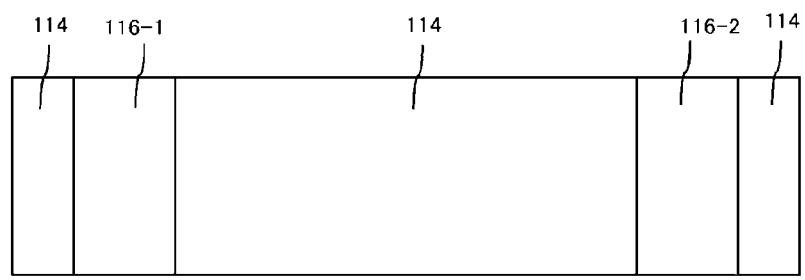

As shown in FIGS. 46A and 46B, an interlayer insulating film 114 is formed on the gate electrode 111, the first portion 102-1 and the third portion 102-3 of the silicon dioxide pattern 102', the gate oxide film 108, and the field oxide film 121 with a heretofore known method. Next, a contact hole is formed in the interlayer insulating film 114 and the gate oxide film 108. Then, a source contact 115-1 and a drain contact 115-2 are formed in the contact holes, respectively, and thus they have ohmic contacts with the source-side and the drain-side third n-type impurity doped diffusion layers 117-1 and 117-2, respectively. Next, a source wiring layer 116-1 and a drain wiring layer 116-2 are formed on the interlayer insulating film 114 with a heretofore known method, and thus they are electrically connected to the heavily doped regions of the source-side and the drain-side third n-type impurity doped diffusion layers 117-1 and 117-2 through the source contact 115-1 and the drain contact 115-2, respectively.

According to the present invention, the following are all defined by the single silicon dioxide film pattern 102' defined by a single lithography step: the channel length Lch, the horizontal positions and dimensions of the source-side and the drain-side first lightly doped N⁻ diffusion layers 104-2 and 104-3, and the source-side and the drain-side third n-type impurity doped diffusion layers 117-1 and 117-2, the horizontal position of the first edge 111-1 and the second edge 111-2 of the gate electrode 111, the source-side gate overlap amount L1, and the drain-side gate overlap amount L2. Therefore, the source-side and the drain-side first lightly doped N⁻ diffusion layers 104-2 and 104-3, the drain-side third n-type impurity doped diffusion layers 117-1 and 117-2, and the gate electrode 111 are self-aligned with each other in a horizontal direction, and misalignment is not caused among them.

Also, the source-side gate overlap amount L1 and the drain-side gate overlap amount L2 are all defined by the single silicon dioxide film pattern 102'. Therefore, variation from a design value, which is originated from misalignments in a plurality of patterning steps, is not caused with respect to the source-side gate overlap amount L1 and the drain-side gate overlap amount L2. That is to say, the source-side first lightly doped N⁻ diffusion layer 104-2 and the drain-side first lightly doped N⁻ diffusion layer 104-3 are overlapped with the gate electrode 111 in a self-alignment fashion.

As a typical example, the silicon dioxide film pattern 102' may be defined so that Lch, L1, L2, L3, and L4 shown in FIGS. 36A and 36B can be set to be equal (i.e., Lch=L1=L2=L3=L4). In other words, the width Lch of the second portion 102-2 of the silicon dioxide film pattern 102', the width L1 between the first portion 102-1 and the second portion 102-2 of the silicon dioxide film pattern 102', the width L2 between the second portion 102-2 and the third portion 102-3 of the silicon dioxide film pattern 102', the width L3 of the first portion 102-1 of the silicon dioxide film pattern 102', and the width L4 of the third portion 102-3 of the silicon dioxide film pattern 102' may be set to be the same value. In this case, the source-side first lightly doped N⁻ diffusion layer 104-2 and the drain-side first lightly doped N⁻ diffusion layer 104-3, which function as electric field reduction layers, are overlapped with the gate electrode 111 in a self-alignment fashion. In other words, variation from an design value, which is originated from misalignment in a plurality of patterning steps, is not caused with respect to the channel length Lch, the source-side gate overlap amount L1, the drain-side gate overlap amount L2. In addition, the source-side and the drain-side first lightly doped N⁻ diffusion layers 104-2 and 104-3, which function as electric field reduction layers, are symmetrical to the gate electrode 111 in a horizontal direction.

Also, the silicon dioxide film pattern 102' may be set so that L1 and L2 shown in FIGS. 36A and 36B are set to be equal (i.e., L1=L2). In other words, the width L1 between the first portion 102-1 and the second portion 102-2 of the silicon dioxide film pattern 102', and the width L2 between the second portion 102-2 and the third portion 102-3 of the silicon dioxide film pattern 102' may be set to be the same value. In this case, the source-side and the drain-side first lightly doped N⁻ diffusion layers 104-2 and 104-3 are overlapped with the gate electrode 111 in a self-alignment fashion. In other words, variation from a design value, which is originated form misalignments in a plurality of patterning steps, is not caused with respect to the channel length Lch, the source-side gate overlap amount L1, and the drain-side gate overlap amount L2. In addition, the source-side and the drain-side first lightly doped N⁻ diffusion layers 104-2 and 104-3, which function as electric field reduction layers, are symmetrical to the gate electrode 111 in a horizontal direction.

Also, the silicon dioxide film pattern 102' may be set so that the dimensions L1 and L2 shown in FIGS. 36A and 36B are set so that they are not equal to each other (L1≠L2) and the dimensions L3 and L4 are set so that they are not equal to each other (L3≠L4). In other words, the width L1 between the first portion 102-1 and the second portion 102-2 of the silicon dioxide film pattern 102' and the width L2 between the second portion 102-2 and the third portion 102-3 of the silicon dioxide film pattern 102' may be set so that they are not equal to each other, and the width L3 of the first portion 102-1 of the silicon dioxide film pattern 102' and the third portion 102-3 of the silicon dioxide film pattern 102' may be set so that they are not equal to each other. In this case, the source-side and the drain-side first lightly doped N⁻ diffusion layers 104-2 and 104-3, which function as electric field reduction layers, are overlapped with the gate electrode 111 in a self-alignment fashion. Also, the source-side and the drain-side third n-type impurity doped diffusion layers 117-1 and 117-2 are offset from the gate electrode 111 in a self-alignment fashion. In other words, variation form a design value, which is originated from misalignments in a plurality of patterning steps, is not caused with respect to the channel length Lch, the source-side gate overlap amount L1, the drain-side gate overlap amount L2. In addition, the source-side and the drain-side first lightly-doped N⁻ diffusion layers 104-2 and 104-3, which function as electric-field reduction layers, are asymmetrical to the gate electrode 111 in a horizontal direction.

Therefore, variation from a design value, which is originated from misalignments in a plurality of patterning steps, is not caused with respect to the channel length Lch, the source-side gate overlap amount L1, the drain-side gate overlap amount L2. This is because they are defined by a single lithography step in which the silicon dioxide film pattern 102 is defined.

Consequently, the third embodiment of the present invention has the following effects. First, a misalignment is not caused between the patterning to form the source-side and the drain-side first lightly doped N⁻ diffusion layers 104-2 and 104-3, and the patterning to form the gate electrode 111. Because of this, variation from a design is not caused with respect to the source-side overlap dimension L1 between the source-side first lightly doped N⁻ diffusion layer 104-2 functioning as an electric field reduction layer and the gate electrode 111. Furthermore, variation from a design value is not caused with respect to the drain-side gate overlap dimension L2 between the drain-side first lightly doped N⁻ diffusion layer 104-3 functioning as an electric field reduction layer and the gate electrode 111. In other words, the source-side and the drain-side overlap dimensions L1 and L2 are not varied, and thus device properties are not varied.

Second, the source-side and the drain-side gate overlap amounts L1 and L2 are equal in the gate overlap structure formed in a self-alignment fashion in accordance with the present invention. Because of this, the symmetrical gate overlap structure in a horizontal position can be formed based on the gate electrode 111 and the channel region. On the other hand, misalignment of a gate overlap amount can be caused in a gate overlap structure formed in a non-alignment fashion. This allows the gate overlap structure to be asymmetrically formed in a horizontal position based on a channel region. As a result, device properties can be varied. Therefore, according to the third embodiment of the present invention, misalignment of the gate overlap amount is not caused because the gate overlap structure is formed in a self-alignment fashion. Because of this, the gate overlap structure formed in a self-alignment fashion is symmetrically formed in a horizontal position based on the gate electrode 111 and the channel region. As a result, variation of device properties can be reduced, and furthermore, the defect rate can be improved.

Third, the source-side gate overlap amount L1 between the source-side first lightly doped N⁻ diffusion layer 104-2 and the gate electrode 111, and the drain-side gate overlap amount L2 between the drain-side first lightly doped N⁻ diffusion layer 104-3 and the gate electrode 111 can be defined without any regard for the alignment margin between the patterning to form the source-side and the drain-side first lightly doped N⁻ diffusion layers 104-2 and 104-3 functioning as electric field reduction layers and the patterning to form the gate electrode 111. When a gate overlap structure is formed in a non-self-alignment fashion, a design value must be set to be the dimension derived by adding the above described alignment margin between those patternings to the originally necessary gate overlap dimensions L1 and L2. On the other hand, when a gate overlap structure is formed in a self-alignment fashion, the above described alignment margin between those patternings is not needed and thus a design value may be set to be the originally necessary gate overlap dimensions L1 and L2 as they are. Consequently, current drive capability of a high voltage MOS transistor can be improved and thus devices can be miniaturized.

Fourth, the source-side and the drain-side first lightly doped N⁻ diffusion layers 104-2 and 104-3, and the source-side and the drain-side third n-type impurity doped diffusion layers 117-1 and 117-2 can be formed in a single ion implantation in a vertical direction and a single ion implantation in an oblique direction. Therefore, the number of ion implantation steps conducted in the third embodiment is less than that conducted in the first and second embodiments.

Also, according to the first to the third embodiments of the present invention, the gate overlap dimensions between the source-side and the drain-side first lightly doped N⁻ diffusion layers 104-2 and 104-3 and the gate electrode 111 can be defined without any regard for the alignment margin between the patterning to form the source-side and the drain-side first lightly doped N⁻ diffusion layers 104-2 and 104-3 and the patterning to form the gate electrode 111. When the alignment margin is taken into consideration, the overlap dimension is required to be 1.0 µm at least. Also, the overlap dimension is required to be approximately 2.0 µm for the 40 V voltage resistant MOS transistor. However, the gate overlap dimension can be reduced to be 0.5 µm according to the gate overlap structure formed in a self-alignment fashion in accordance with the present invention.

As described above, the n-type MOSFET is described in the first to the third embodiments of the present invention. However, the present invention can be applied to p-type MOSFETs by using other types of ion species. Furthermore, the above described gate electrode is comprised of a polysilicon layer including impurities. However, the gate electrode is not limited to this type. An upper region of the above described gate electrode may be comprised of a silicide layer or a salicide (self-aligned silicide) layer to further reduce resistance of the gate electrode. It should be understood that the above described thickness and impurity concentration of each layer are illustrative only and their design can be changed.

This application claims priority to Japanese Patent Application No. 2005-073494. The entire disclosure of Japanese Patent Application No. 2005-073494 is hereby incorporated herein by reference.

The terms of degree, such as "approximately" and "substantially," used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a semiconductor device, comprising the steps of:

forming a first insulating film pattern above a semiconductor substrate, said first insulating film including at least a first portion with a first width, a second portion with a third width, and a third portion with a fifth width, the second portion being separated from said first portion by a first space with a second width, and the third portion being separated from said second portion by a second space with a fourth width;

selectively forming a first impurity diffusion layer in a portion of said semiconductor substrate located at least below said first space by conducting ion implantation of impurities into said semiconductor substrate by using at least said first insulating film pattern as a mask, said first impurity diffusion layer self-aligned with said first insulating film pattern and having a width defined by said second width;

selectively forming a second impurity diffusion layer below said second space, said second impurity diffusion layer being self-aligned with said first insulating film pattern and having a width defined by said fourth width;

defining a channel region below said second portion, said channel region having a channel length defined by said third width by conducting said ion implantation of impurities;

forming a gate electrode above said semiconductor substrate, said gate electrode including a functional portion and nonfunctional portions, the functional portion having a first edge defined by an edge of said first portion and a second edge defined by an edge of said third portion, the functional portion being overlapped with said first impurity diffusion layer in a self alignment fashion and being continuously formed on a gate insulating film, and the nonfunctional portions being located above and separated from said gate insulating film through said first portion and said third portion, respectively;

selectively forming (a) a third impurity diffusion layer that is at least continuously formed below said first portion and in contact with an edge of said first impurity diffusion layer and (b) a fourth impurity diffusion layer that is at least continuously formed below said third portion and in contact with said second impurity diffusion layer, by implanting impurity ions into said semiconductor substrate, after said gate electrode is formed, by penetrating said impurity ions into said first portion and said third portion in an oblique direction by using said gate electrode as a mask while said semiconductor substrate is rotated; and eliminating said second portion, wherein said gate electrode is continuously formed out from said first edge and said second edge of said functional portion, and wherein said second impurity diffusion layer formation step and said channel region definition step are performed at the same time as said first impurity division layer is formed by conducting said ion implantation of impurities.

2. The method according to claim 1, further comprising a step of forming a first resist pattern on said gate electrode before said ion implantation in an oblique direction is conducted, and wherein said ion implantation in an oblique direction is conducted by using said gate electrode and said first resist pattern as a mask.

3. A method for manufacturing a semiconductor device, comprising the steps of:

forming a first insulating film pattern above a semiconductor substrate, said first insulating film including a first portion with a first width, a second portion with a third width that is separated from said first portion through a first space with a second width, and a third portion with a fifth width that is separated from said second portion through a second space with a fourth width;

selectively forming (a) a first impurity diffusion layer in a portion of said semiconductor substrate located below said first space, said first impurity diffusion layer self-aligned with said first insulating film pattern and having a width defined by said second width, and (b) a second impurity diffusion layer in a portion of said semiconductor substrate located below said second space, said second impurity diffusion layer self-aligned with said first insulating film pattern and having a width defined by said fourth width, and defining a channel region with a channel length defined by said third width below said second portion, wherein said first impurity diffusion layer and said second impurity diffusion layer are selectively formed by conducting ion implantation of impurities into said semiconductor substrate by using at least said first insulating film pattern as a mask;

exposing a channel region of said semiconductor substrate by eliminating said second portion;

forming a gate insulating film at least on said first impurity diffusion layer, said second impurity diffusion layer, and said channel region;

forming a gate electrode on said gate insulating film, said gate electrode having a functional portion and nonfunctional portions, the functional portion having a first edge defined by an edge of said first portion and a second edge defined by a portion of said third portion, and overlapped with said first impurity diffusion layer and said second impurity diffusion layer in a self-alignment fashion, and the nonfunctional portions being located above and separated from said gate insulating film through said first portion and said third portion, respectively;

forming (a) a third impurity diffusion layer and (b) a fourth impurity diffusion layer by implanting impurity ions into said semiconductor substrate, after said gate electrode is formed, by penetrating said impurity ions into said first portion and said third portion in an oblique direction by using at least said gate electrode as a mask while said semiconductor substrate is rotated, the third impurity diffusion layer being in contact with an outer side edge of said first impurity diffusion layer and the fourth impurity diffusion layer being in contact with an outer side edge of said second impurity diffusion layer; and forming (a) a fifth impurity diffusion layer in a portion of said semiconductor substrate located below the outer side of said first portion, said fifth impurity diffusion layer being self-aligned with said first insulating film pattern, separated from said first impurity diffusion layer by the distance corresponding to said first width, and included in said third impurity diffusion layer, and (b) a sixth impurity division layer in a portion of said semiconductor substrate located below the outer side of said third portion, said sixth impurity diffusion layer being self-aligned with said first insulating film pattern, separated from said second impurity diffusion layer by the distance corresponding to said fourth width, and included in said fourth impurity diffusion layer, wherein said gate electrode is continuously formed out from said first edge and said second edge of said functional portion, and wherein said fifth impurity diffusion layer and said sixth impurity diffusion layer are selectively formed by conducting said ion implantation of impurities at the same time that said first impurity diffusion layer and said second impurity diffusion layer are formed.

4. The method according to claim 3, further comprising a step of forming a first resist pattern on said gate electrode before said ion implantation in an oblique direction is conducted; and wherein said ion implantation in an oblique direction is conducted by using said gate electrode and said first resist pattern as a mask.

* * * * *

UNITED STATES PATENT AND TRADEMARK OFFICE
CERTIFICATE OF CORRECTION

| | | |
|---|---|---|
| PATENT NO. | : 7,601,599 B2 | |
| APPLICATION NO. | : 11/276765 | |
| DATED | : October 13, 2009 | |
| INVENTOR(S) | : Kiyohiko Yoshino | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 613 days.

Signed and Sealed this

Fifth Day of October, 2010

David J. Kappos
*Director of the United States Patent and Trademark Office*